(12) United States Patent
Nakamura et al.

(10) Patent No.: US 12,013,489 B2
(45) Date of Patent: Jun. 18, 2024

(54) LIGHT RECEIVING DEVICE

(71) Applicant: SONY SEMICONDUCTOR SOLUTIONS CORPORATION, Kanagawa (JP)

(72) Inventors: Nobuo Nakamura, Kanagawa (JP); Yoshiki Ebiko, Kanagawa (JP); Suzunori Endo, Kanagawa (JP); Nobuhiro Kawai, Kanagawa (JP); Fumihiko Koga, Kanagawa (JP); Sozo Yokogawa, Kanagawa (JP); Yuhi Yorikado, Kanagawa (JP); Hayato Wakabayashi, Kanagawa (JP)

(73) Assignee: SONY SEMICONDUCTOR SOLUTIONS CORPORATION, Kanagawa (JP)

( * ) Notice: Subject to any disclaimer, the term of this patent is extended or adjusted under 35 U.S.C. 154(b) by 97 days.

(21) Appl. No.: 17/782,882

(22) PCT Filed: Dec. 11, 2020

(86) PCT No.: PCT/JP2020/046436
§ 371 (c)(1),
(2) Date: Jun. 6, 2022

(87) PCT Pub. No.: WO2021/125116
PCT Pub. Date: Jun. 24, 2021

(65) Prior Publication Data
US 2022/0373653 A1 Nov. 24, 2022

(30) Foreign Application Priority Data

Dec. 18, 2019 (JP) .................................. 2019-227817
Oct. 1, 2020 (JP) .................................. 2020-166686

(51) Int. Cl.
G01S 7/481 (2006.01)
G01S 17/08 (2006.01)
(Continued)

(52) U.S. Cl.
CPC ............ *G01S 7/4816* (2013.01); *G01S 17/08* (2013.01); *H01L 27/14607* (2013.01);
(Continued)

(58) Field of Classification Search
CPC ......... H01L 27/14649; H01L 27/14607; H01L 27/14614; H01L 27/14645; H01L 27/1463;
(Continued)

(56) References Cited

U.S. PATENT DOCUMENTS 7,626,685 B2 * 12/2009 Jin .......................... G01S 17/89
257/290
7,683,954 B2 * 3/2010 Ichikawa ............. H04N 23/745
257/431
(Continued)

FOREIGN PATENT DOCUMENTS

| CN | 110418085 A | 11/2019 |
|----|-------------|---------|
| JP | 2008-089346 | 4/2008 |

(Continued)

OTHER PUBLICATIONS

International Search Report and Written Opinion prepared by the Japan Patent Office dated Feb. 9, 2021, for International Application No. PCT/JP2020/046436, 2 pgs.

*Primary Examiner* — Pritham D Prabhakher
(74) *Attorney, Agent, or Firm* — SHERIDAN ROSS P.C.

(57) ABSTRACT

In a light receiving device, a light receiving element includes a first photoelectric conversion unit (PD) that converts light into electric charges, a first electric charge storage unit (MEM) to which the electric charges are transferred from the (Continued)

first photoelectric conversion unit, a first distribution gate, a second electric charge storage unit (MEM) to which the electric charges are transferred from the first photoelectric conversion unit, and a second distribution gate, in which the first and second distribution gates are provided at positions axially symmetric to each other with respect to a first center axis extending so as to pass through the center of the first photoelectric conversion unit, in a direction intersecting the column direction at a predetermined angle, when viewed from above the semiconductor substrate.

26 Claims, 64 Drawing Sheets

(51) Int. Cl.
*H01L 27/146* (2006.01)
*H04N 23/11* (2023.01)
*H04N 25/77* (2023.01)
*H04N 25/79* (2023.01)

(52) U.S. Cl.
CPC .. *H01L 27/14614* (2013.01); *H01L 27/14645* (2013.01); *H01L 27/14649* (2013.01); *H04N 23/11* (2023.01); *H04N 25/77* (2023.01); *H04N 25/79* (2023.01)

(58) Field of Classification Search
CPC . H01L 27/1464; G01S 7/4863; G01S 7/4818; G01S 7/4816; G01S 17/08; G01S 17/88; G01S 17/36; G01S 17/894; G01S 17/931; G01S 17/86; H04N 25/77; H04N 25/79; H04N 23/11
USPC .......................................................... 348/300
See application file for complete search history.

(56) References Cited

U.S. PATENT DOCUMENTS

| 8,513,709 | B2* | 8/2013 | Jin ................... G01S 7/4863 |
| | | | 257/215 |
| 9,240,512 | B2* | 1/2016 | Kim ................ H01L 27/14687 |
| 9,952,324 | B2* | 4/2018 | Popp ..................... G01S 7/4914 |
| 10,388,682 | B2* | 8/2019 | Jin ........................ G01S 17/36 |
| 10,690,755 | B2* | 6/2020 | Suzuki ................ H01L 27/146 |
| 2008/0079833 | A1 | 4/2008 | Ichikawa et al. |
| 2015/0115291 | A1* | 4/2015 | Kim ................ H01L 27/14605 |
| | | | 257/292 |
| 2016/0056199 | A1* | 2/2016 | Kim ..................... H04N 25/771 |
| | | | 257/233 |
| 2017/0293031 | A1* | 10/2017 | Popp ..................... G01S 7/4914 |
| 2018/0156898 | A1 | 6/2018 | Suzuki et al. |
| 2018/0366504 | A1 | 12/2018 | Jin |

FOREIGN PATENT DOCUMENTS

| JP | 2019-004149 | 1/2019 |
| WO | WO 2017/022220 | 2/2017 |
| WO | WO 2019/112047 | 6/2019 |

* cited by examiner

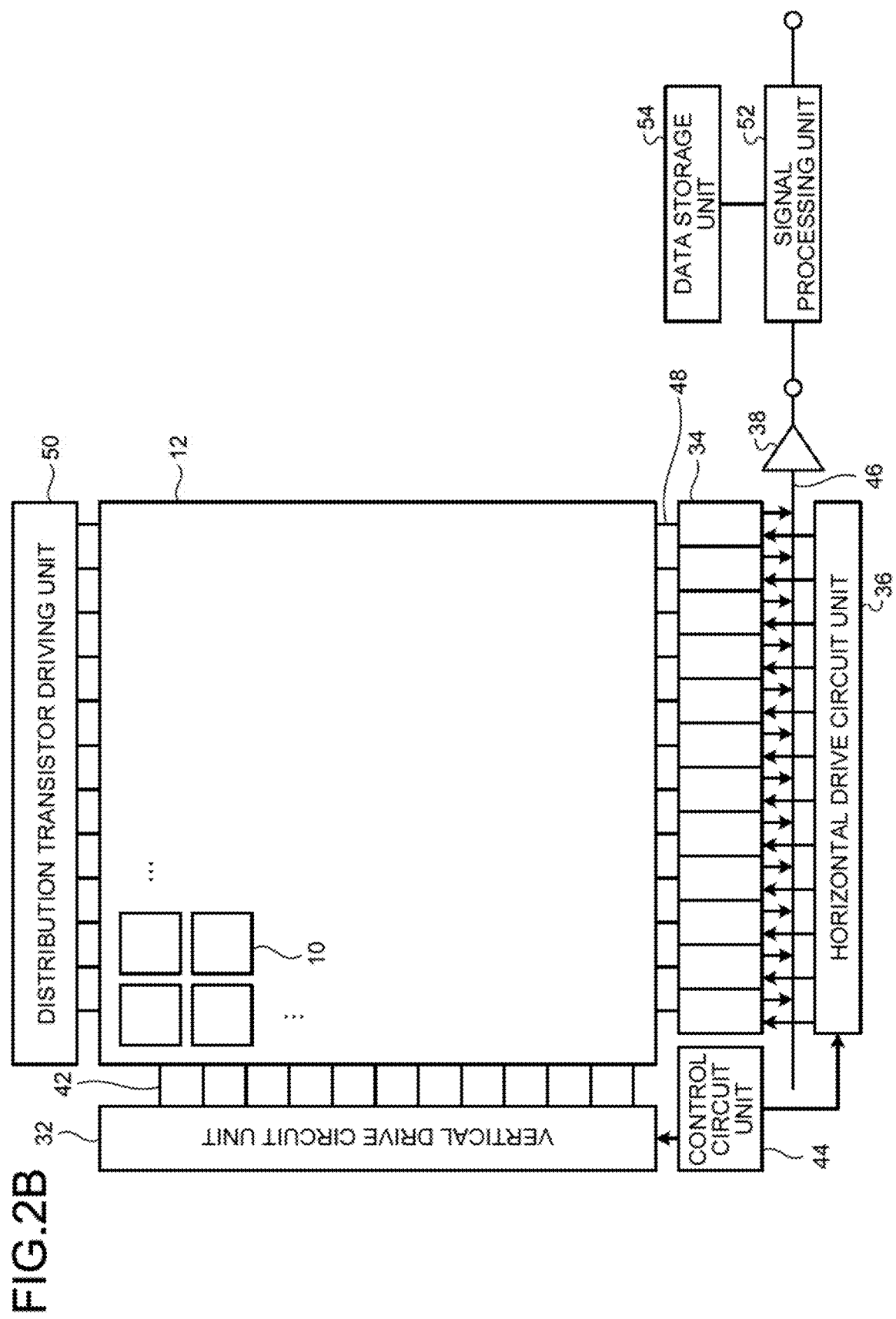

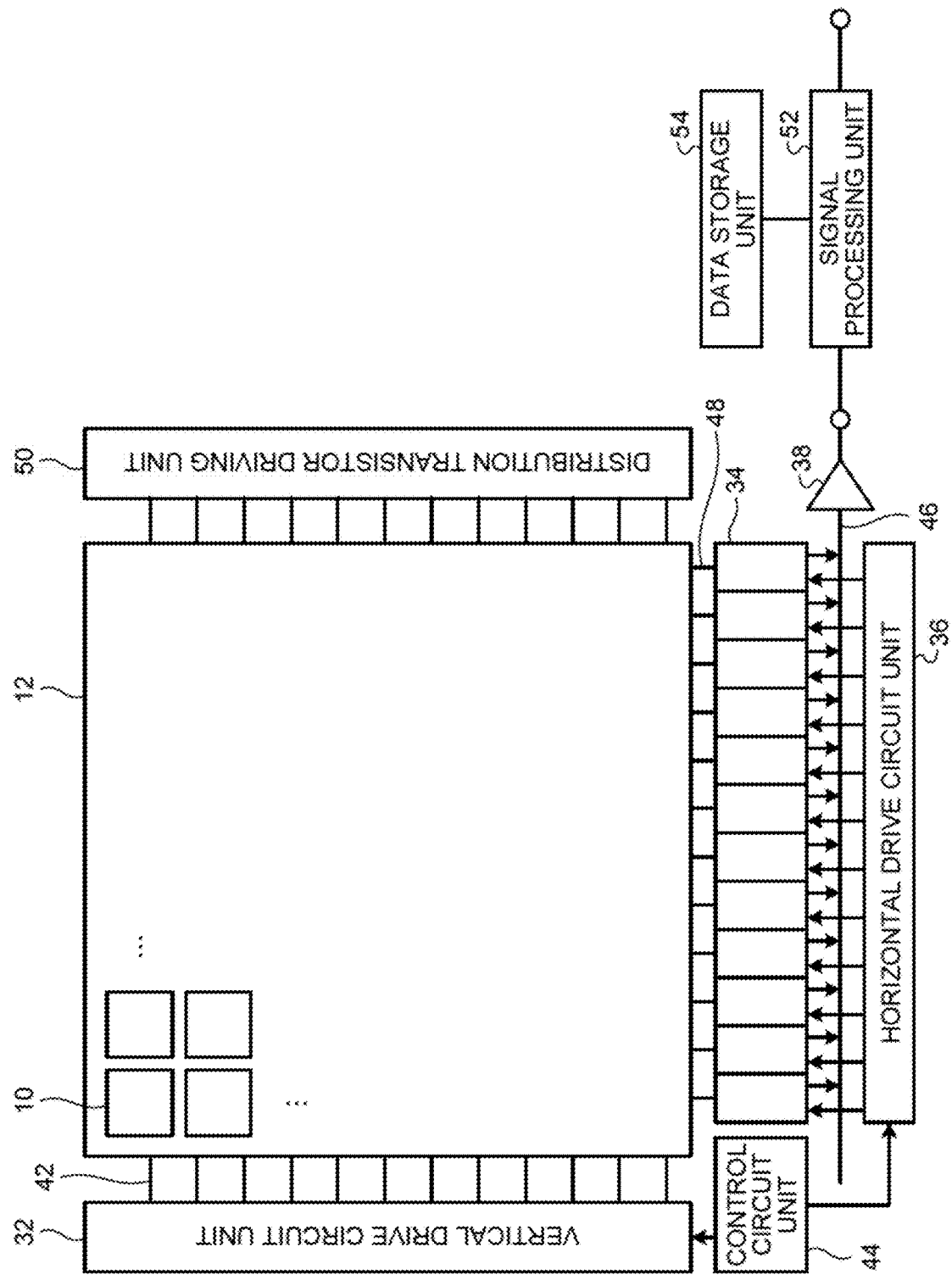

LIGHT RECEIVING DEVICE

CROSS REFERENCE TO RELATED APPLICATIONS

This application is a national stage application under 35 U.S.C. 371 and claims the benefit of PCT Application No. PCT/JP2020/046436, having an international filing date of 11 Dec. 2020, which designated the United States, which PCT application claimed the benefit of Japanese Patent Application Nos. 2019-227817, filed 18 Dec. 2019, and 2020-166686, filed 1 Oct. 2020, the entire disclosures of each of which are incorporated herein by reference.

FIELD

The present disclosure relates to a light receiving device.

BACKGROUND

As a method of measuring a distance to a target, a time of flight (TOF) sensor (light receiving device) is known. For example, in the TOF sensor, the indirect TOF sensor is configured to emit illumination light having a predetermined period to the target and detect a phase difference between the illumination light and reflected light, measuring the distance to the target.

CITATION LIST

Patent Literature

Patent Literature 1: JP 2019-4149 A

SUMMARY

Technical Problem

For such a TOF sensor (light receiving device), ensuring high distance measurement accuracy is required even when manufacturing variations occur.

Therefore, in view of such a situation, the present disclosure proposes a light receiving device that is configured to secure high distance measurement accuracy by making the light receiving device less susceptible to manufacturing variations.

Solution to Problem

According to the present disclosure, a light receiving device is provided. The light receiving device includes a light receiving unit that includes a plurality of light receiving elements arranged in a row direction and a column direction on a semiconductor substrate. In the light receiving device, each of the light receiving elements includes: a first photoelectric conversion unit that converts light into electric charges; a first electric charge storage unit to which the electric charges are transferred from the first photoelectric conversion unit; a first distribution gate that distributes the electric charges from the first photoelectric conversion unit to the first electric charge storage unit; a second electric charge storage unit to which the electric charges are transferred from the first photoelectric conversion unit; and a second distribution gate that distributes the electric charges from the first photoelectric conversion unit to the second electric charge storage unit. And, the first and second distribution gates are provided at positions axially symmetric to each other with respect to a first center axis extending so as to pass through the center of the first photoelectric conversion unit, in a direction intersecting the column direction at a predetermined angle, when viewed from above the semiconductor substrate.

Also, according to the present disclosure, a light receiving device is provided. The light receiving device includes a light receiving unit that includes a plurality of light receiving elements arranged in a row direction and a column direction on a semiconductor substrate. In the light receiving device, each of the light receiving elements includes: a first photoelectric conversion unit that converts light into electric charges; a first electric charge storage unit to which the electric charges are transferred from the first photoelectric conversion unit; a first distribution gate that distributes the electric charges from the first photoelectric conversion unit to the first electric charge storage unit; a second electric charge storage unit to which the electric charges are transferred from the first photoelectric conversion unit; and a second distribution gate that distributes the electric charges from the first photoelectric conversion unit to the second electric charge storage unit. And, the first and second distribution gates are provided at positions axially symmetric to each other with respect to a first center axis extending so as to pass through the center of the first photoelectric conversion unit, in the column direction, when viewed from above the semiconductor substrate.

BRIEF DESCRIPTION OF DRAWINGS

FIG. 2B is an explanatory diagram (No. 2) illustrating an example of a plan view configuration of the light receiving unit 30 according to the embodiment of the present disclosure.

FIG. 2C is an explanatory diagram (No. 3) illustrating an example of a plan view configuration of the light receiving unit 30 according to the embodiment of the present disclosure.

DESCRIPTION OF EMBODIMENTS

Figure 1:
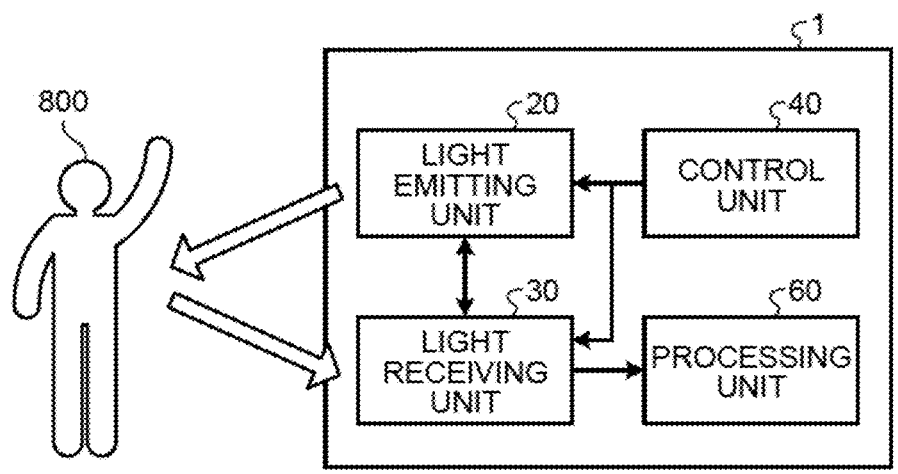
FIG. 1 is a block diagram illustrating a configuration example of a distance measurement module 1 according to an embodiment of the present disclosure.

Preferred embodiments of the present disclosure will be described in detail below with reference to the accompanying drawings. Note that in the present description and the drawings, component elements having substantially the same functional configurations are denoted by the same reference numerals, and redundant descriptions thereof will be omitted.

Furthermore, in the present description and the drawings, a plurality of component elements having substantially the same functional configurations is distinguished by giving the same reference numerals followed by different numerals in some cases. However, when there is no need to particularly distinguish the plurality of component elements having substantially the same or similar functional configuration, the components are denoted by the same reference numeral alone. In addition, similar component elements of different embodiments are distinguished by adding different alphabets after the same reference numerals in some cases. However, when there is no need to particularly distinguish the plurality of similar component elements, the component elements are denoted by the same reference numeral alone.

In addition, the drawings referred to in the following description are drawings for description of the embodiments of the present disclosure and for promoting understanding thereof, and the shapes, dimensions, ratios, and the like of the component elements illustrated in the drawings may be different from those of actual component elements, for ease of understanding. Furthermore, component elements and the like included in the elements and devices illustrated in the drawings can be appropriately changed in design in consideration of the following description and known techniques.

Furthermore, in the following description, an example of a back-illuminated light receiving device to which the embodiment of the present disclosure is applied will be described. Therefore, in the light receiving device, light is incident on the back surface side of a substrate. Therefore, in the following description, the front surface of the substrate represents a surface facing the back surface, when a side on which light is incident is defined as the back surface. Note that the embodiments of the present disclosure are not limited to being applied to the back-illuminated light receiving device, and may be applied to, for example, a front-illuminated light receiving device.

Specific shapes and positional relationships in the following description do not mean only geometrically defined shapes and positional relationships. Specifically, description of the specific shapes and the like in the following description includes an allowable difference (error/distortion) in elements, manufacturing processes thereof, and use and operation thereof, and shapes similar to the specific shapes. For example, in the following description, the expression "circular shape" or "substantially circular shape" means that the shape is not limited to a perfect circle but includes a shape similar to the perfect circle such as an elliptical shape.

Furthermore, in the following description of circuits (electrical connections), unless otherwise specified, the wording "electrically connected" means that a plurality of elements is connected to each other so that electricity (signal) is conducted. In addition, the wording "electrically connected" in the following description includes not only directly and electrically connecting a plurality of elements but also indirectly and electrically connecting the plurality of elements via another element.

In addition, in the following description, the wording "share" means that another element is provided so as to be shared by a plurality of single elements, in other words, the another element is shared between a predetermined number of the single elements, unless otherwise specified.

Note that the description will be given in the following order.

1. Configuration example of distance measurement module 1 according to embodiment of present disclosure
2. Configuration example of light receiving unit 30 according to embodiment of present disclosure
3. Equivalent circuit of light receiving element 10 according to embodiment of present disclosure
4. Principle of distance calculation method using distance measurement module 1 according to embodiment of present disclosure
5. Background of creation of present embodiment
6. First Embodiment
7. Second Embodiment
8. Third Embodiment
9. Conclusion
10. Configuration example of electronic device
11. Example of application to endoscopic surgical system
12. Example of application to mobile object
13. Supplementary notes 1. Configuration Example of Distance Measurement Module 1 According to Embodiment of Present Disclosure First, a schematic configuration of a distance measurement module (light receiving device) 1 according to an embodiment of the present disclosure will be described with reference to FIG. 1. FIG. 1 is a block diagram illustrating a configuration example of the distance measurement module 1 according to the embodiment of the present disclosure. Specifically, as illustrated in FIG. 1, the distance measurement module 1 mainly includes a light emitting unit 20, a light receiving unit 30, a control unit (light emission control unit) 40, and a processing unit 60. Hereinafter, each functional block included in the distance measurement module 1 according to the present embodiment will be described.

(Light Emitting Unit 20)

The light emitting unit 20 includes a light emitting diode (LED) light source (not illustrated) and an optical element (not illustrated). The wavelength of light emitted can be changed by appropriately selecting the LED light source. Note that, in the present embodiment, for example, the light emitting unit 20 emits, but not limited to, infrared light having a wavelength in a range of 780 nm to 1000 nm. Furthermore, the light emitting unit 20 is configured to emit, to a target 800, illumination light having brightness periodically varying in synchronization with a periodic signal, such as a rectangular signal, supplied from the control unit 40 which is described later.

(Light Receiving Unit 30)

The light receiving unit 30 receives reflected light reflected from the target 800. The light receiving unit 30 includes a condenser lens (not illustrated) and a plurality of light receiving elements 10 which is described later. The condenser lens has a function of collecting the received light to each of the light receiving elements 10. In addition, the light receiving element 10 generates charges (e.g., electrons) on the basis of the intensity of the received light, causes the generated charges to drive built-in transistors (distribution transistors VG; (see FIG. 3) in synchronization the periodic signal such as the rectangular signal supplied from the control unit 40 which is described later, and transfers the charges to electric charge storage units MEM (see FIG. 3). Furthermore, the charges transferred to the electric charge storage units MEM are converted into a signal and finally transferred to the processing unit 60. Note that the light receiving element 10 will be described later in detail.

(Control Unit 40)

The control unit 40 supplies the periodic signal to the light emitting unit 20 and the light receiving unit 30 to control the emission timing of the illumination light and the drive timings of the transistors. The frequency of the signal can be, for example, 5 to 20 megahertz (MHz), but is not limited to such a frequency in the present embodiment. In addition, the control unit 40 controls the transistors (the distribution transistors VG; see FIG. 3) to operate at different timings, for example, differentially.

(Processing Unit 60)

The processing unit 60 is configured to acquire a signal from the light receiving unit 30 and acquire a distance to the target 800 by, for example, an indirect ToF (iToF) method on the basis of the acquired signal. Note that a distance calculation method will be described later.

Figure 2A:
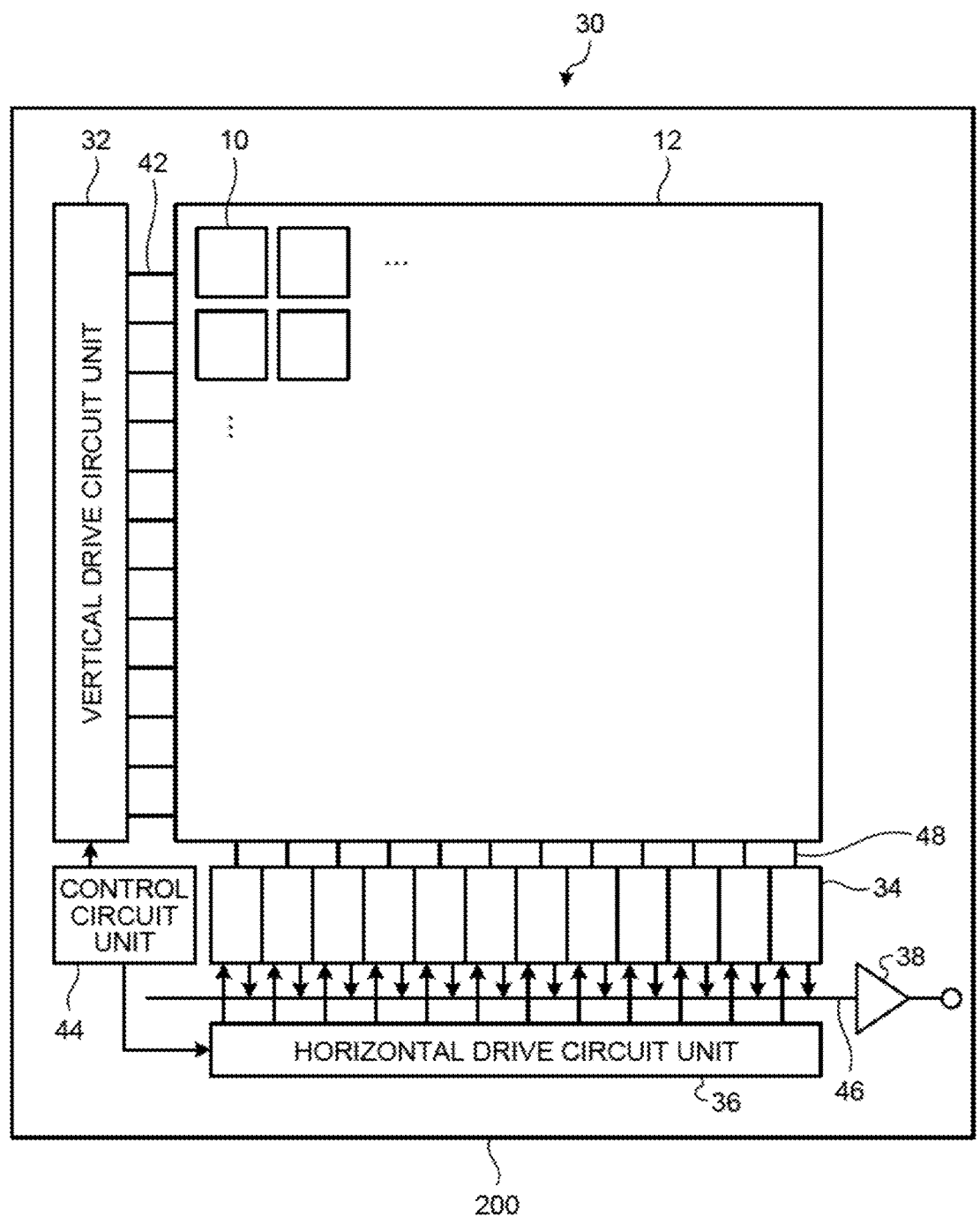
FIG. 2A is an explanatory diagram (No. 1) illustrating an example of a plan view configuration of a light receiving unit 30 according to an embodiment of the present disclosure.

2. Configuration Example of Light Receiving Unit 30 According to Embodiment of Present Disclosure Next, examples of plan view configurations of the light receiving unit 30 according to an embodiment of the present disclosure will be described with reference to FIGS. 2A to 2C. FIGS. 2A to 2C are explanatory diagrams each illustrating an example of the plan view configuration of the light receiving unit 30 according to the embodiment of the present disclosure. Specifically, as illustrated in FIG. 2A, the light receiving unit 30 according to the present embodiment includes a pixel array unit 12, a vertical drive circuit unit 32, column signal processing circuit units 34, a horizontal drive circuit unit 36, an output circuit unit 38, a control circuit unit 44, and the like, for example, on a semiconductor substrate 200 made of silicon. Hereinafter, each block of the light receiving unit 30 according to the present embodiment will be described in detail.

(Pixel Array Unit 12)

The pixel array unit 12 includes the plurality of light receiving elements 10 that is two-dimensionally arranged in matrix form (i.e., in the row and column directions) on the semiconductor substrate 200. Each of the light receiving elements 10 includes a photoelectric conversion unit (photodiode PD) (not illustrated) that converts light into electric charges (e.g., electrons), a plurality of pixel transistors (e.g., metal-oxide-semiconductor (MOS) transistors) (not illustrated), and the like. In other words, the pixel array unit 12 includes a plurality of pixels that photoelectrically converts incident light and outputs a signal according to obtained charges. Then, the pixel transistors can include, for example, transistors having various functions, such as a transfer transistor, a selection transistor, a reset transistor, and an amplifying transistor. Note an equivalent circuit and the like of each of the light receiving element 10 will be described later in detail.

Here, the row direction refers to an array direction of the light receiving elements 10 in a horizontal direction, and the column direction refers to an array direction of the light receiving elements 10 in a vertical direction. The row direction represents a left-right direction in FIG. 2A, and a column direction is an up-down direction in FIG. 2A. In the pixel array unit 12, for the matrix array of the light receiving elements 10, a pixel drive line 42 is wired in the row direction for each row and a vertical signal line 48 is wired in the column direction for each column. For example, the pixel drive line 42 transmits a drive signal for performing drive upon reading a signal from each light receiving element 10.

(Vertical Drive Circuit Unit 32)

The vertical drive circuit unit 32 is formed by, for example, a shift register, an address decoder, and the like, selects any of the pixel drive lines 42, supplies a pulse for driving the light receiving elements 10, to the selected pixel drive line 42, and drives all the light receiving elements 10 at the same time or every row. For example, the vertical drive circuit unit 32 selectively scans each of the light receiving elements 10 of the pixel array unit 12 in each row, sequentially in the vertical direction (up-down direction in FIG. 2A), and supplies a pixel signal based on electric charges generated according to the amount of light received by the photodiode PD of each light receiving element 10 to each column signal processing circuit unit 34, which is described later, through each vertical signal line 48.

(Column Signal Processing Circuit Unit 34)

The column signal processing circuit units 34 are arranged in columns of the light receiving elements 10, and perform signal processing, such as noise removal, for the columns, on the signals output from the light receiving elements 10 of one row. For example, the column signal processing circuit units 34 perform signal processing such as correlated double sampling (CDS) and analog-digital (AD) conversion to remove fixed pattern noise specific to the light receiving elements 10.

(Horizontal Drive Circuit Unit 36)

The horizontal drive circuit unit 36 is formed by, for example, a shift register, an address decoder, and the like, and is configured to sequentially output horizontal scanning pulses, select the respective column signal processing circuit units 34 described above in order, and output signals to a horizontal signal line 46 from the respective column signal processing circuit units 34.

(Output Circuit Unit 38)

The output circuit unit 38 is configured to perform signal processing on the signals sequentially supplied from the respective column signal processing circuit units 34 through the horizontal signal line 46, and output the processed signals. The output circuit unit 38 may function as, for example, a functional unit that performs buffering, or may perform processing such as column variation correction or various digital signal processing. Note that the buffering refers to temporarily storing signals to compensate for a difference in processing speed or transfer speed upon exchange of the signals.

(Control Circuit Unit 44)

The control circuit unit 44 is configured to receive an input clock, and data for instruction on an operation mode and the like, and output data such as internal information about the light receiving elements 10. In other words, the control circuit unit 44 generates a clock signal and a control signal serving as a reference of operations of the vertical drive circuit unit 32, the column signal processing circuit units 34, the horizontal drive circuit unit 36, and the like, on the basis of a vertical synchronization signal, a horizontal synchronization signal, and a master clock. Then, the control circuit unit 44 outputs the generated clock signal and control signal to the vertical drive circuit unit 32, the column signal processing circuit units 34, the horizontal drive circuit unit 36, and the like.

(Distribution Transistor Driving Unit 50, Signal Processing Unit 52, and Data Storage Unit 54)

As illustrated in FIGS. 2B and 2C, each light receiving element 10 may be provided with a distribution transistor driving unit 50, a signal processing unit 52, and a data storage unit 54. In other words, the distribution transistor driving unit 50, the signal processing unit 52, and the data storage unit 54 may be provided on the semiconductor substrate 200. However, the present embodiment is not limited thereto, and the distribution transistor driving unit 50, the signal processing unit 52, and the data storage unit 54 may be provided on another semiconductor substrate (not illustrated). First, the distribution transistor driving unit 50 controls the operations of the distribution transistors VG (see FIG. 3) which are described later. For example, the distribution transistor driving unit 50 may be provided in the column direction so as to be adjacent to the pixel array unit 12 as illustrated in FIG. 2B, or may be provided in the row direction so as to be adjacent to the pixel array unit 12 as illustrated in FIG. 2C, and the distribution transistor driving unit 50 is not particularly limited in the present embodiment. Furthermore, the signal processing unit 52 has at least an arithmetic processing function, and performs various signal processing such as arithmetic processing on the basis of signals output from the output circuit unit 38. For the signal processing in the signal processing unit 52, the data storage unit 54 temporarily stores data necessary for the signal processing.

Note that the example of the plan view configuration of the light receiving unit 30 according to the present embodiment is not limited to the examples illustrated in FIGS. 2A to 2C, and may include, but is not particularly limited to, for example, another circuit and the like.

Figure 3:
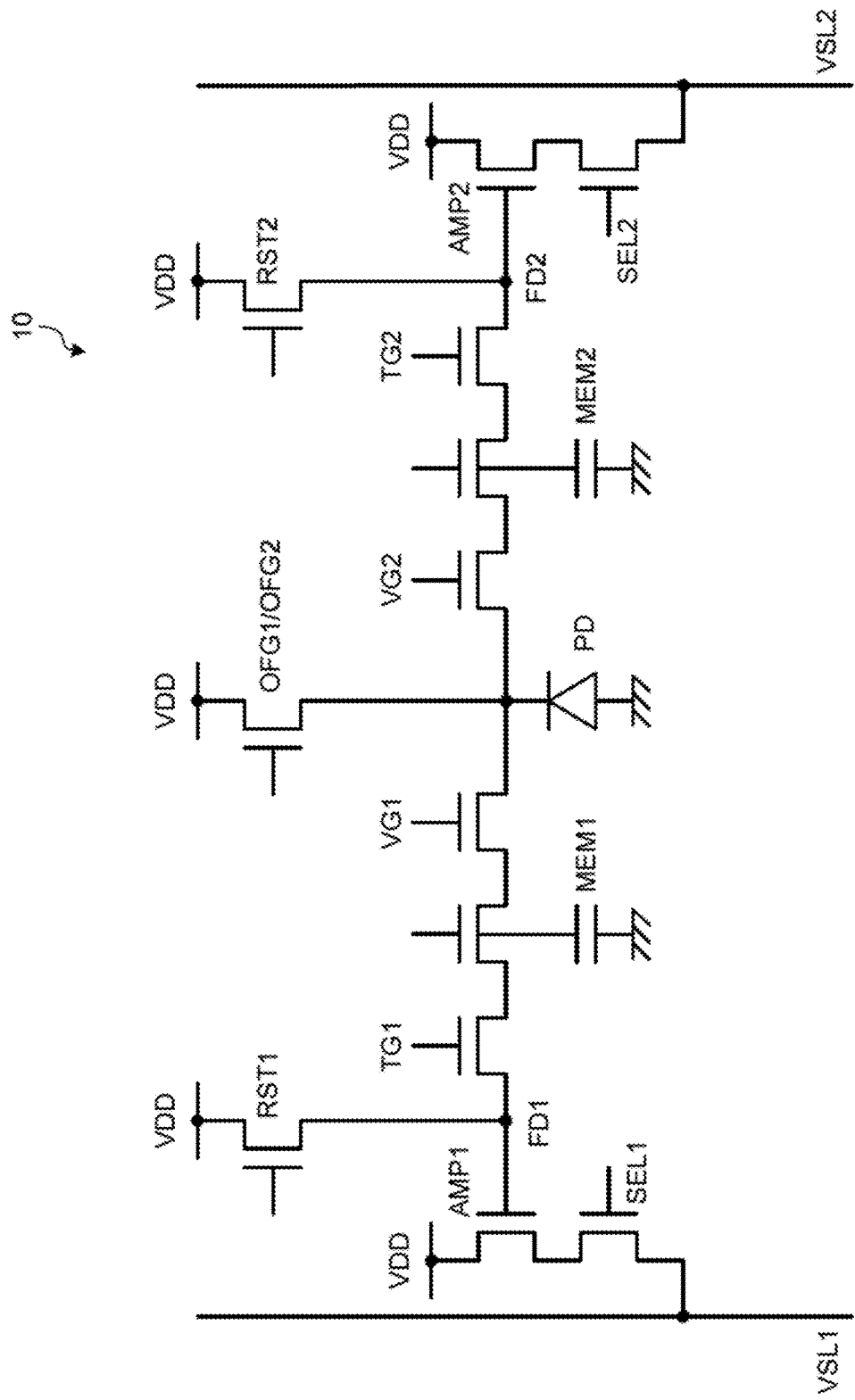
FIG. 3 is an equivalent circuit diagram of a light receiving element 10 according to an embodiment of the present disclosure.

3. Equivalent Circuit of Light Receiving Element 10 According to Embodiment of Present Disclosure Next, the equivalent circuit of each light receiving element 10 according to an embodiment of the present disclosure will be described with reference to FIG. 3. FIG. 3 is an equivalent circuit diagram of the light receiving element 10 according to the embodiment of the present disclosure.

Specifically, as illustrated in FIG. 3, the light receiving element 10 includes the photodiode PD as a photoelectric conversion element (the photoelectric conversion unit) that converts light into electric charges, and a discharge transistor OFG (although the discharge transistor OFG is illustrated as one transistor on the equivalent circuit, the discharge transistor OFG may include a plurality of transistors electrically connected in parallel). Furthermore, the light receiving element 10 includes two distribution transistors VG, two electric charge storage units (a first electric charge storage unit and a second electric charge storage unit) MEM, two transfer transistors TG, two floating diffusion regions FD, two reset transistors RST, two amplifying transistors AMP, and two selection transistors SEL.

As illustrated in FIG. 3, in the light receiving element 10, one of the source/drain of the discharge transistor OFG is electrically connected to the photodiode PD that generates electric charges in response to reception of light. Furthermore, the other of the source/drain of the discharge transistor OFG is electrically connected to a power supply circuit (power supply potential VDD). Then, the discharge transistor OFG is configured to become conductive according to a voltage applied to its own gate, and discharge electric charges accumulated in the photodiode PD to the power supply circuit (power supply potential VDD).

Furthermore, as illustrated in FIG. 3, in the light receiving element 10, one of the source/drain of each of distribution transistors VG1 and VG2 is electrically connected to the photodiode PD, and the other of the source/drain of each of the distribution transistors VG1 and VG2 is electrically connected to each of electric charge storage units MEM1 and MEM2. Then, the distribution transistors VG1 and VG2 are configured to become conductive according to voltage applied to their own gates (a first distribution gate and a second distribution gate), and transfer the electric charges accumulated in the photodiode PD to the electric charge storage units MEM1 and MEM2. In other words, in the present embodiment, voltages applied to the gates of the distribution transistors VG1 and VG2 are changed at different timings, and therefore, the electric charges accumulated in the photodiode PD are allowed to be distributed to any of the two electric charge storage units MEM1 and MEM2. In other words, it can be said that the two electric charge storage units MEM1 and MEM2 share one photodiode PD.

Furthermore, as illustrated in FIG. 3, in the light receiving element 10, one of the source/drain of each of transfer transistors TG1 and TG2 is electrically connected to the other of the source/drain of each of the distribution transistors VG1 and VG2 and to each of the electric charge storage units MEM1 and MEM2. Furthermore, the other of the source/drain of each of the transfer transistors TG1 and TG2 is electrically connected to each of floating diffusion regions FD1 and FD2. Then, the transfer transistors TG1 and TG2 are configured to become conductive according to voltages applied to their own gates (transfer gates), and transfer the electric charges accumulated in the electric charge storage units MEM1 and MEM2 to the floating diffusion regions FD1 and FD2. Note that, in the embodiment of the present disclosure, the two electric charge storage units MEM1 and MEM2 also make it possible that the transfer transistors TG1 and TG2 may share one floating diffusion region FD.

Furthermore, the floating diffusion regions FD1 and FD2 are electrically connected to the gates of amplifying transistors AMP1 and AMP2 each of which converts (amplifies) electric charges into voltage and outputs the voltage as a signal (pixel signal). In addition, one of the source/drain of each of the amplifying transistors AMP1 and AMP2 is electrically connected to one of the source/drain of each of the selection transistors SEL1 and SEL2 that output the signal obtained by conversion, to signal lines VSL1 and VSL2, according to a selection signal. Furthermore, the other of the source/drain of each of the amplifying transistors AMP1 and AMP2 is electrically connected to a power supply circuit (power supply potential VDD).

In addition, the other of the source/drain of each of the selection transistors SEL1 and SEL2 is electrically connected to each of the signal lines VSL1 and VSL2 that transmit the voltages obtained by the conversion as signals, and is further electrically connected to the column signal processing circuit unit 34 described above. Furthermore, the gates of the selection transistors SEL1 and SEL2 are each electrically connected to a selection line (not illustrated) that selects a row to output the signal, and further electrically connected to the vertical drive circuit unit 32 described above. In other words, under the control of the selection transistors SEL1 and SEL2, the electric charges accumulated in the floating diffusion regions FD1 and FD2 are converted into voltages by the amplifying transistors AMP1 and AMP2, and output to the signal lines VSL1 and VSL2.

Furthermore, as illustrated in FIG. 3, each of the floating diffusion regions FD1 and FD2 is electrically connected to one of the drain/source of each of reset transistors RST1 and RST2 for resetting the accumulated electric charges. The gate of each of the reset transistors RST1 and RST2 is electrically connected to a reset signal line (not illustrated), and is further electrically connected to the vertical drive circuit unit 32 described above. In addition, the other of the drain/source of each of the reset transistors RST1 and RST2 is electrically connected to a power supply circuit (power supply potential VDD). Then, the reset transistors RST1 and RST2 are configured to become conductive according to the voltages applied to their own gates, and reset electric charges accumulated in the floating diffusion regions FD1 and FD2 (discharge to power supply circuits (power supply potentials VDD).

Note that the equivalent circuit of the light receiving element 10 according to the present embodiment is not limited to the example illustrated in FIG. 3, and may include, but is not particularly limited to, for example, another element and the like.

Here, an operation example of the light receiving element 10 will be briefly described.

First, before light reception is started, a discharge operation for discharge of electric charges in the photodiode PD is performed. In other words, discharge transistors OFG1 and OFG2 are turned on, and the electric charges in the photodiode PD are discharged to the power supply circuit (power supply potential VDD).

Next, when light reception is started, the distribution transistors VG1 and VG2 are controlled to operate at different timings (e.g., differentially). Specifically, in a first period, the distribution transistor VG1 is turned on, whereby the electric charges in the photodiode PD are transferred to the electric charge storage unit MEM1. On the other hand, in a second period, the distribution transistor VG2 is turned on, whereby the electric charges in the photodiode PD are transferred to the electric charge storage unit MEM2. In other words, the electric charges generated by the photodiode PD are distributed to the electric charge storage units MEM1 and MEM2 by the distribution transistors VG1 and VG2.

Next, a discharging operation for discharge of electric charges in the floating diffusion regions FD1 and FD2 is performed. In other words, the reset transistors RST1 and RST2 are turned on, and the electric charges in the floating diffusion regions FD1 and FD2 are discharged to the power supply circuits (power supply potentials VDD). Then, electric charges (ktc noise) generated in the floating diffusion regions FD1 and FD2 are preferably removed by driving CDS.

Then, the transfer transistors TG1 and TG2 are turned on, and the electric charges accumulated in the electric charge storage units MEM1 and MEM2 are transferred to the floating diffusion regions FD1 and FD2. Then, when the period of light reception ends, the light receiving elements 10 of the pixel array unit 12 are sequentially selected. In a selected light receiving element 10, the selection transistors SEL1 and SEL2 are turned on. Therefore, the electric charges accumulated in the floating diffusion regions FD1 and FD2 are output as signals to the signal lines VSL1 and VSL2.

Note that the operation of the light receiving element 10 according to the present embodiment is not limited to the example described above, and for example, the order may be appropriately changed. In the present embodiment, the distance to the target 800 is allowed to be obtained from a distribution ratio of the electric charges accumulated in the two floating diffusion regions FD1 and FD2. Hereinafter, the principle thereof will be briefly described.

Figure 4:
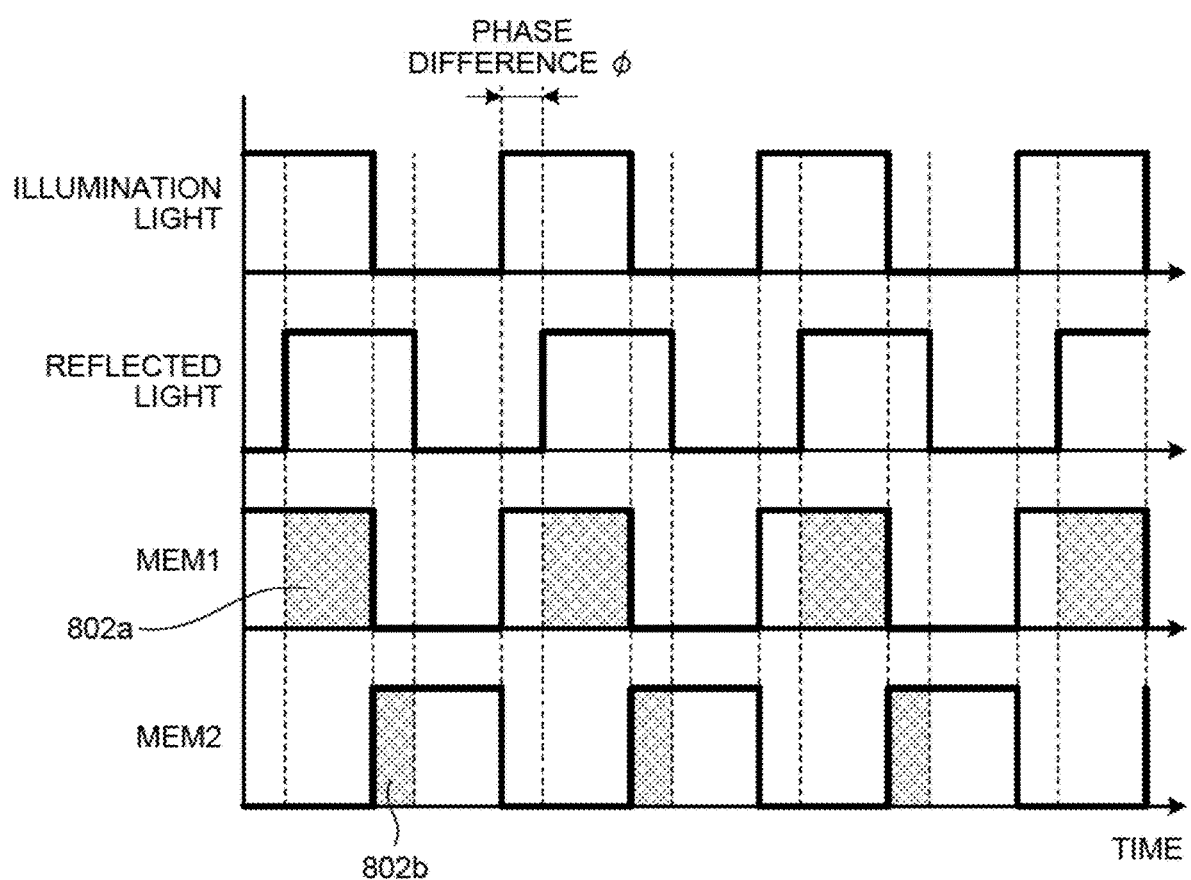
FIG. 4 is an explanatory diagram illustrating the principle of a distance calculation method using the distance measurement module 1 according to the embodiment of the present disclosure.

4. Principle of Distance Calculation Method Using Distance Measurement Module 1 According to Embodiment of Present Disclosure Next, the principle of the distance calculation method (indirect method) using the distance measurement module 1 according to the embodiment of the present disclosure will be described with reference to FIG. 4. FIG. 4 is an explanatory diagram illustrating the principle of the distance calculation method using the distance measurement module 1 according to the embodiment of the present disclosure. Specifically, FIG. 4 schematically illustrates temporal variation of intensities of the illumination light and the reflected light in the distance measurement module 1.

As illustrated in FIG. 4, the distance measurement module 1 emits, from the light emitting unit 20 to the target 800, light modulated so that the intensity of the light periodically varies. The emitted light is reflected by the target 800, and detected as reflected light by the light receiving unit 30 of the distance measurement module 1. As illustrated in FIG. 4, the reflected light (the second from the top in FIG. 4) detected has a phase difference $\phi$ relative to the illumination light (the first from the top in FIG. 4), and the phase difference $\phi$ increases as the distance from the distance measurement module 1 to the target 800 increases and decreases as the distance from the distance measurement module 1 to the target 800 decreases.

As described above, the light receiving element 10 according to the present embodiment includes, for example, the distribution transistors VG1 and VG2 that are operated differentially. Therefore, the distribution transistors VG1 and VG2 have operation periods that do not overlap each other, and the electric charges accumulated in the photodiode PD are distributed to the electric charge storage units MEM1 and MEM2, in durations of areas 802$a$ and 802$b$ indicated by gray color in FIG. 4. Specifically, the electric charges distributed to the electric charge storage units MEM1 and MEM2 are transferred to the floating diffusion regions FD1 and FD2, and finally converted into signals corresponding to areas that represent integral values in the durations of the areas 802$a$ and 802$b$. Therefore, as is clear from FIG. 4, a difference between the integral value of the area 802$a$ and the integral value of the area 802$b$ changes according to the phase difference $\phi$ of the reflected light. Therefore, in the present embodiment, the distance to the target 800 can be calculated by calculating the phase difference $\phi$ based on the difference between the integral value of the area 802$a$ and the integral value of the area 802$b$. Note that, in the present embodiment, it is also possible to calculate the distance by calculating the phase difference $\phi$ by using not the difference between the integral values but a ratio between the integral values.

5. Background of Creation of Present Embodiment

The distance measurement module 1, the light receiving unit 30, the light receiving element 10, and the principle of the distance calculation method according to the embodiment of the present disclosure have been described above. Before further description of the details of the present embodiment, the background of the creation of the present embodiment by the present inventors will be briefly described.

As described above, in the distance measurement module 1 using the indirect method, the electric charges generated in the photodiode PD by the reflected light from the target 800 are distributed to the electric charge storage units MEM1 and MEM2 by the two distribution transistors VG1 and VG2. Furthermore, in the distance measurement module 1, the electric charges distributed to the electric charge storage units MEM1 and MEM2 are converted into the signals, the phase difference $\phi$ is calculated on the basis of the difference or ratio between the converted signals, thus, acquiring the distance to the target 800.

However, for such a distance measurement module 1, in order to ensure high distance measurement accuracy, it is preferable to form the distribution transistors VG1 and VG2 into a more ideal state in all light receiving elements 10, in other words, it is preferable that the performance of distributing the electric charges may be equal between all light receiving elements 10. Therefore, in other words, even in a mass production process, the distribution transistors VG1 and VG2 are required to be uniformly formed in all light receiving elements 10, even if a variation in manufacturing (e.g., layout shift etc.) occurs.

For example, although an example of the plan view configurations of the light receiving element 10 will be described later in detail, the gate electrodes of the distribution transistors VG1 and VG2 are provided adjacent to the photodiode PD. When the gate electrodes are provided at the same (substantially the same) distance from the photodiode PD, it can be said that the performance of distributing the electric charges is substantially equal between the distribution transistor VG1 and the distribution transistor VG2. However, when the gate electrodes are not provided at the same (substantially the same) distance from the photodiode PD due to the variation in manufacturing, the performance of distributing the electric charges is different between the distribution transistor VG1 and the distribution transistor VG2. Furthermore, when the difference in performance between the distribution transistors VG1 and VG2 is different between the light receiving elements 10 due to the variation in manufacturing, the electric charges collected in the electric charge storage units MEM1 and MEM2 are non-uniform in the light receiving elements 10, and thus, there is a possibility that distance measurement error may be increased between the distance measurement modules 1.

Therefore, in view of the above situation, the present inventors have created the embodiment of the present disclosure related to the plan view configurations of the light receiving element 10 that are less susceptible to variation in manufacturing to ensure high distance measurement accuracy. Specifically, in the embodiment of the present disclosure, the plan view configurations of the light receiving element 10 show that the gate electrodes of the distribution transistors VG1 and VG2 are provided at positions axially symmetric to each other with respect to the center line extending so as to pass through the center of the photodiode PD. In the embodiment of the present disclosure, adopting the plan view configurations as described above, even if variation in manufacturing occurs, the gate electrodes provided at the same (substantially the same) distance to the photodiode PD make the performance of distributing the electric charges becomes substantially equal between the distribution transistor VG1 and the distribution transistor VG2. Therefore, even if the variation in manufacturing occurs, the distribution transistors VG1 and VG2 are readily formed uniformly in all light receiving elements 10, and it is possible to avoid a situation in which each light receiving element 10 has a difference in performance between the distribution transistor VG1 and the distribution transistor VG2. Accordingly, in the embodiment of the present disclosure, the electric charges collected in the electric charge storage units MEM1 and MEM2 become uniform in the light receiving elements 10. Therefore the distance measurement module 1 can ensure high distance measurement accuracy. Hereinafter, details of embodiments of the present disclosure created by the present inventors will be sequentially described.

6. First Embodiment

<6.1 Plan View Configuration>

Figure 5:
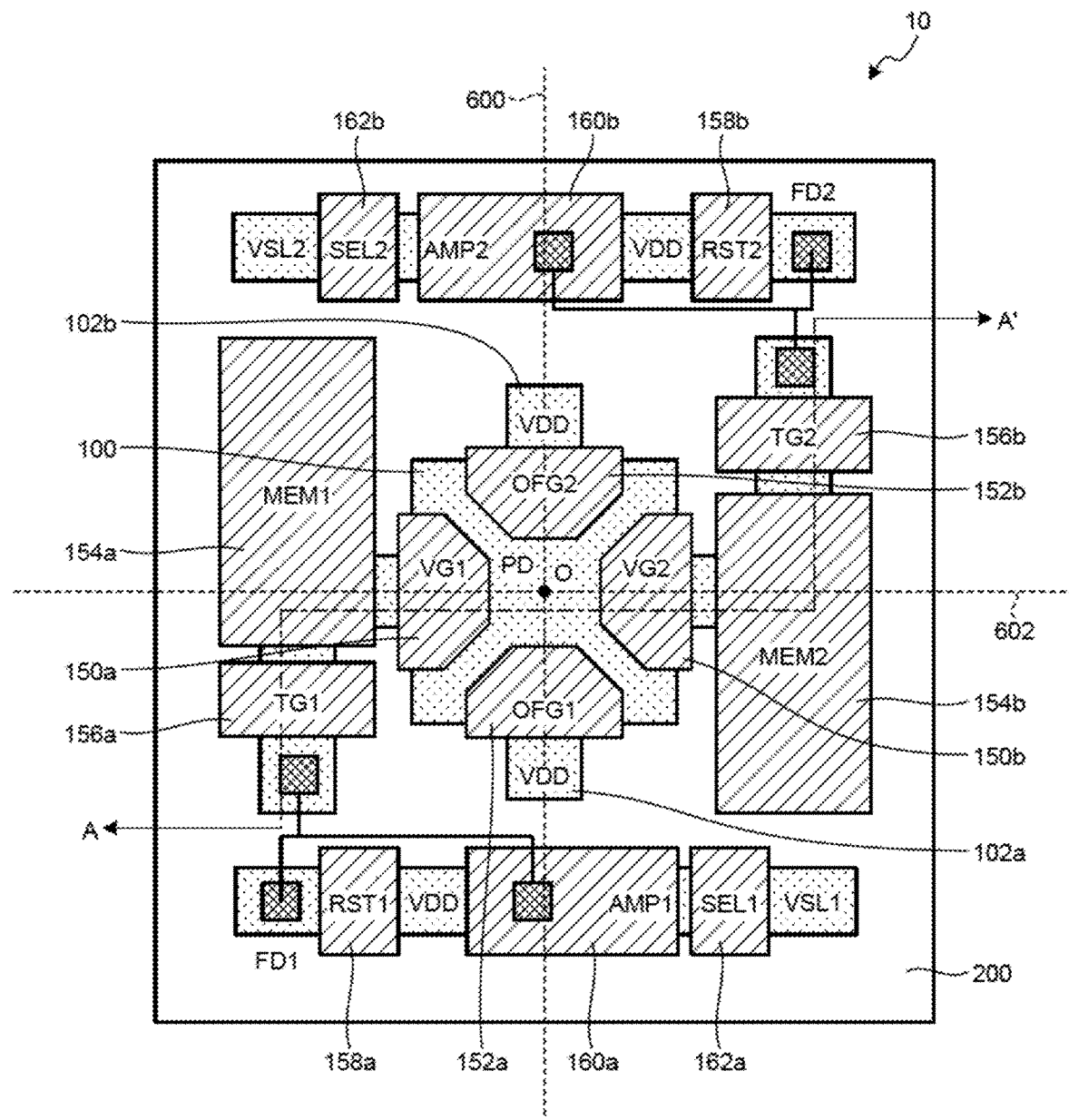
FIG. 5 is an explanatory diagram illustrating an example of a plan view configuration of the light receiving element 10 according to a first embodiment of the present disclosure.

First, an example of the plan view configuration of each light receiving element 10 according to a first embodiment of the present disclosure will be described with reference to FIG. 5. FIG. 5 is an explanatory diagram illustrating an example of the plan view configuration of the light receiving element 10 according to the present embodiment, in which the light receiving element 10 is viewed from above a surface of the semiconductor substrate 200. Note that a left-right direction in FIG. 5 corresponds to the row direction (left-right direction) in FIG. 2A, and an up-down direction in FIG. 5 corresponds to the column direction (up-down direction) in FIG. 2A.

As illustrated in FIG. 5, an N-type semiconductor region 100 is formed in a P-type semiconductor substrate 200 in the center portion of the light receiving element 10, and the N-type semiconductor region 100 partially constitutes the photodiode (first photoelectric conversion unit) PD. Furthermore, the gate electrodes (the first distribution gate and the second distribution gate) 150a and 150b of the distribution transistors VG1 and VG2 are arranged so as to be axially symmetric (substantially axially symmetric) with respect to the center line (first center axis) 600 passing through a center point (center) O of the photodiode PD and extending in the light receiving element 10 in the vertical direction (column direction). The distribution transistors VG1 and VG2 are configured to distribute electric charges generated in the photodiode PD to the electric charge storage units MEM1 and MEM2 described later. The gate electrodes 150a and 150b of the distribution transistors VG1 and VG2 are provided so as to overlap at least part of the N-type semiconductor region 100.

Specifically, the distribution transistor VG1 includes the gate electrode 150a, a gate insulating film (not illustrated) positioned between the gate electrode 150a and the semiconductor substrate 200, the N-type semiconductor region 100 as a source region, and N-type semiconductor regions 102a and 102b as a drain region. The N-type semiconductor region 100 as the source region is shared with the photodiode PD, and the N-type semiconductor regions as the drain region are shared with the electric charge storage unit MEM1. In addition, the distribution transistor VG2 also has a similar configuration to that of the distribution transistor VG1.

In addition, the electric charge storage units MEM1 and MEM2 to which electric charges generated in the photodiode PD are transferred are provided to be mirror-symmetric with respect to the center line 600 and to hold the distribution transistors VG1 and VG2 from both sides. In other words, the electric charge storage units MEM1 and MEM2 are provided at positions where the electric charge storage units MEM1 and MEM2 are point-symmetric (substantially point-symmetric) with respect to the center point (center) O of the photodiode PD. Specifically, the electric charge storage unit MEM1 is configured to be, for example, a metal-oxide-semiconductor (MOS) capacitance that includes an electrode 154a, an insulating film (not illustrated) provided below the electrode 154a, and an N-type semiconductor region (not illustrated) provided below the insulating film. In addition, the electric charge storage unit MEM2 also has a similar configuration to that of the electric charge storage unit MEM1.

As described above, in the present embodiment, the gate electrodes 150a and 150b of the distribution transistors VG1 and VG2 are arranged to be axially symmetric with respect to the center point O (specifically, the center line 600) of the photodiode PD. Therefore, according to the present embodiment, the performance of distributing the electric charges becomes substantially equal between the distribution transistor VG1 and the distribution transistor VG2. Accordingly, in the present embodiment, even if the variation in manufacturing (e.g., layout shift) occurs, it is possible to avoid the situation in which each light receiving element 10 has a difference in performance between the distribution transistor VG1 and the distribution transistor VG2, in all light receiving elements 10, and further, the distance measurement module 1 can ensure high distance measurement accuracy.

Furthermore, as illustrated in FIG. 5, gate electrodes 152a and 152b (a first discharge gate and a second discharge gate) of the discharge transistors OFG1 and OFG2 are arranged so as to be axially symmetric (substantially axially symmetric) with respect to a center line (second center axis) 602 passing through the center point O of the photodiode PD and extending in the light receiving element 10 in the left-right direction (row direction). Note that the center line 602 is orthogonal to the center line 600 described above. In addition, the gate electrodes 152a and 152b of the discharge transistors OFG1 and OFG2 are provided so as to overlap at least part of the N-type semiconductor region 100.

Specifically, the discharge transistor OFG1 includes the gate electrode 152a, a gate insulating film (not illustrated) positioned between the gate electrode 152a and the semiconductor substrate 200, the N-type semiconductor region 100 as the source region, and an N-type semiconductor region (not illustrated) as the drain region. The N-type semiconductor region 100 as the source region is shared with the photodiode PD. In addition, the discharge transistor OFG2 also has a similar configuration to that of the discharge transistor OFG1.

In addition, gate electrodes (a first transfer gate and a second transfer gate) 156a and 156b of the transfer transistors TG1 and TG2 are provided to be mirror-symmetric with respect to the center line 600 and to hold the distribution transistors VG1 and VG2 from both sides. In other words, the gate electrodes 156a and 156b of the transfer transistors TG1 and TG2 are provided at positions where the gate electrodes 156a and 156b are point-symmetric (substantially point-symmetric) with respect to the center point (center) O of the photodiode PD. Specifically, the gate electrode 156a of the transfer transistor TG1 is arranged adjacent to a gate insulating film (not illustrated) positioned between the gate electrode 156a and the semiconductor substrate 200, and the electrode 154a of the electric charge storage unit MEM1, in the up-down direction (column direction) in FIG. 5, and the gate electrode 156b of the transfer transistor TG2 is arranged adjacent to an electrode 154b of the electric charge storage unit MEM2, in the up-down direction (column direction) in FIG. 5. The transfer transistors TG1 and TG2 are configured to transfer the electric charges accumulated in the electric charge storage units MEM1 and MEM2 to the floating diffusion regions FD1 and FD2 which are described later. Specifically, the transfer transistor TG1 includes the gate electrode 156a, an N-type semiconductor region (not illustrated) as the source region, and an N-type semiconductor region (not illustrated) as the drain region. In addition, the transfer transistor TG2 also has a similar configuration to that of the transfer transistor TG1.

Furthermore, the reset transistors RST1 and RST2, the amplifying transistors AMP1 and AMP2, and the selection transistors SEL1 and SEL2 are arranged so as to be mirror-symmetrical with respect to the center line 602 and hold the discharge transistors OFG1 and OFG2 from both sides. In other words, the reset transistors RST1 and RST2, the amplifying transistors AMP1 and AMP2, and the selection transistors SEL1 and SEL2 are provided at positions where the reset transistors RST1 and RST2, the amplifying transistors AMP1 and AMP2, and the selection transistors SEL1 and SEL2 are point-symmetric (substantially point-symmetric) with respect to the center point (center) O of the photodiode PD. Note that the reset transistor RST1, the amplifying transistor AMP1, and the selection transistor SEL1 are arranged so as to be adjacent to each other, in the left-right direction (row direction) in FIG. 5, and the reset transistor RST2, the amplifying transistor AMP2, and the selection transistor SEL2 are also arranged so as to be adjacent to each other, in the left-right direction (row direction) in FIG. 5.

Specifically, the reset transistor RST1 includes a gate electrode 158a, a gate insulating film (not illustrated) positioned between the gate electrode 158a and the semiconductor substrate 200, an N-type semiconductor region (not illustrated) as the source region, and an N-type semiconductor region (not illustrated) as the drain region. The N-type semiconductor region as the source region is shared with the floating diffusion region FD1, and the N-type semiconductor region as the drain region is shared with the amplifying transistor AMP1. In addition, the reset transistor RST2 also has a similar configuration to that of the reset transistor RST1. Furthermore, the amplifying transistor AMP1 includes a gate electrode 160a, a gate insulating film (not illustrated) positioned between the gate electrode 160a and the semiconductor substrate 200, an N-type semiconductor region (not illustrated) as the drain region, and an N-type semiconductor region (not illustrated) as the source region. The N-type semiconductor region as the drain region is shared with the drain region of the reset transistor RST1. In addition, the amplifying transistor AMP2 also has a similar configuration to that of the amplifying transistor AMP1. Furthermore, the selection transistor SEL1 includes a gate electrode 162a, a gate insulating film (not illustrated) positioned between the gate electrode 162a and the semiconductor substrate 200, an N-type semiconductor region (not illustrated) as the drain region, and an N-type semiconductor region (not illustrated) as the source region. The N-type semiconductor region as the drain region is shared with the source region of the amplifying transistor AMP1. In addition, the selection transistor SEL2 also has a similar configuration to that of the selection transistor SEL1.

Note that the plan view configuration of the light receiving element 10 according to the present embodiment is not limited to the example illustrated in FIG. 5, and may include, but is not particularly limited to, for example, another element and the like.

<6.2 Cross-Sectional Configuration>

Figure 6:
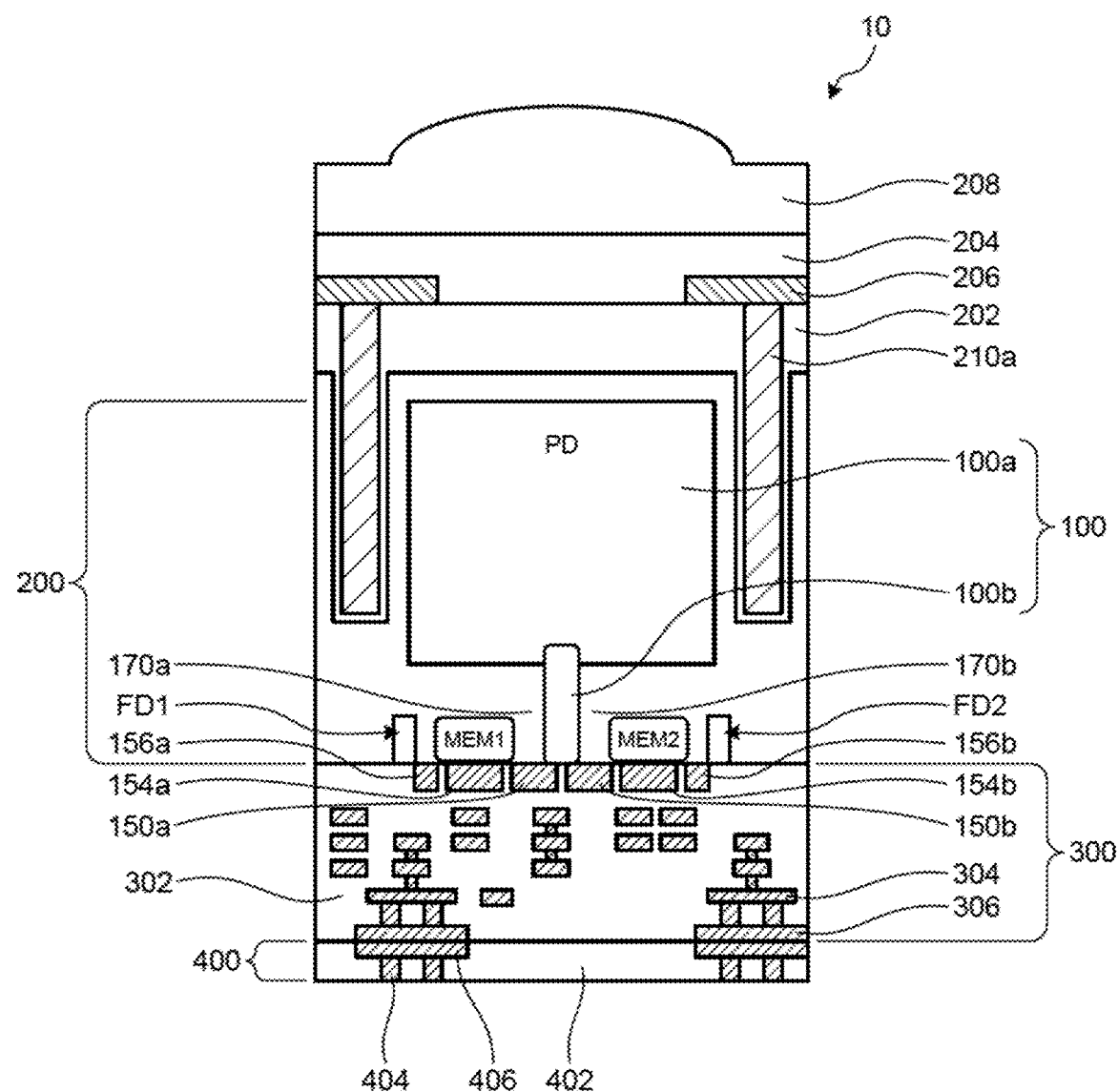
FIG. 6 is a cross-sectional view of the light receiving element 10 taken along line A-A' in FIG. 5.

Next, an example of a cross-sectional configuration of the light receiving element 10 according to the first embodiment of the present disclosure will be described with reference to FIG. 6. FIG. 6 is the cross-sectional view of the light receiving element 10 taken along line A-A' in FIG. 5. Specifically, the upper side in FIG. 6 is the back surface side of the semiconductor substrate 200, and the lower side in FIG. 6 is the front surface side of the semiconductor substrate 200.

First, as illustrated in FIG. 6, the light receiving element 10 includes the P-type semiconductor substrate 200 made of, for example, a silicon substrate or the like. Specifically, the photodiode PD is formed in the P-type semiconductor substrate 200 by forming N-type semiconductor regions 100a and 100b in the semiconductor substrate 200.

Next, a description will be given from the upper side in FIG. 6, that is, from the back surface side of the semiconductor substrate 200. An on-chip lens 208 that is made of a styrene-based resin, an acrylic resin, a styrene-acrylic copolymer resin, a siloxane-based resin, or the like, and on which the reflected light from the target 800 is incident is provided over the back surface of the semiconductor substrate 200. A planarization film 204 that is made of, for example, silicon oxide ($SiO_2$), silicon nitride (SiN), silicon oxynitride (SiON), or the like is provided below the on-chip lens 208. Furthermore, an antireflection film 202 that is made of an insulating film is provided below the planarization film 204. For example, the antireflection film 202 can be formed of hafnium oxide ($HfO_2$), aluminum oxide ($Al_2O_3$), titanium oxide ($TiO_2$), silicon oxide, or the like, or a stack thereof.

A light shielding film 206 for preventing incidence of the reflected light from the target 800 on an adjacent light receiving element 10 is provided above the antireflection film 202 and in a boundary region with the adjacent light receiving element 10. The light shielding film 206 is made of a material that shields light, and can be formed using, for example, a metal material such as tungsten (W), aluminum (Al), or copper (Cu).

Furthermore, a pixel isolation portion 210a (deep trench isolation (DTI)) that penetrates from the back surface of the semiconductor substrate 200 to the middle of the semiconductor substrate 200 in the thickness direction of the semiconductor substrate 200 is provided below the light shielding film 206. The pixel isolation portion 210a includes, for example, a trench that is provided in the semiconductor substrate 200 and an insulating film made of a silicon oxide or the like or a metal film made of aluminum or the like, embedded in the trench. The pixel isolation portion 210a is configured to prevent incident light from entering the adjacent light receiving elements 10. Therefore, occurrence of charge crosstalk between the adjacent light receiving elements 10 can be prevented.

Next, the lower side in FIG. 6, that is, the front surface side of the semiconductor substrate 200 will be described. Two distribution transistors VG1 and VG2 are formed so as to hold the N-type semiconductor region 100b. Specifically, the respective distribution transistors VG1 and VG2 include gate electrodes 150a and 150b that are made of, for example, a polysilicon film and provided on the surface of the semiconductor substrate 200.

Furthermore, the electric charge storage units MEM1 and MEM2 are provided in the semiconductor substrate 200 so as to hold the distribution transistors VG1 and VG2 from the left and right directions. For example, the electric charge storage units MEM1 and MEM2 can be the MOS capacitance that includes the electrodes 154a and 154b that are made of a metal film or polysilicon film, the insulating film (not illustrated) that is made of an oxide film, and the N-type semiconductor region (In FIG. 6, illustrated as MEM1 and MEM2).

Then, the gate electrodes 156a and 156b of the transfer transistors TG1 and TG2 are provided adjacent to the electric charge storage units MEM1 and MEM2, on the surface of the semiconductor substrate 200. Furthermore, the N-type semiconductor regions illustrated as the floating diffusion regions FD1 and FD2 are formed in the semiconductor substrate 200 closer to the gate electrodes 156a and 156b of the transfer transistors TG1 and TG2.

Furthermore, a wiring layer 300 is provided on the surface of the semiconductor substrate 200. The wiring layer 300 includes an insulating film 302 and a metal film 304. Furthermore, an electrode 306 is provided on a surface of the wiring layer 300 opposite to the semiconductor substrate 200.

In addition, a substrate 400 is provided on a surface of the wiring layer 300 opposite to the semiconductor substrate 200. The substrate 400 also includes an insulating film 402 and a metal film 404, and an electrode 406 is provided on a surface closer to the wiring layer 300. In the present embodiment, for example, the electrode 306 of the wiring layer 300 and the electrode 406 of the substrate 400 are formed of copper (Cu) or the like, and the wiring layer 300 and the substrate 400 are joined by being brought into contact with each other.

Note that the cross-sectional configuration of the light receiving element 10 according to the present embodiment is not limited to the example illustrated in FIG. 6, and may include, but is not particularly limited to, for example, another element and the like.

As described above, in the present embodiment, the gate electrodes 150a and 150b of the distribution transistors VG1 and VG2 are arranged to be axially symmetric with respect to the center point O (specifically, the center line 600) of the photodiode PD. Therefore, according to the present embodiment, the performance of distributing the electric charges becomes substantially equal between the distribution transistor VG1 and the distribution transistor VG2. Accordingly, in the present embodiment, even if the variation in manufacturing (e.g., layout shift) occurs, it is possible to avoid the situation in which each light receiving element 10 has a difference in performance between the distribution transistor VG1 and the distribution transistor VG2, in all light receiving elements 10, and further, the distance measurement module 1 can ensure high distance measurement accuracy.

<6.3 Modifications>

Note that the light receiving element 10 according to the first embodiment of the present disclosure described above can be variously modified as follows. In these modifications as well, similarly to the embodiment described above, the gate electrodes 150a and 150b of the distribution transistors VG1 and VG2 are arranged to be axially symmetric (substantially axially symmetric) with respect to the center line passing through the center point O of the photodiode PD. Modifications of the present embodiment will be sequentially described below.

(First Modification)

Figure 7:
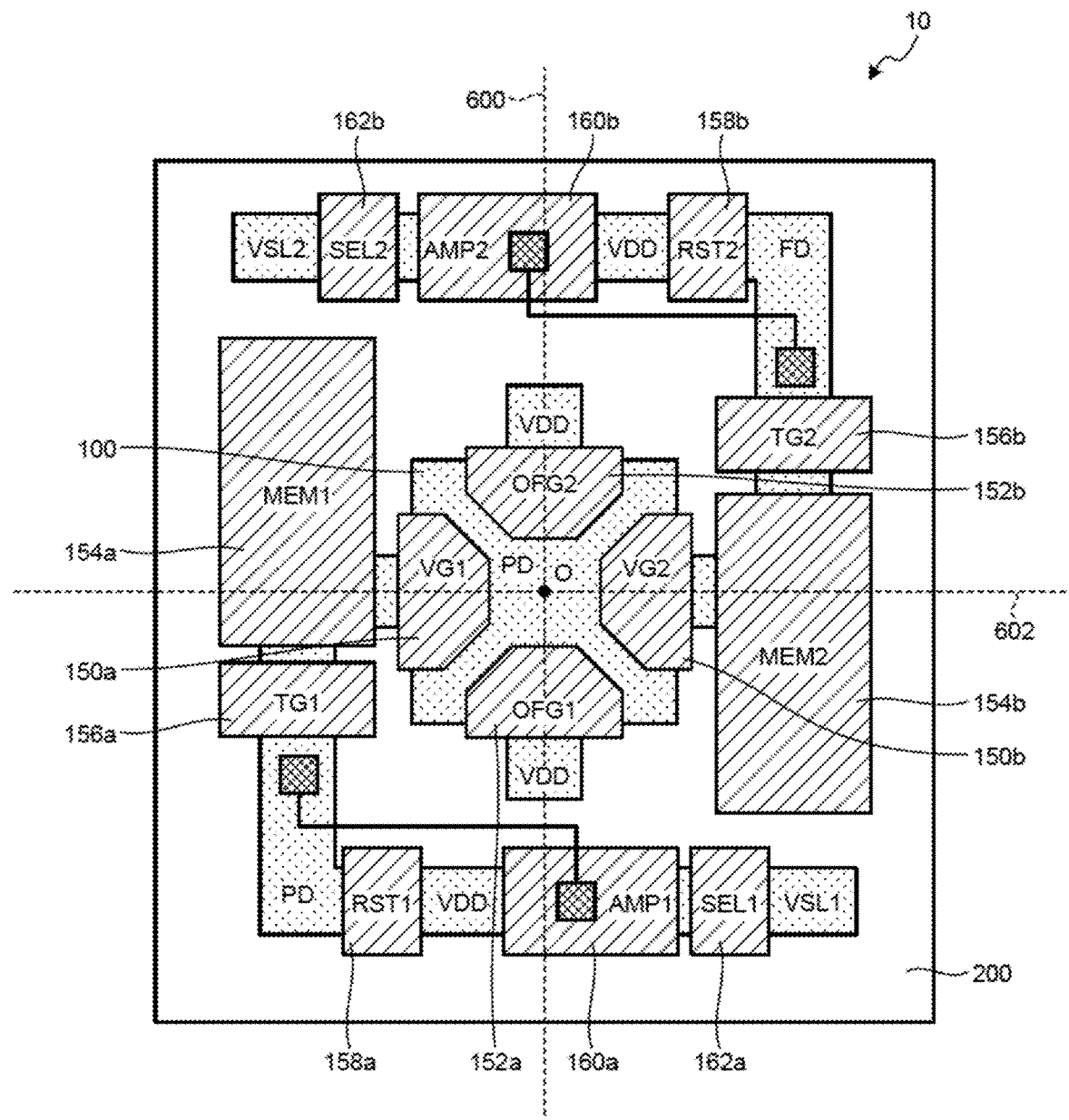
FIG. 7 is an explanatory diagram illustrating an example of a plan view configuration of the light receiving element 10 according to a first modification of the first embodiment of the present disclosure.

First, a first modification will be described with reference to FIG. 7. FIG. 7 is an explanatory diagram illustrating an example of a plan view configuration of the light receiving element 10 according to the first modification of the present embodiment. In the present first modification as well, the gate electrodes 150a and 150b of the distribution transistors VG1 and VG2 are arranged so as to be axially symmetric (substantially axially symmetric) with respect to the center line 600. Furthermore, in the present first modification, as illustrated in FIG. 7, one floating diffusion region FD is provided. In other words, one floating diffusion region FD is shared between the transfer transistors TG1 and TG2. According to the present first modification having such a configuration, the one floating diffusion region FD can be shared between the two transfer transistors TG1 and TG2, further making the light receiving element 10 finer in size.

(Second Modification)

Figure 8:
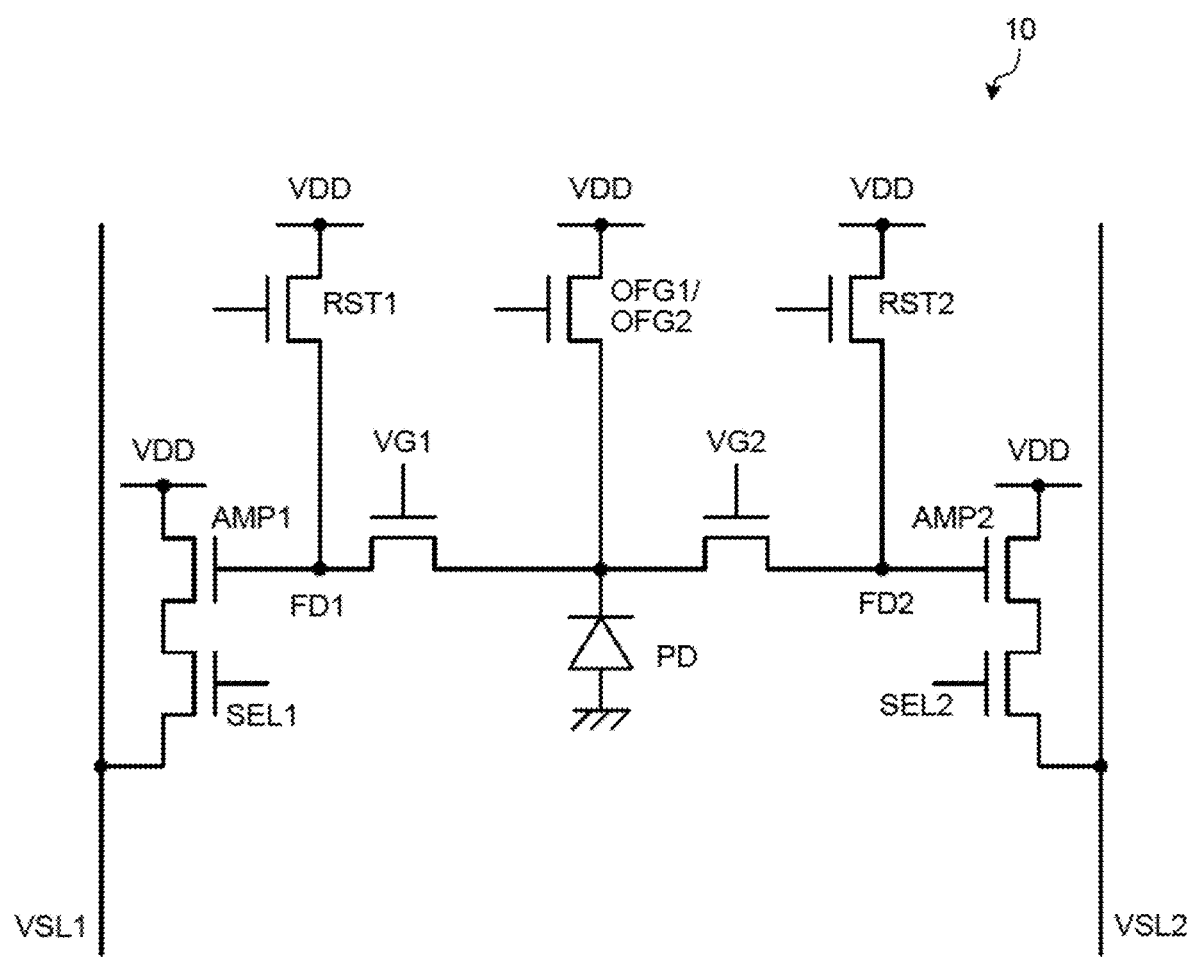
FIG. 8 is an equivalent circuit diagram of the light receiving element 10 according to a second modification of the first embodiment of the present disclosure.
Figure 9:
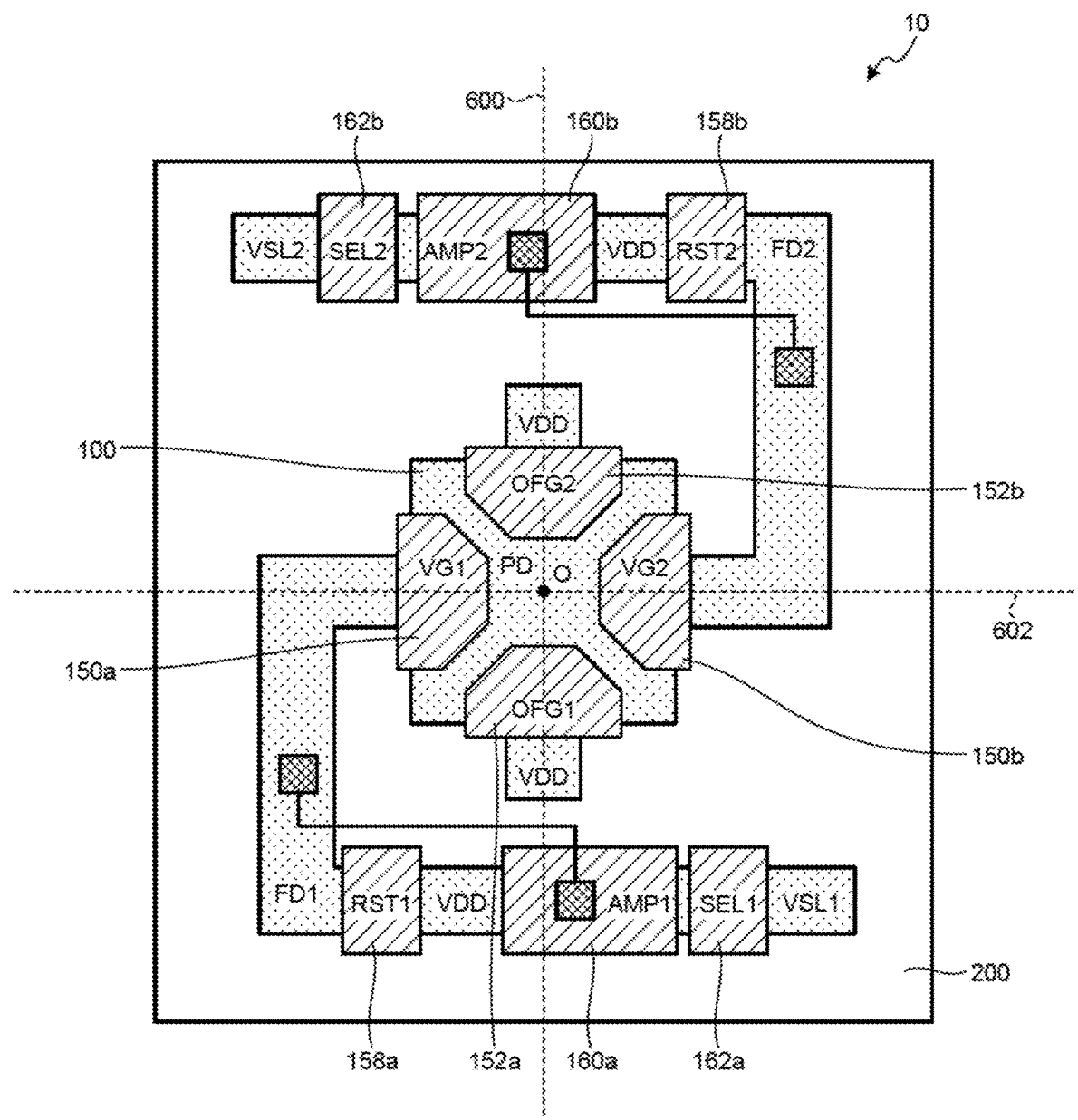
FIG. 9 is an explanatory diagram illustrating an example of a plan view configuration of the light receiving element 10 according to the second modification of the first embodiment of the present disclosure.

Next, a second modification will be described with reference to FIGS. 8 and 9. FIG. 8 is an equivalent circuit diagram of the light receiving element 10 according to the second modification of the present embodiment, and FIG. 9 is an explanatory diagram illustrating an example of a plan view configuration of the light receiving element 10 according to the second modification of the present embodiment. In the present second modification as well, as illustrated in FIG. 9, the gate electrodes 150a and 150b of the distribution transistors VG1 and VG2 are arranged to be axially symmetric (substantially axially symmetric) with respect to the center line 600. Furthermore, in the second modification, as illustrated in FIG. 8, the electric charge storage units MEM1 and MEM2 and the transfer transistors TG1 and TG2 are not provided. In other words, in the second modification, the electric charges generated in the photodiode PD are directly distributed to the floating diffusion regions FD1 and FD2 by the distribution transistors VG1 and VG2. Therefore, according to the present modification, the electric charge storage units MEM1 and MEM2 and the transfer transistors TG1 and TG2 are not provided, as described above, and thus, the light receiving element 10 can be made finer in size.

(Third and Fourth Modifications)

Figure 10:
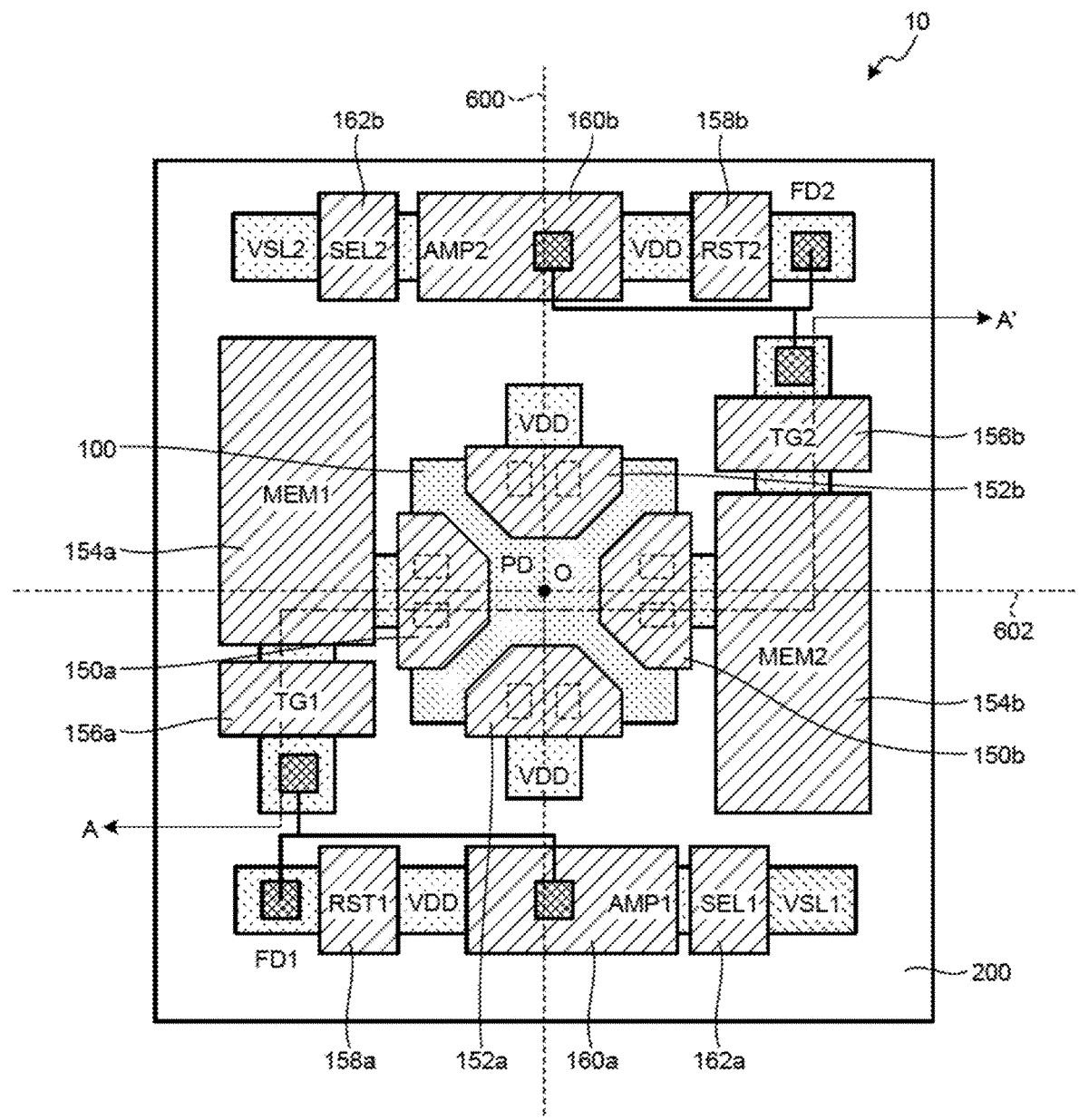
FIG. 10 is an explanatory diagram illustrating an example of a plan view configuration of the light receiving element 10 according to a third modification of the first embodiment of the present disclosure.
Figure 11:
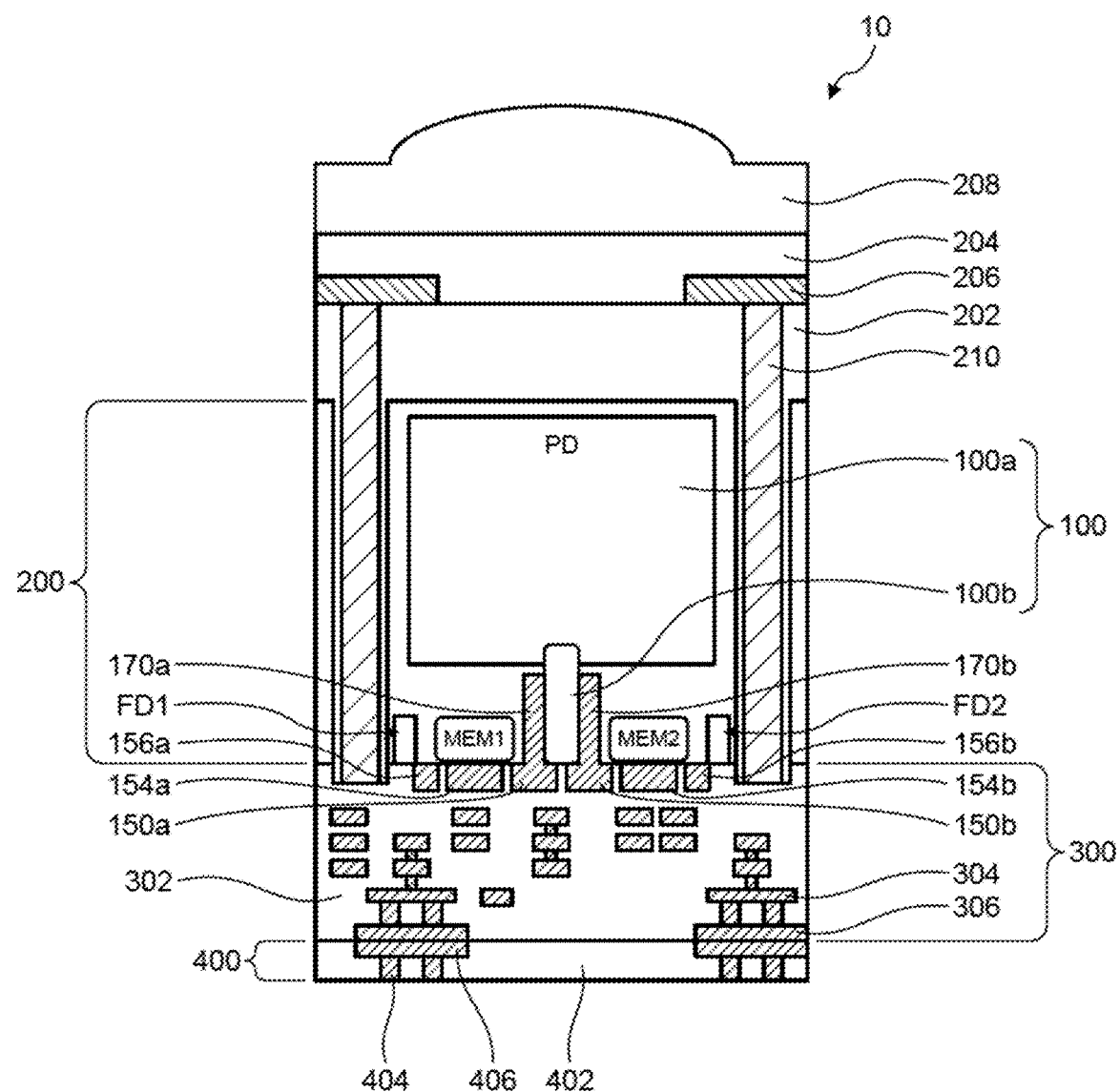
FIG. 11 is a cross-sectional view of the light receiving element 10 taken along line A-A' in FIG. 10.
Figure 12:
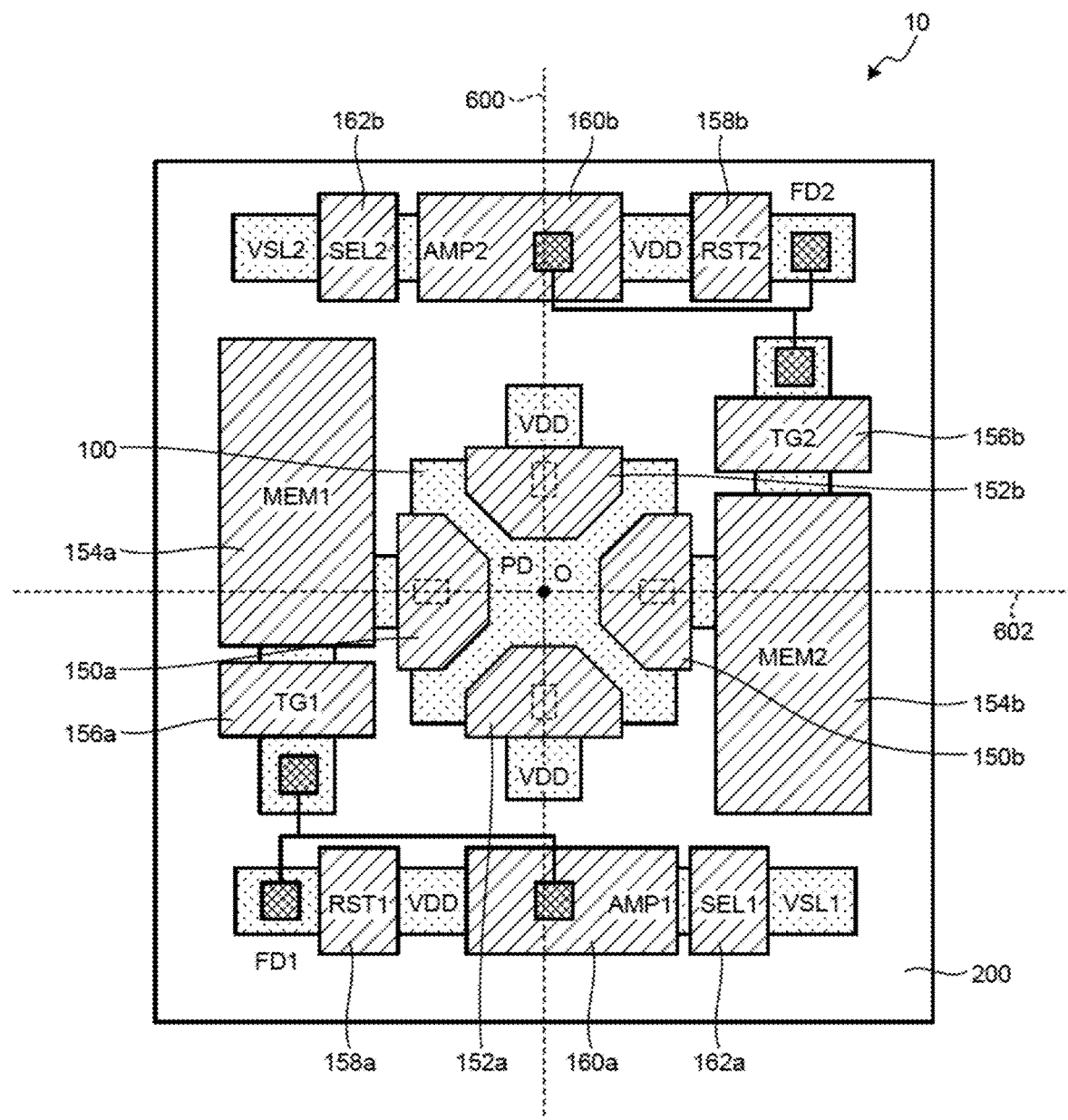
FIG. 12 is an explanatory diagram illustrating an example of a plan view configuration of the light receiving element 10 according to a fourth modification of the first embodiment of the present disclosure.

Next, third and fourth modifications will be described with reference to FIGS. 10 to 12. FIG. 10 is an explanatory diagram illustrating an example of a plan view configuration of the light receiving element 10 according to the third modification of the present embodiment, and FIG. 11 is a cross-sectional view of the light receiving element 10 taken along line A-A' in FIG. 10. FIG. 12 is an explanatory diagram illustrating an example of the plan view configuration of the light receiving element 10 according to the fourth modification of the present embodiment. In the present third and fourth modifications as well, as illustrated in FIGS. 10 and 12, the gate electrodes 150a and 150b of the distribution transistors VG1 and VG2 are arranged so as to be axially symmetric (substantially axially symmetric) with respect to the center line 600.

Furthermore, in the present third modification, as indicated by a broken line in FIG. 10, the gate electrodes 150a and 150b of the distribution transistors VG1 and VG2 have a pair of buried gate portions in the semiconductor substrate 200. Specifically, as illustrated in FIG. 11, each of the gate electrodes 150a and 150b has two vertical buried gate portions 170a and 170b in the semiconductor substrate 200. According to the present third modification, such a configuration makes it possible that the semiconductor regions around a pair of buried gate portions 170a and 170b is effectively modulated by voltages applied to the pair of buried gate portions 170a and 170b. Therefore, according to the present third modification, such modulation makes it possible that the electric charges generated in the photodiode PD at a portion deep inside the semiconductor substrate 200 are transferred to the storage units MEM1 and MEM2 at higher speed.

Furthermore, in the present fourth modification, as indicated by a broken line in FIG. 12, the gate electrodes 150a and 150*b* of the distribution transistors VG1 and VG2 have one buried gate portion in the semiconductor substrate 200. In the present fourth modification as well, it is possible to effectively modulate the semiconductor regions around the buried gate portions 170*a* and 170*b* by voltages applied to the buried gate portions 170*a* and 170*b* so that the electric charges generated in the photodiode PD at a portion deep inside the semiconductor substrate 200 may be transferred to the storage units MEM1 and MEM2 at higher speed. Furthermore, in the present fourth modification, it is easier to make the gate electrodes 150*a* and 150*b* fine in size, due to one buried gate portion included in each of the gate electrodes 150*a* and 150*b*.

Furthermore, in the present third and fourth modifications, as indicated by the broken lines in FIGS. 10 and 12, the gate electrodes 152*a* and 152*b* of the discharge transistors OFG1 and OFG2 may also have a pair of or one buried gate portion. According to the present third and fourth modifications, such a configuration makes it possible to effectively modulate the semiconductor region around the buried gate portion so that the electric charges generated in the photodiode PD at a portion deep inside the semiconductor substrate 200 may be discharged at higher speed.

(Fifth Modification)

Figure 13:
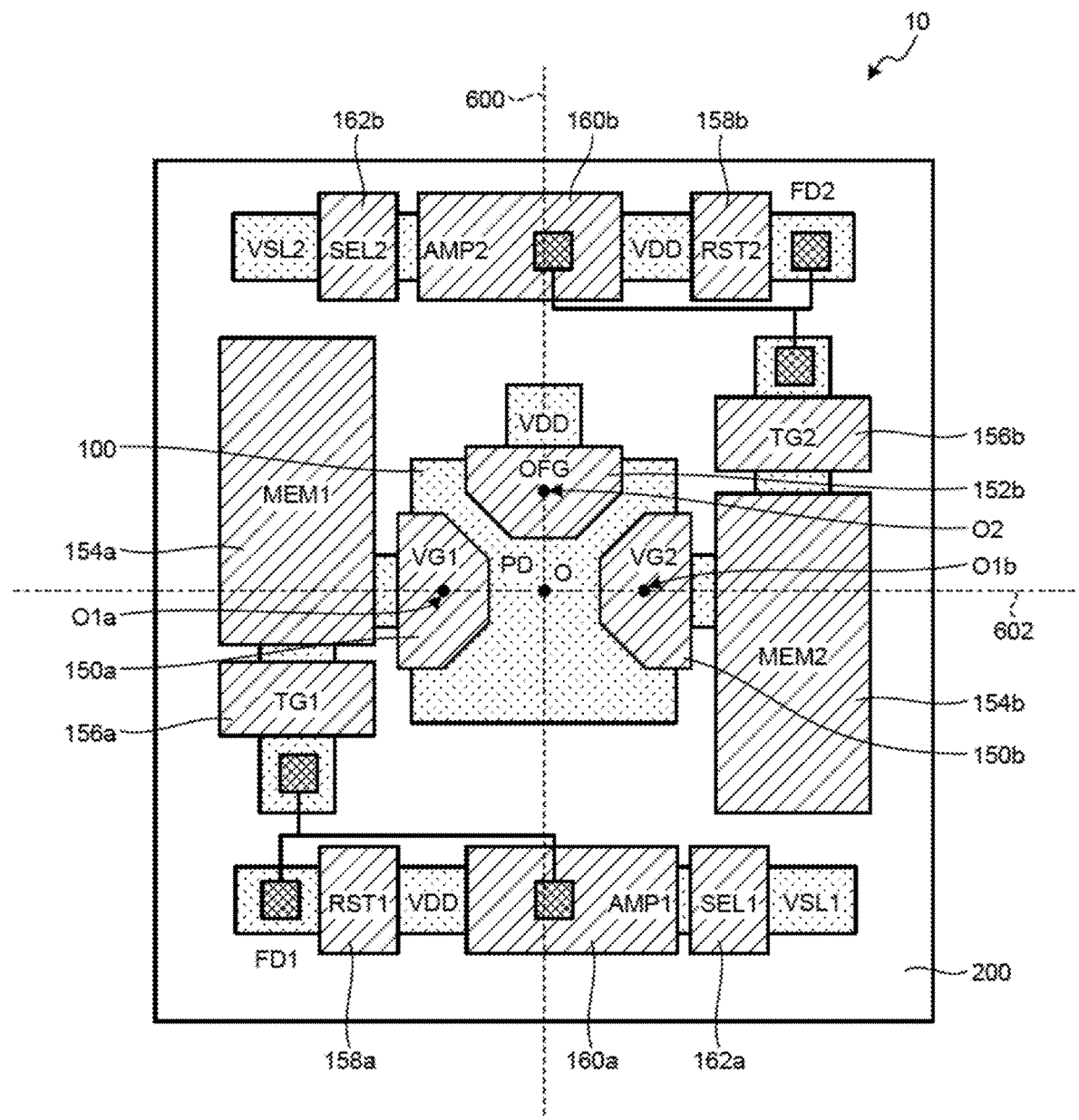
FIG. 13 is an explanatory diagram illustrating an example of a plan view configuration of the light receiving element 10 according to a fifth modification of the first embodiment of the present disclosure.

Next, a fifth modification will be described with reference to FIG. 13. FIG. 13 is an explanatory diagram illustrating an example of a cross-sectional configuration of the light receiving element 10 according to the fifth modification of the present embodiment. In the present fifth modification as well, as illustrated in FIG. 13, the gate electrodes 150*a* and 150*b* of the distribution transistors VG1 and VG2 are arranged to be axially symmetric (substantially axially symmetric) with respect to the center line 600. In other words, the center line 602 is formed by connecting a line (first line segment) connecting a center point (center) O1*a* of the gate electrode (first distribution gate) 150*a* of the distribution transistor VG1 and the center point (center) O of the photodiode (first photoelectric conversion unit) PD, and a line (second line segment) connecting a center point (center) O1*b* of the gate electrode (second distribution gate) 150*b* of the distribution transistor VG2 and the center point O of the photodiode PD, and the center line 602 is orthogonal to the center line (first center axis) 600.

Furthermore, in the present fifth modification, as illustrated in FIG. 13, one discharge transistor OFG is provided. Specifically, in the present fifth modification, as illustrated in FIG. 13, the light receiving element 10 includes the gate electrode (third discharge gate) 152*b* of one discharge transistor OFG that discharges the electric charges generated in the photodiode PD. Furthermore, a center point O2 of the gate electrode 152*b* is positioned on the center line (first center axis) 600. According to the present fifth modification having such a configuration, use of one discharge transistor OFG makes it possible to make the light receiving element 10 finer in size.

(Sixth, Seventh, and Eighth Modifications)

Figure 14:
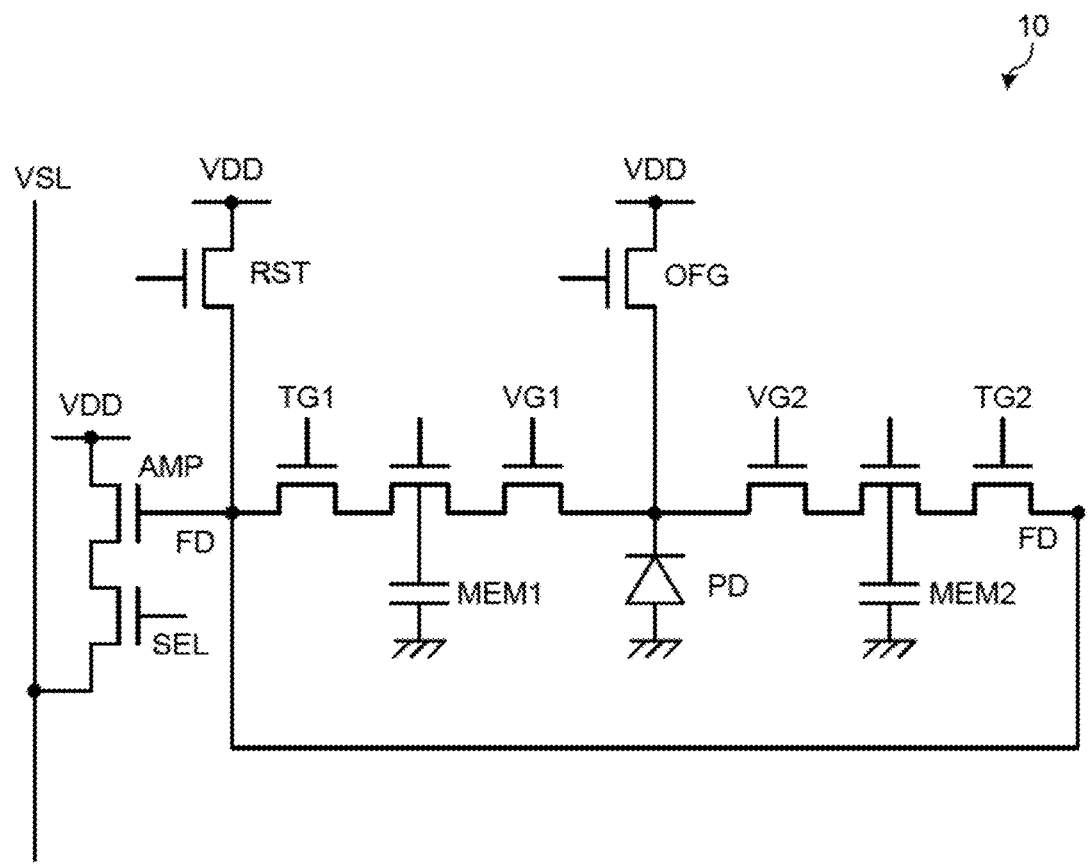
FIG. 14 is an equivalent circuit diagram of the light receiving element 10 according to a sixth modification of the first embodiment of the present disclosure.
Figure 15:
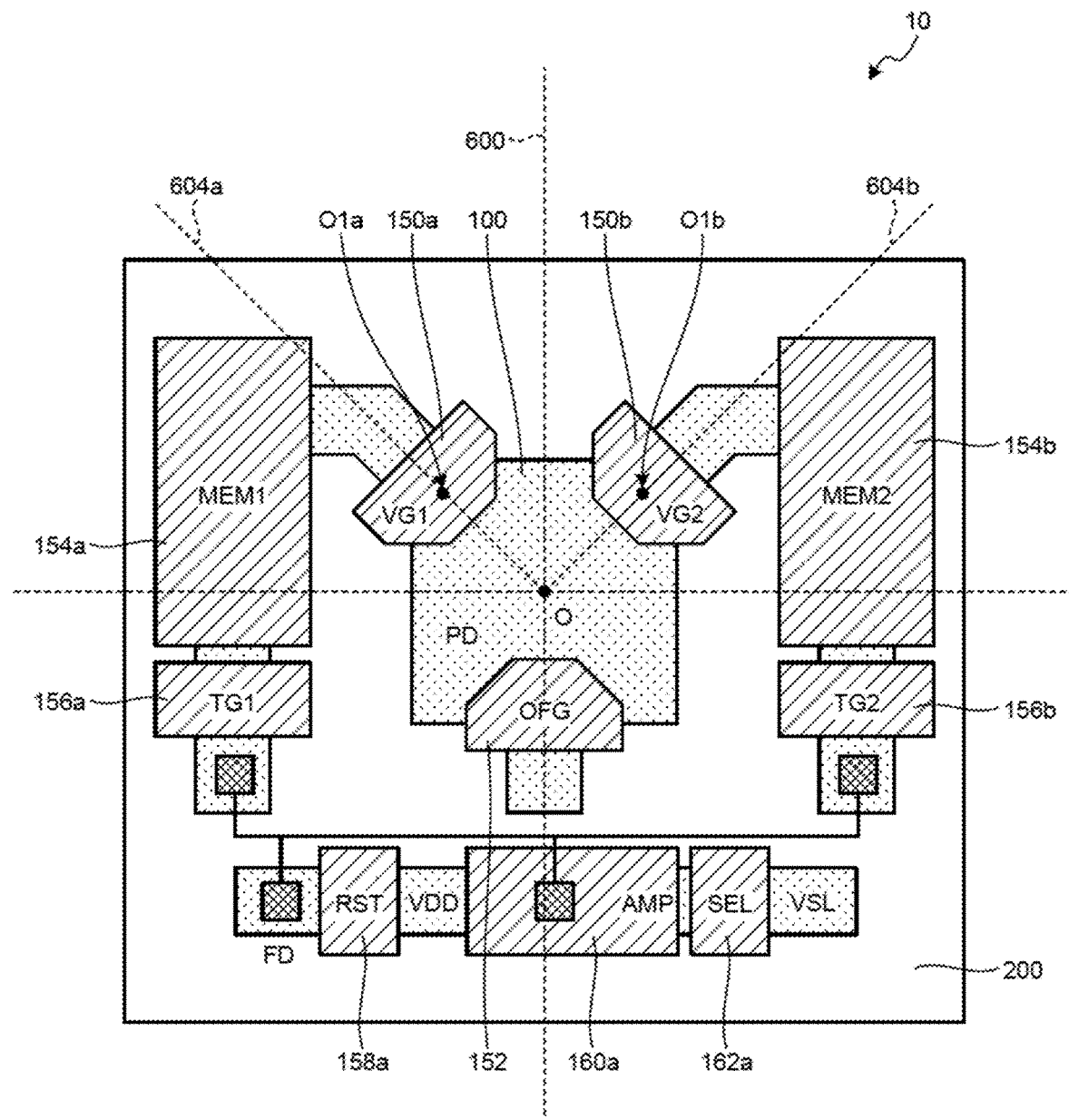
FIG. 15 is an explanatory diagram illustrating an example of a plan view configuration of the light receiving element 10 according to the sixth modification of the first embodiment of the present disclosure.
Figure 16:
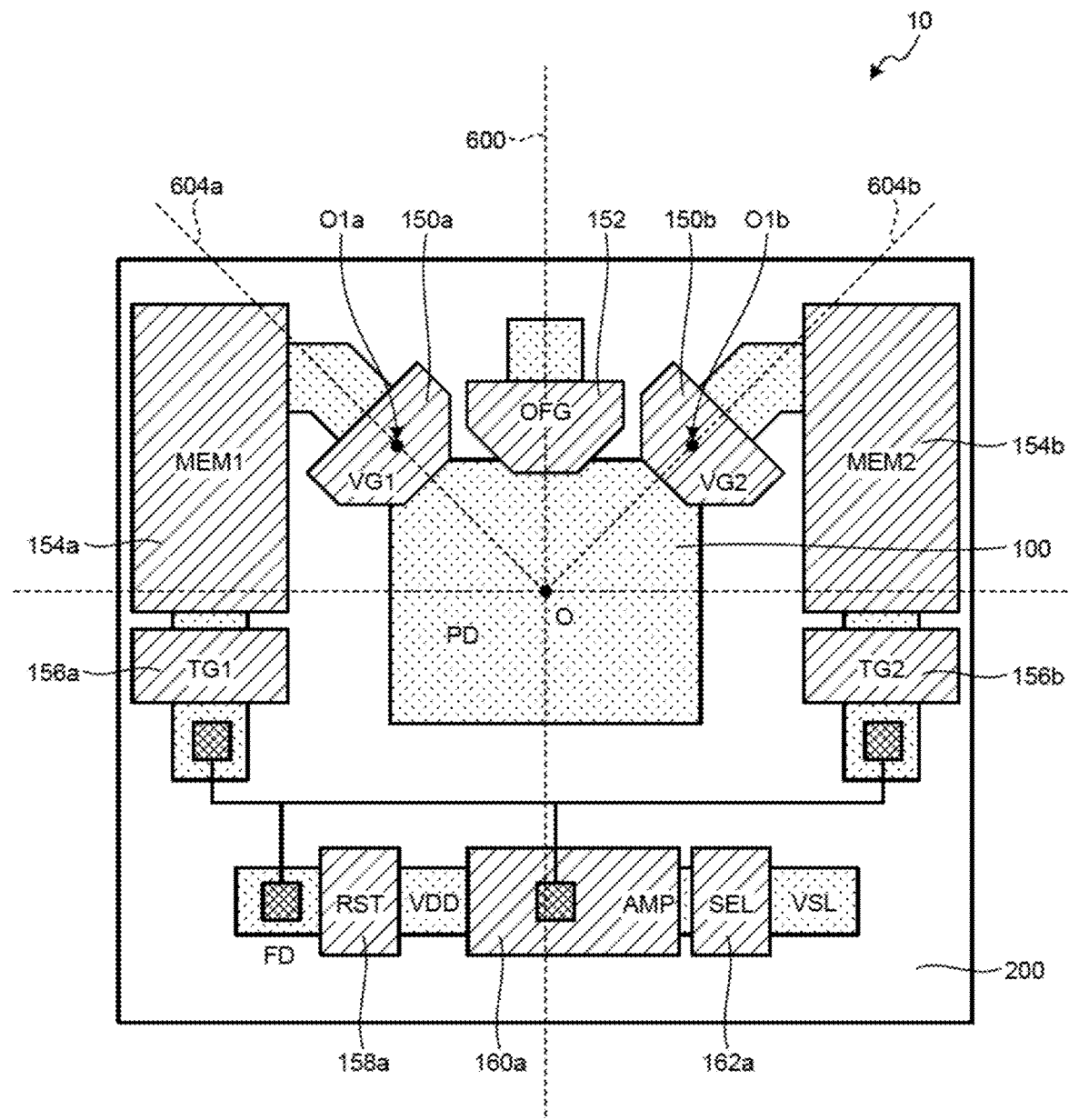
FIG. 16 is an explanatory diagram illustrating an example of a plan view configuration of the light receiving element 10 according to a seventh modification of the first embodiment of the present disclosure.
Figure 17:
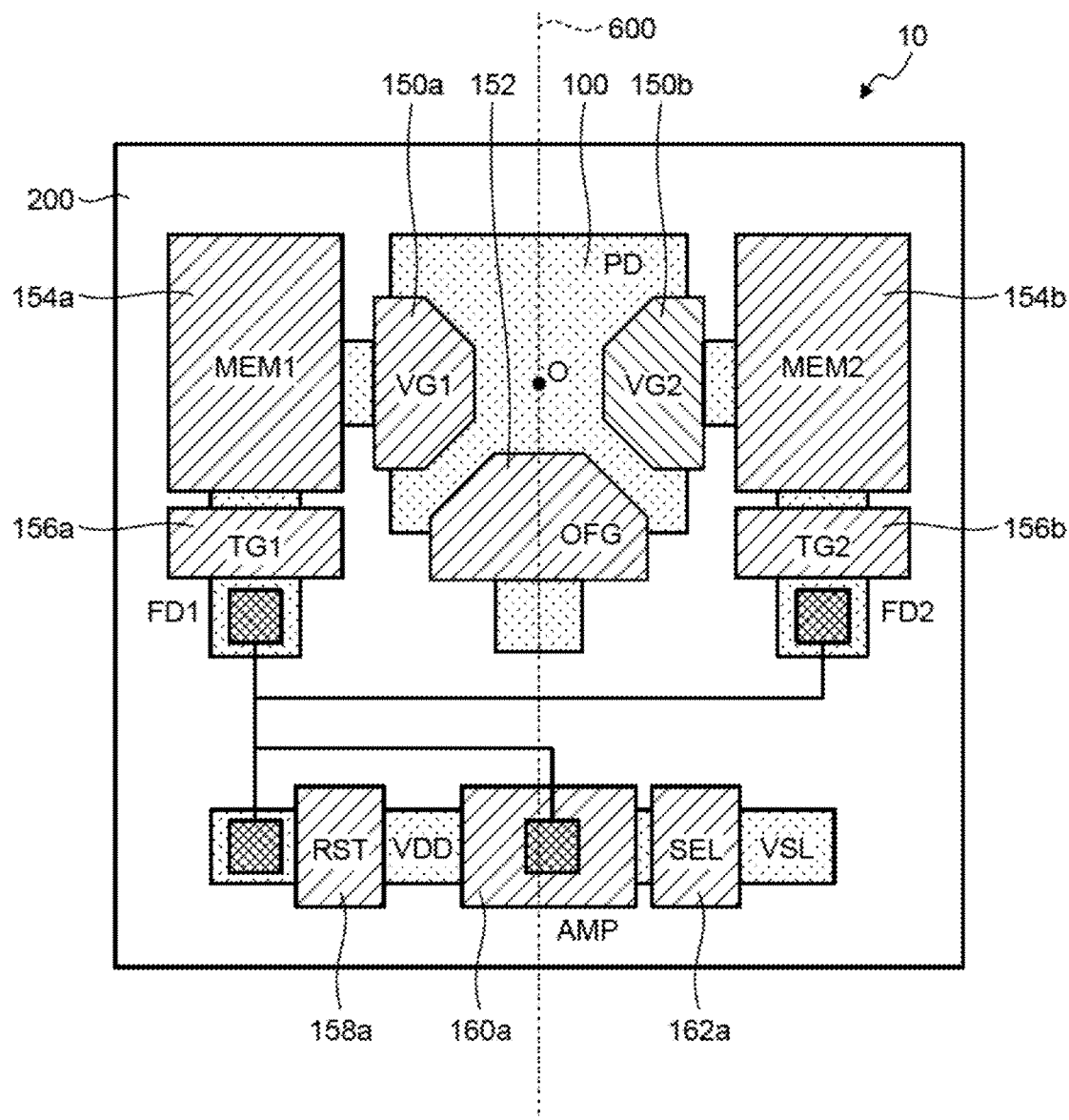
FIG. 17 is an explanatory diagram illustrating an example of a plan view configuration of the light receiving element 10 according to an eighth modification of the first embodiment of the present disclosure.

Furthermore, the fifth modification described above can be further modified as follows. Such sixth, seventh, and eighth modifications will be described with reference to FIGS. 14 to 17. FIG. 14 is an equivalent circuit diagram of the light receiving element 10 according to the sixth modification of the present embodiment, and FIG. 15 is an explanatory diagram illustrating an example of a plan view configuration of the light receiving element 10 according to the sixth modification of the present embodiment. Furthermore, FIG. 16 is an explanatory diagram illustrating an example of a plan view configuration of the light receiving element 10 according to the seventh modification of the present embodiment. FIG. 17 is an explanatory diagram illustrating an example of a plan view configuration of the light receiving element 10 according to the eighth modification of the present embodiment.

In the light receiving element 10 of the sixth modification, as illustrated in FIG. 14, one floating diffusion region FD, one reset transistor RST, one amplifying transistor AMP, and one selection transistor SEL are provided. In other words, in the light receiving element 10 of the sixth modification, the floating diffusion region FD, the reset transistor RST, the amplifying transistor AMP, and the selection transistor SEL are shared. Adopting such a configuration makes it possible for the light receiving element 10 of the present sixth modification to adopt, for example, the plan view configuration as illustrated in FIG. 15.

Specifically, in the present sixth modification, as illustrated in FIG. 15, the gate electrodes 150*a* and 150*b* of the distribution transistors VG1 and VG2 are arranged so as to be axially symmetric (substantially axially symmetric) with respect to the center line 600. More specifically, in the present sixth modification, a center line (first line segment) 604*a* (for ease of understanding, the center line 604*a* is elongated in the illustration) connecting the center point (center) O1*a* of the gate electrode (first distribution gate) 150*a* of the distribution transistor VG1 and the center point (center) O of the photodiode (first photoelectric conversion unit) PD forms an acute angle with the center line (first center axis) 600. Furthermore, a center line (second line segment) 604*b* (for ease of understanding, the center line 604*b* is elongated in the illustration) connecting the center point (center) O1*b* of the gate electrode (second distribution gate) 150*b* of the distribution transistor VG2 and the center point O of the photodiode PD forms an acute angle with the center line 600. Note that, in the present sixth modification, the measure of the acute angle is not limited, but can be, for example, 45 degrees or the like.

Furthermore, in the present sixth modification, as illustrated in FIG. 15, the electric charge storage units (first and second electric charge storage units) MEM1 and MEM2 and the transfer transistors TG1 and TG are provided at positions where the electric charge storage units MEM1 and MEM2 and the transfer transistors TG1 and TG are axially symmetric (substantially axially symmetric) with each other with respect to the center line (first center axis) 600.

According to the present sixth modification, closer arrangement of the gate electrodes 150*a* and 150*b* of the distribution transistors VG1 and VG2 makes it possible to distribute the electric charges to the electric charge storage units MEM1 and MEM2 at high speed, and the performance of distributing the electric charges becomes more equal between the distribution transistor VG1 and the distribution transistor VG2. As a result, according to the present sixth modification, even if the variation in manufacturing occurs, it is possible to avoid the situation in which each light receiving element 10 has a difference in performance between the distribution transistor VG1 and the distribution transistor VG2, in all light receiving elements 10, and further, the distance measurement module 1 can ensure high distance measurement accuracy.

Furthermore, in the seventh modification, as illustrated in FIG. 16, a gate electrode 152 of the discharge transistor OFG is provided so as to be held between the gate electrodes 150*a* and 150*b* of the distribution transistors VG1 and VG2. In the present seventh modification, closer arrangement of the distribution transistors VG1 and VG2 and the discharge transistor OFG makes it possible to increase the transfer speed of unnecessary charges in switching from the electric charge storage unit MEM2 to the power supply potential VDD (discharge), when a transfer destination of the electric charges generated in the photodiode PD is switched from the electric charge storage unit MEM1 to the power supply potential VDD (discharge).

Specifically, in the present eighth modification, as illustrated in FIG. 17, the gate electrodes 150a and 150b of the distribution transistors VG1 and VG2 are arranged so as to be axially symmetric (substantially axially symmetric) with respect to the center line 600. More specifically, in the present eighth modification, the gate electrodes 150a and 150b of the distribution transistors VG1 and VG2 are arranged so as to be axially symmetric with respect to the center line (first center axis) 600 passing through the center point (center) O of the photodiode (first photoelectric conversion unit) PD. Furthermore, in the present eighth modification, as illustrated in FIG. 17, the electric charge storage units (first and second electric charge storage units) MEM1 and MEM2 and the transfer transistors TG1 and TG2 are also provided at positions where the electric charge storage units MEM1 and MEM2 and the transfer transistors TG1 and TG2 are axially symmetric (substantially axially symmetric) with each other with respect to the center line (first center axis) 600.

According to the present eighth modification, the gate electrodes 150a and 150b of the distribution transistors VG1 and VG2 are arranged to be substantially axially symmetric. Therefore, the performance of distributing the electric charges becomes more equal between the distribution transistor VG1 and the distribution transistor VG2. As a result, according to the present eighth modification, even if the variation in manufacturing occurs, it is possible to avoid the situation in which each light receiving element 10 has a difference in performance between the distribution transistor VG1 and the distribution transistor VG2, in all light receiving elements 10, and further, the distance measurement module 1 can ensure high distance measurement accuracy. Furthermore, in the eighth modification, as illustrated in FIG. 17, the gate electrode 152 of the discharge transistor OFG is provided so as to be held between the gate electrodes 150a and 150b of the distribution transistors VG1 and VG2. In the present eighth modification, closer arrangement of the distribution transistors VG1 and VG2 and the discharge transistor OFG makes it possible to increase the transfer speed of unnecessary charges in switching from the electric charge storage unit MEM2 to the power supply potential VDD (discharge), when a transfer destination of the electric charges generated in the photodiode PD is switched from the electric charge storage unit MEM1 to the power supply potential VDD (discharge).

(Ninth and Tenth Modifications)

Figure 18:
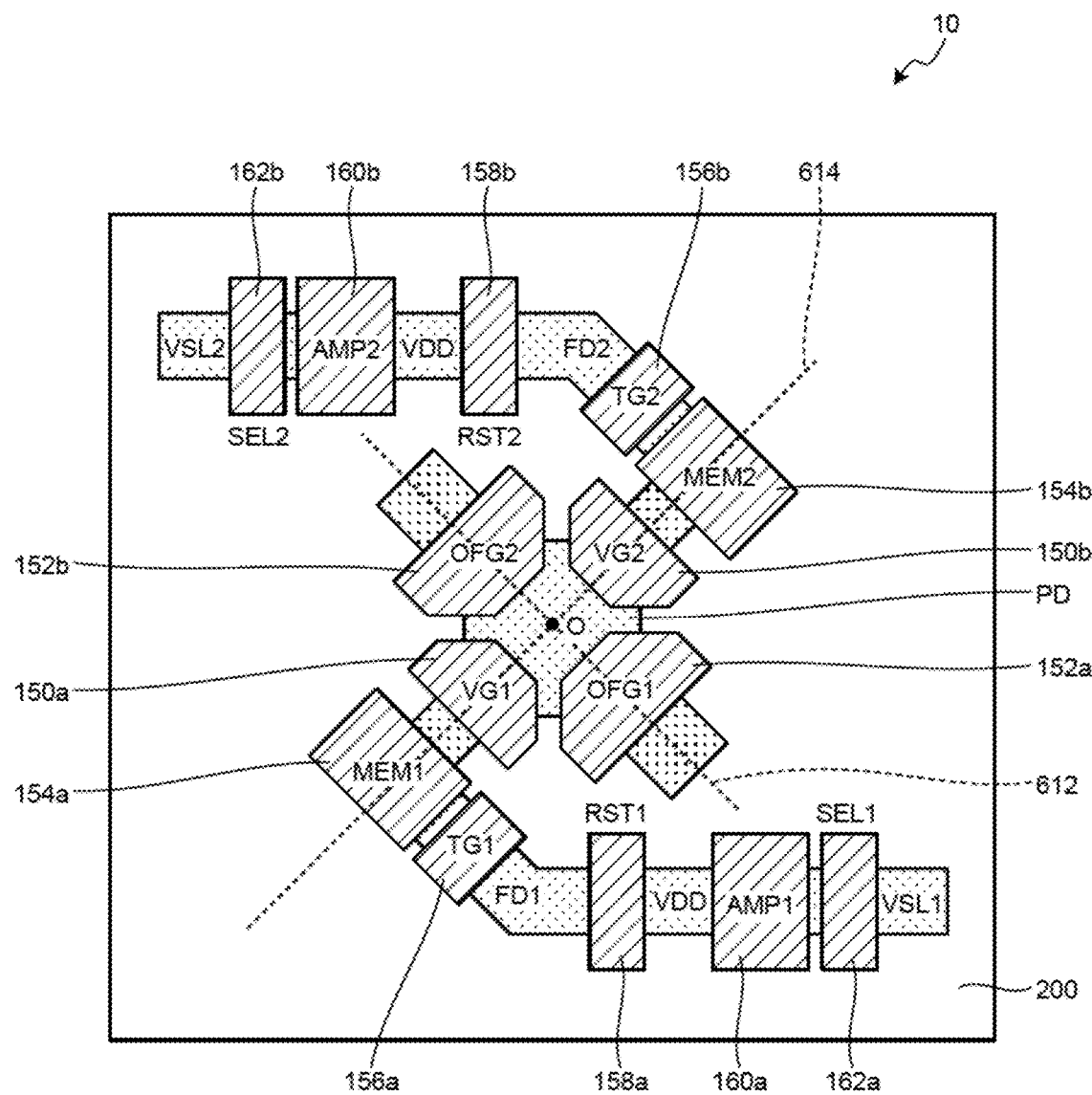
FIG. 18 is an explanatory diagram illustrating an example of a plan view configuration of the light receiving element 10 according to a ninth modification of the first embodiment of the present disclosure.
Figure 19:
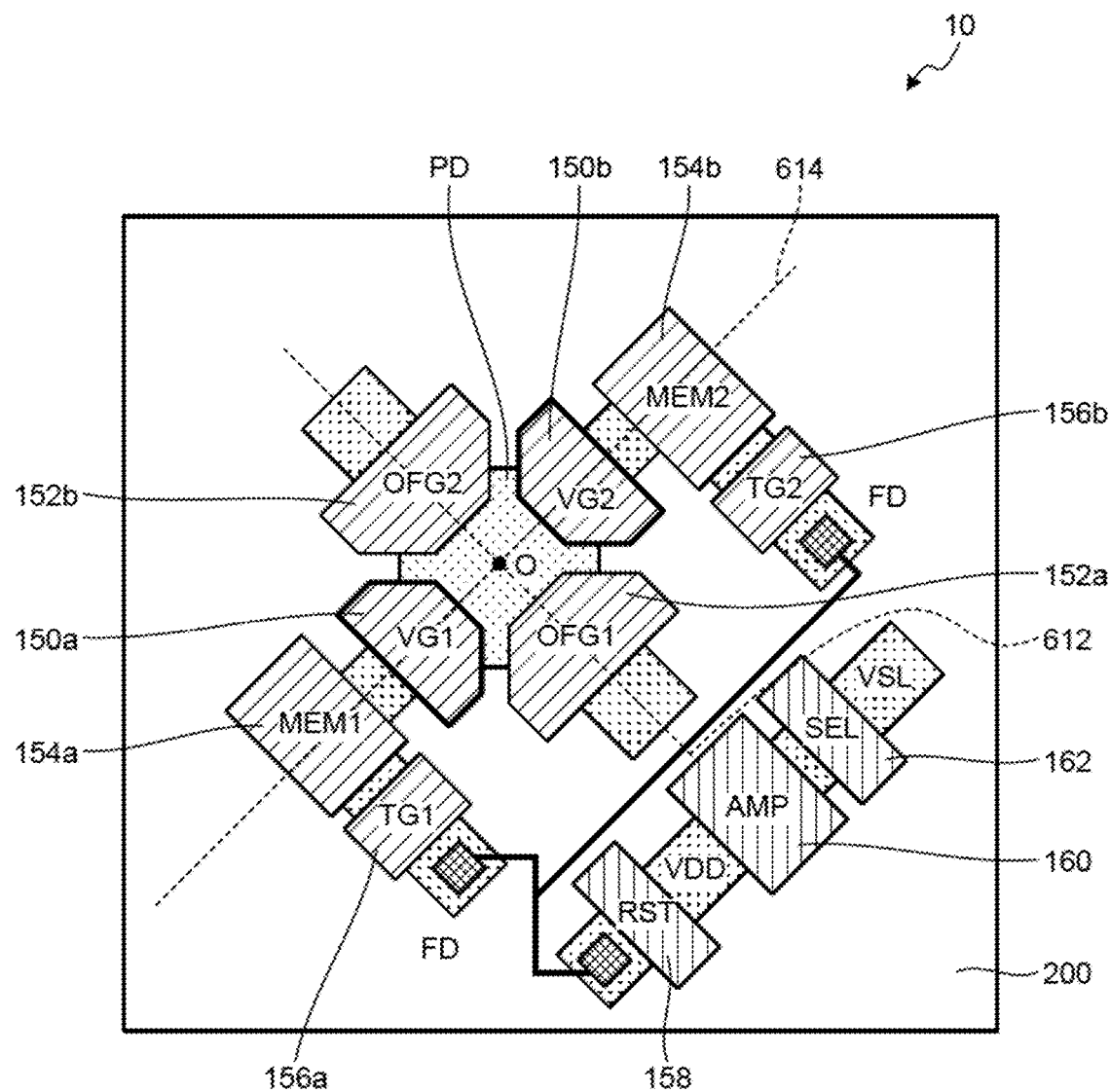
FIG. 19 is an explanatory diagram illustrating an example of a plan view configuration of the light receiving element 10 according to a tenth modification of the first embodiment of the present disclosure.

Next, ninth and tenth modifications will be described with reference to FIGS. 18 and 19. FIG. 18 is an explanatory diagram illustrating an example of a plan view configuration of the light receiving element 10 according to the ninth modification of the present embodiment, and FIG. 19 is an explanatory diagram illustrating an example of a plan view configuration of the light receiving element 10 according to the tenth modification of the present embodiment. In the present modification as well, the gate electrodes 150a and 150b of the distribution transistors VG1 and VG2 are arranged to be axially symmetric (substantially axially symmetric) with respect to the center line passing through the center point O of the photodiode PD. However, in the present ninth and tenth modifications, the center line is not the center line 600 extending through the light receiving element 10 in the up-down direction (column direction) in the drawing, as described above, but a center line (first center axis) 612 extending so as to pass through the center point (center) O of the photodiode (first photoelectric conversion unit) PD in a direction intersecting the column direction at a predetermined angle.

Specifically, in the present ninth modification, as illustrated in FIG. 18, the gate electrodes (first and second distribution gates) 150a and 150b of the distribution transistors VG1 and VG2 are provided at positions where the gate electrodes 150a and 150b are axially symmetric (substantially axially symmetric) with each other with respect to the center line (first center axis) 612. As described above, the center line 612 extends so as to pass through the center point (center) O of the photodiode (first photoelectric conversion unit) PD in the direction intersecting the light receiving element 10 at a predetermined angle with respect to the up-down direction (column direction) in FIG. 18. Note that, in the present ninth modification, the predetermined angle is not particularly limited, but can be, for example, 45 degrees or the like.

Furthermore, in the present ninth modification, as illustrated in FIG. 18, the gate electrodes 152a and 152b of the discharge transistors OFG1 and OFG2 are arranged so as to be axially symmetric (substantially axially symmetric) with respect to a center line 614 passing through the center point O of the photodiode PD and orthogonal to the center line 612.

In addition, in the present ninth modification, as illustrated in FIG. 18, the electric charge storage units MEM1 and MEM2 and the transfer transistors TG1 and TG2 are provided so as to be mirror-symmetrical with respect to the center line 612 and hold the distribution transistors VG1 and VG2 from both sides. In other words, the electric charge storage units MEM1 and MEM2 and the transfer transistors TG1 and TG2 are provided at positions where the electric charge storage units MEM1 and MEM2 and the transfer transistors TG1 and TG2 are point-symmetric (substantially point-symmetric) with respect to the center point (center) O of the photodiode PD.

According to the present modification, the gate electrodes 150a and 150b and the like of the distribution transistors VG1 and VG2 are arranged obliquely with respect to the column direction or the row direction. Therefore, it is possible to increase the degree of freedom in the layout of the light receiving elements 10 on the semiconductor substrate 200.

Furthermore, in a case of adopting the configuration in which the floating diffusion region FD, the reset transistor RST, the amplifying transistor AMP, and the selection transistor SEL are shared, the example of the plan view configuration of the light receiving element 10 of the tenth modification as illustrated in FIG. 19 can be adopted. According to the present tenth modification, it is easier to make the light receiving element 10 fine in size, due to the configuration in which the floating diffusion region FD, the reset transistor RST, the amplifying transistor AMP, and the selection transistor SEL are shared.

(Eleventh to Fourteenth Modifications)

In the embodiment and the modifications thereof described above, the respective component elements of the light receiving element 10 are provided on one semiconductor substrate 200, but in the present embodiment, the component elements are not limited to such a configuration as described above. Therefore, examples of eleventh to fourteenth modifications will be described in which the component elements of the light receiving element 10 are provided on two stacked substrates. According to the eleventh to the fourteenth modifications, it is easier to make the light receiving element 10 fine in size, due to the stacking of the two substrates.

Figure 20:
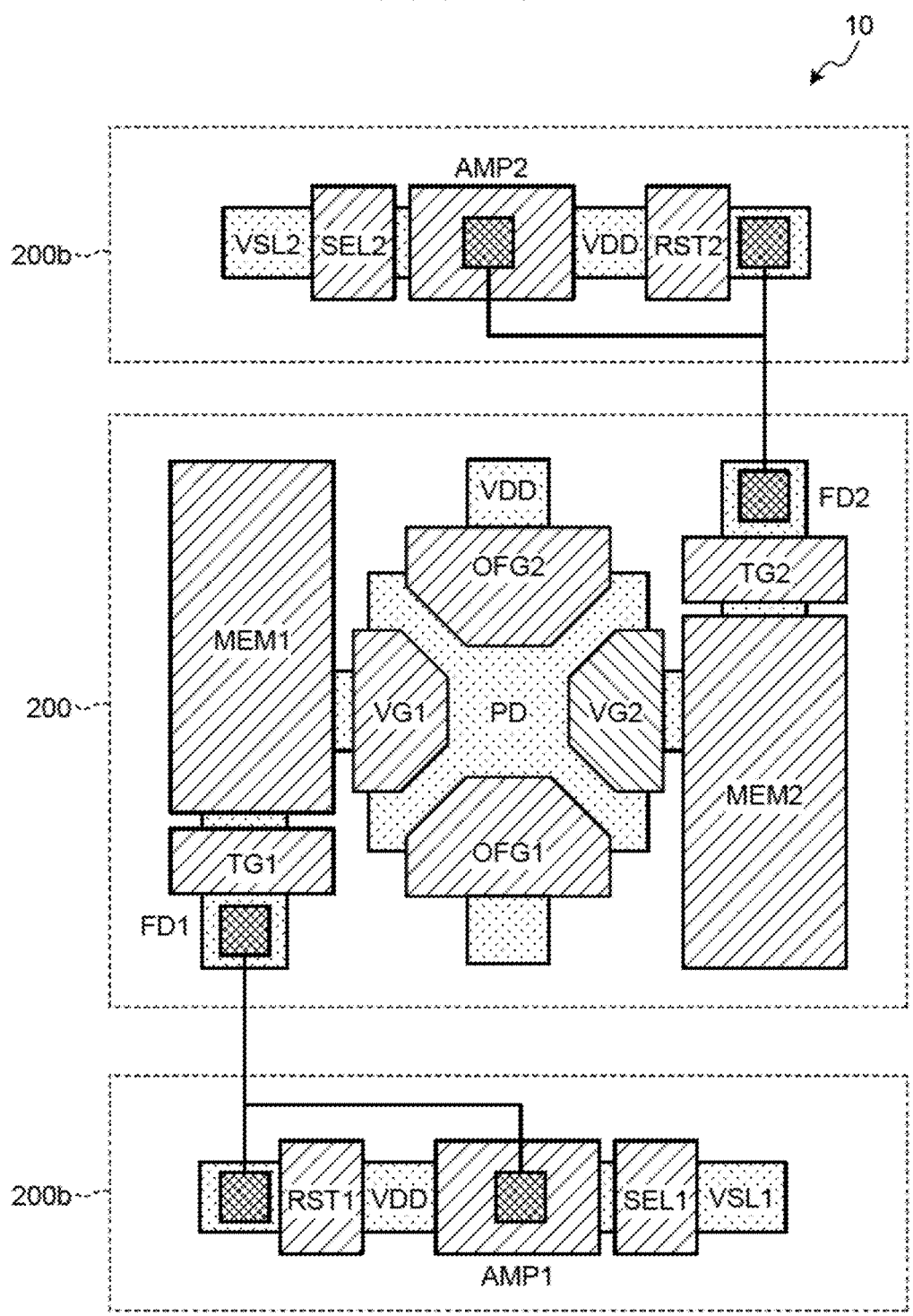
FIG. 20 is an explanatory diagram illustrating an example of a plan view configuration of the light receiving element 10 according to an eleventh modification of the first embodiment of the present disclosure.
Figure 21:
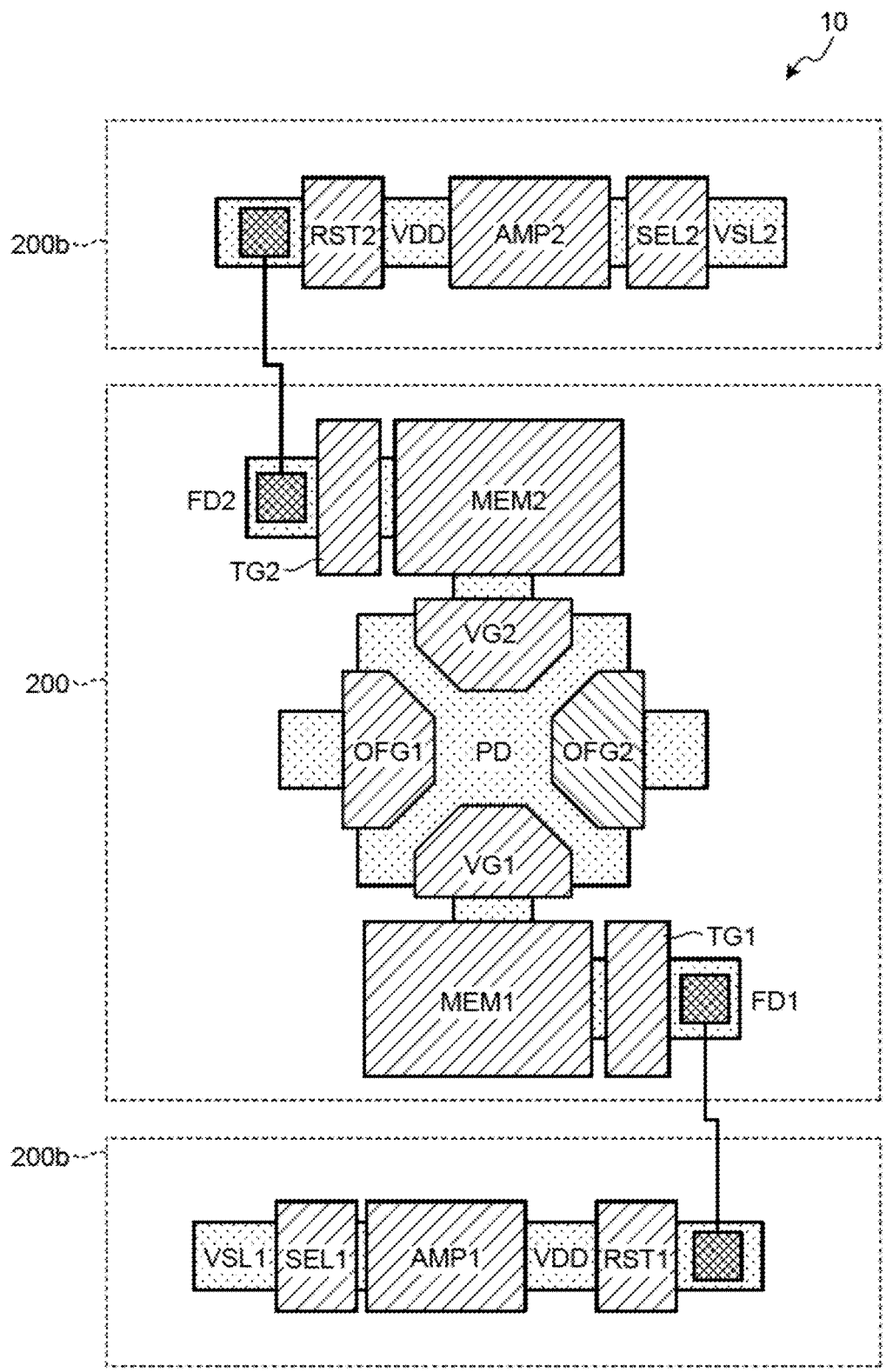
FIG. 21 is an explanatory diagram illustrating an example of a plan view configuration of the light receiving element 10 according to a twelfth modification of the first embodiment of the present disclosure.

The eleventh to the fourteenth modifications will be described below with reference to FIGS. 20 to 23. FIG. 20 is an explanatory diagram illustrating an example of a plan view configuration of the light receiving element 10 according to the eleventh modification of the present embodiment, and FIG. 21 is an explanatory diagram illustrating an example of a plan view configuration of the light receiving element 10 according to the twelfth modification of the present embodiment. Furthermore, FIG. 22 is an explanatory diagram illustrating an example of a plan view configuration of the light receiving element 10 according to the thirteenth modification of the present embodiment, and FIG. 23 is an explanatory diagram illustrating an example of a plan view configuration of the light receiving element 10 according to the fourteenth modification of the present embodiment.

First, in the eleventh modification, as illustrated in FIG. 20, the photodiode PD, the distribution transistors VG1 and VG2, the discharge transistors OFG1 and OFG2, the electric charge storage units MEM1 and MEM2, the transfer transistors TG1 and TG2, and the floating diffusion regions FD1 and FD2 are provided on the semiconductor substrate 200. Furthermore, the amplifying transistors AMP1 and AMP2, the selection transistors SEL1 and SEL2, and the reset transistors RST1 and RST2 are provided on semiconductor substrates (other semiconductor substrates) 200*b*. Note that the semiconductor substrate 200 and the semiconductor substrates 200*b* are, for example, stacked on each other, electrodes made of copper (Cu), provided on the semiconductor substrate 200 and the semiconductor substrates 200*b*, are joined, and the semiconductor substrate 200 and the semiconductor substrates 200*b* are configured to be electrically connected to each other.

Next, in the twelfth modification, as illustrated in FIG. 21, the gate electrodes 150*a* and 150*b* of the distribution transistors VG1 and VG2 are arranged in the up-down direction (column direction) in FIG. 21. According to the present twelfth modification, in a case where the pixel array unit 12 of the light receiving unit 30 of the distance measurement module 1 has a horizontally long angle of view, such as 4:3 or 16:9, it is possible to mitigate deterioration of distance measurement accuracy due to oblique light obliquely incident on the pixel array unit 12.

Figure 22:
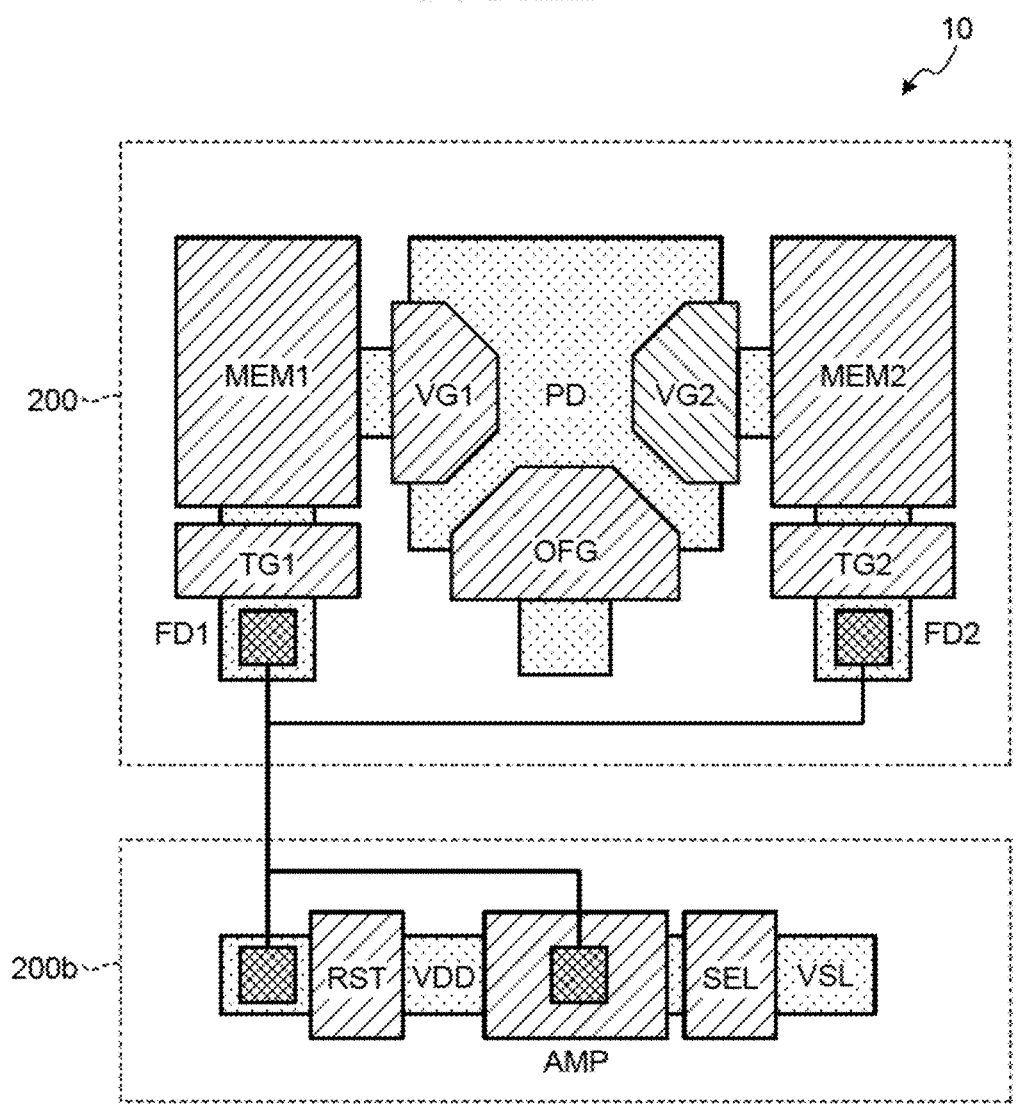
FIG. 22 is an explanatory diagram illustrating an example of a plan view configuration of the light receiving element 10 according to a thirteenth modification of the first embodiment of the present disclosure.
Figure 23:
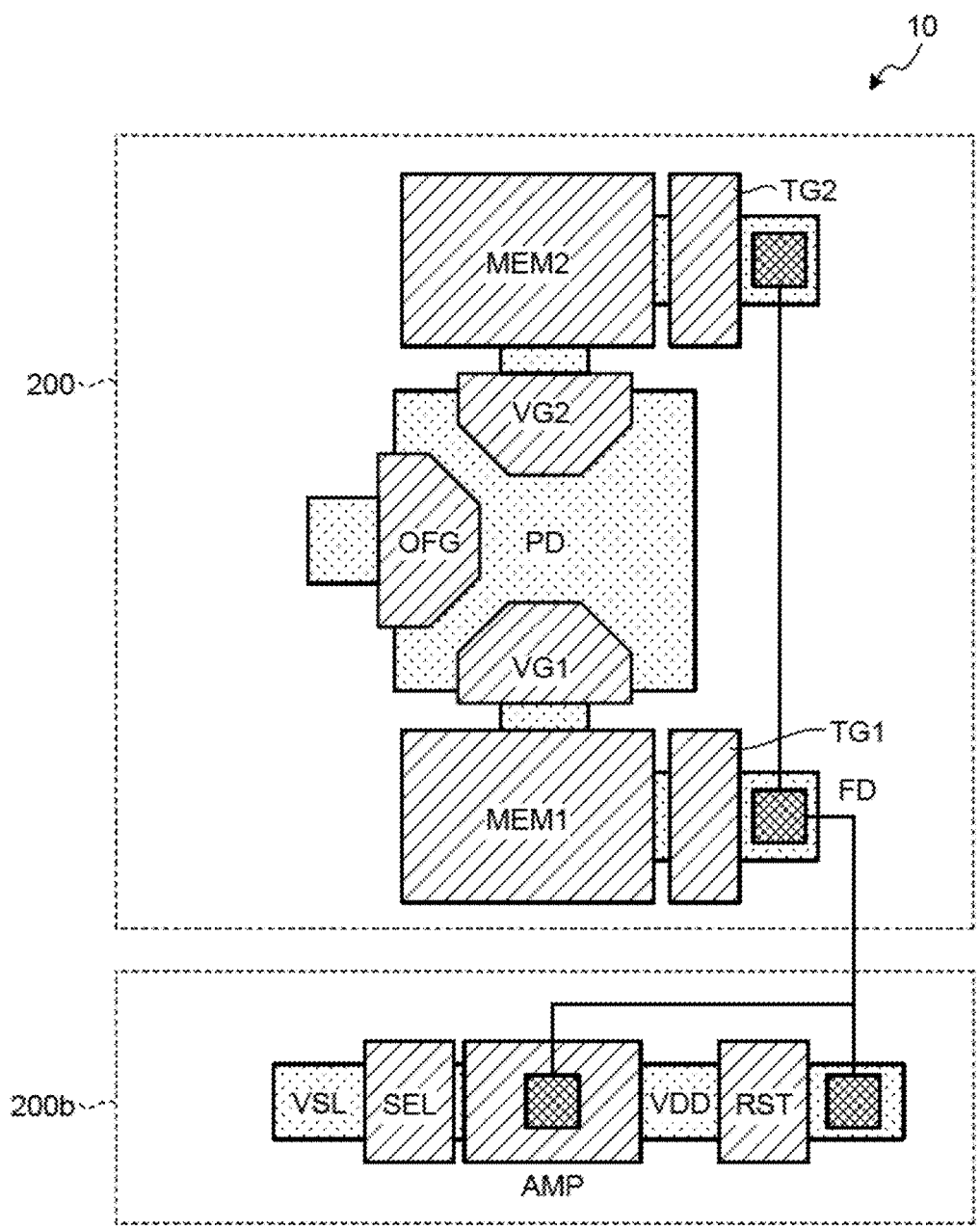
FIG. 23 is an explanatory diagram illustrating an example of a plan view configuration of the light receiving element 10 according to a fourteenth modification of the first embodiment of the present disclosure.

Next, in the thirteenth modification, as illustrated in FIG. 22, the floating diffusion region FD, the reset transistor RST, the amplifying transistor AMP, and the selection transistor SEL are shared. According to the present thirteenth modification, it is easier to make the light receiving element 10 fine in size, due to the configuration in which the floating diffusion region FD, the reset transistor RST, the amplifying transistor AMP, and the selection transistor SEL are shared.

Next, in the fourteenth modification, as illustrated in FIG. 23, the gate electrodes 150*a* and 150*b* of the distribution transistors VG1 and VG2 are arranged in the up-down direction (column direction) in FIG. 23. According to the present fourteenth modification, in a case where the pixel array unit 12 of the light receiving unit 30 of the distance measurement module 1 has a horizontally long angle of view, such as 4:3 or 16:9, it is possible to mitigate deterioration of distance measurement accuracy due to oblique light obliquely incident on the pixel array unit 12.

(Fifteenth Modification)

Furthermore, in the twelfth to fourteenth modifications described above, the amplifying transistor AMP, the selection transistor SEL, and the reset transistor RST are provided on each semiconductor substrate 200*b*, but the present embodiment is not limited to such a form. Therefore, as a fifteenth modification, an example in which the signal line (output wiring) VSL is provided on the semiconductor substrate 200*b* will be described. According to the present fifteenth modification, the signal line VSL is provided not on the semiconductor substrate 200 but on the semiconductor substrate 200*b*, increasing a degree of freedom in the design of a circuit for receiving signals transmitted by the signal line VSL.

Figure 24:
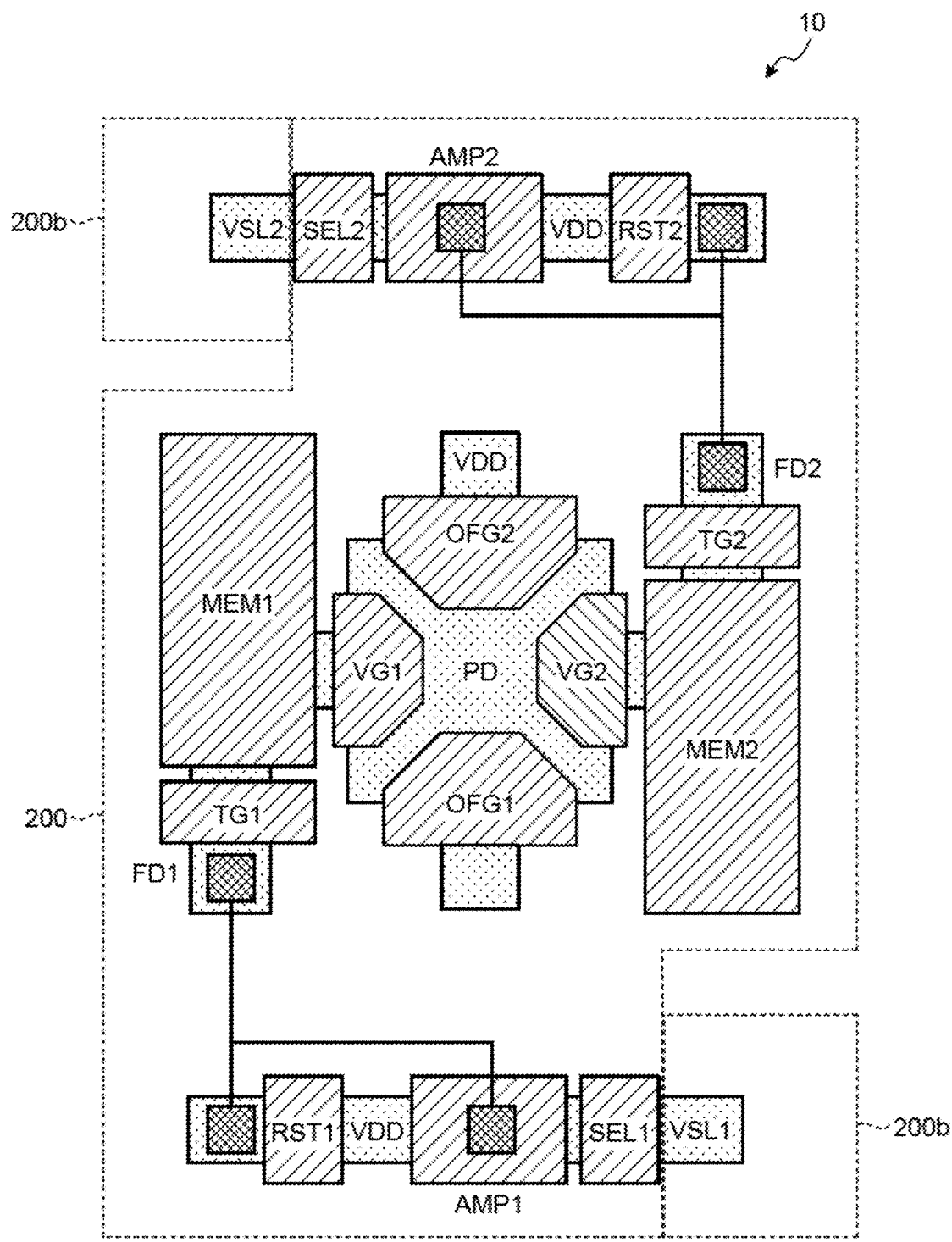
FIG. 24 is an explanatory diagram illustrating an example of a plan view configuration of the light receiving element 10 according to a fifteenth modification of the first embodiment of the present disclosure.

The fifteenth modification will be described below with reference to FIG. 24. FIG. 24 is an explanatory diagram illustrating an example of a plan view configuration of the light receiving element 10 according to the fifteenth modification of the present embodiment. In the fifteenth modification, as illustrated in FIG. 24, the photodiode PD, the distribution transistors VG1 and VG2, the discharge transistors OFG1 and OFG2, the electric charge storage units MEM1 and MEM2, the transfer transistors TG1 and TG2, and the floating diffusion regions FD1 and FD2, the amplifying transistors AMP1 and AMP2, the selection transistors SEL1 and SEL2, and the reset transistors RST1 and RST2 are provided on the semiconductor substrate 200. Furthermore, the signal lines VSL1 and VSL2 are provided on the semiconductor substrates 200*b*. According to the present fifteenth modification having such a configuration, the signal lines VSL1 and VSL2 are provided not on the semiconductor substrate 200 but on the semiconductor substrates 200*b*, and therefore, it is possible to increase the degree of freedom in the design of the circuit for receiving signals transmitted by the signal lines VSL1 and VSL2.

(Sixteenth and Seventeenth Modifications)

Figure 25:
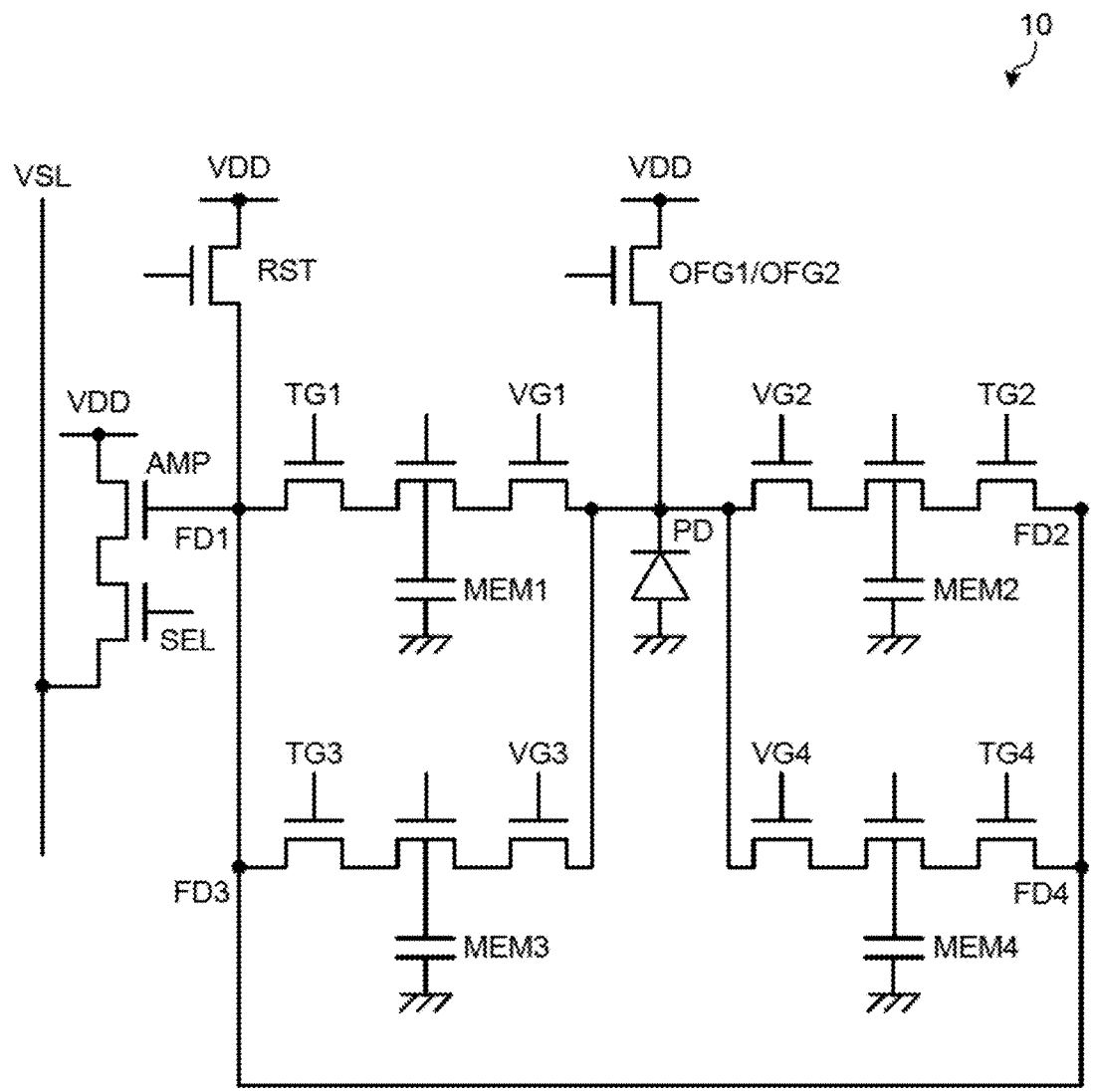
FIG. 25 is an equivalent circuit diagram illustrating the light receiving element 10 according to a sixteenth modification of the first embodiment of the present disclosure.
Figure 26:
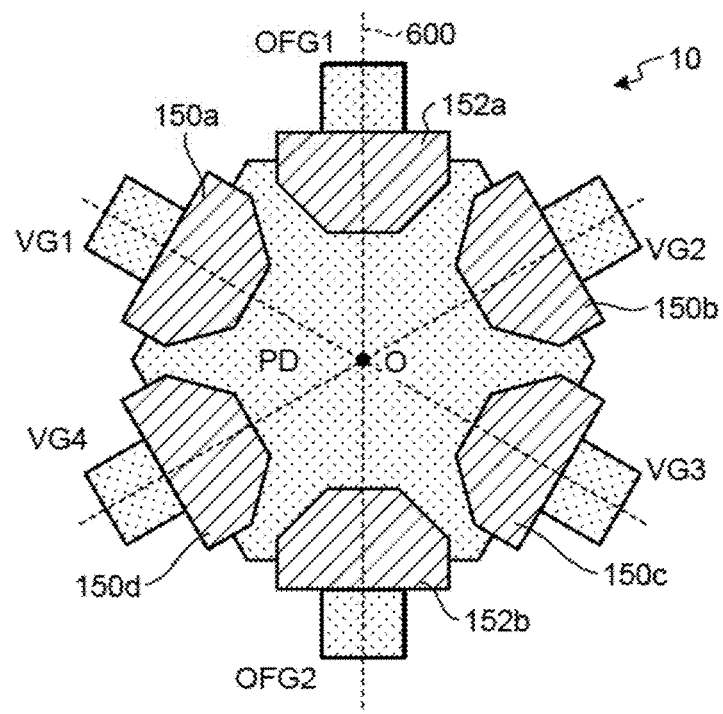
FIG. 26 is an explanatory diagram illustrating an example of a plan view configuration of the light receiving element 10 according to the sixteenth modification of the first embodiment of the present disclosure.
Figure 27:
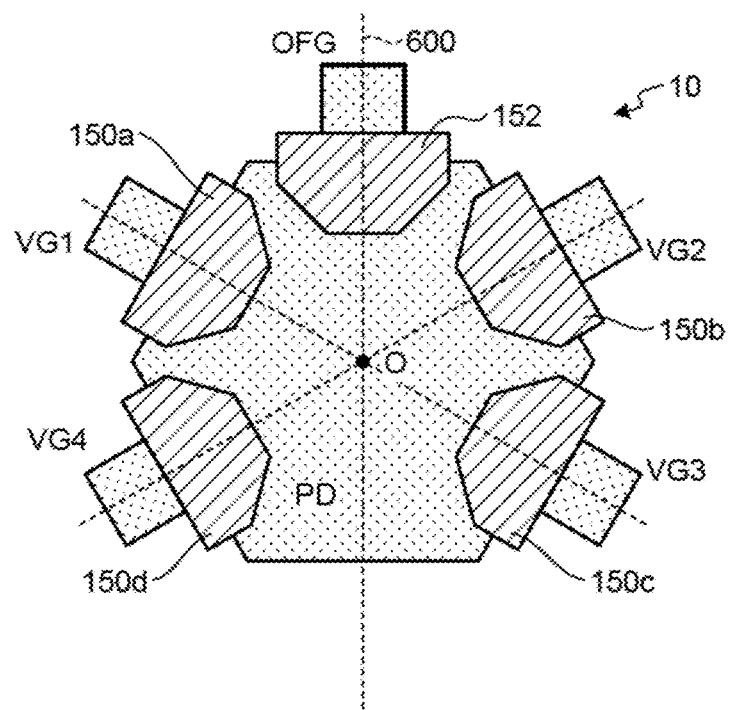
FIG. 27 is an explanatory diagram illustrating an example of a plan view configuration of the light receiving element 10 according to a seventeenth modification of the first embodiment of the present disclosure.

In the embodiment and the modifications thereof described above, the light receiving element 10 includes the two distribution transistors VG1 and VG2, but the present embodiment is not limited to the two distribution transistors VG1 and VG2. For example, the light receiving element 10 may include four distribution transistors VG1, VG2, VG3, and VG4. The sixteenth and seventeenth modifications having such a configuration will be described below with reference to FIGS. 25 to 27. FIG. 25 is an equivalent circuit diagram of the light receiving element 10 according to the sixteenth modification of the present embodiment. FIG. 26 is an explanatory diagram illustrating an example of a plan view configuration of the light receiving element 10 according to the sixteenth modification of the present embodiment, and FIG. 27 is an explanatory diagram illustrating an example of a plan view configuration of the light receiving element 10 according to the seventeenth modification of the present embodiment. Note that, in FIGS. 26 and 27, only the photodiode PD, the distribution transistors VG1, VG2, VG3, and VG4, and the discharge transistors OFG1 and OFG2 (or OFG) are illustrated for ease of understanding.

As illustrated in FIG. 25, the light receiving element 10 of the sixteenth modification includes four combinations of the distribution transistor VG, the electric charge storage unit MEM, the transfer transistor TG, and the floating diffusion region FD. Furthermore, in the light receiving element 10 of the sixteenth modification, one reset transistor RST, one amplifying transistor AMP, and one selection transistor SEL are provided. According to the present sixteenth modification, the provision of the four distribution transistors VG1, VG2, VG3, and VG4 makes it possible to expand a distance measurement range.

The light receiving element 10 of the present sixteenth modification having such a configuration can adopt the plan view configuration as illustrated in FIG. 26. In the present sixteenth modification as well, the gate electrodes 150a, 150b, 150c, and 150d of the distribution transistors VG1, VG2, VG3, and VG4 are arranged so as to be axially symmetric (substantially axially symmetric) with respect to the center line 600 passing through the center point O of the photodiode PD and extending through the light receiving element 10 in the up-down direction (column direction). More specifically, in the present sixteenth modification, as illustrated in FIG. 26, the gate electrodes 150a and 150c of the distribution transistors VG1 and VG3 face each other across the center point O of the photodiode PD, and the gate electrodes 150b and 150d of the distribution transistors VG2 and VG4 face each other across the center point O of the photodiode PD. In the present sixteenth modification as well, since the gate electrodes 150a, 150b, 150c, and 150d of the distribution transistors VG1, VG2, VG3, and VG4 are arranged to be axially symmetric with respect to the center line 600, the performance of distributing the electric charges becomes substantially equal between the distribution transistors VG1, VG2, VG3, and VG4.

Furthermore, in a case where one discharge transistor OFG is employed, the example of the plan view configuration of the light receiving element 10 of the seventeenth modification as illustrated in FIG. 27 can be adopted. According to the present seventeenth modification, use of one discharge transistor OFG makes it possible to make the light receiving element 10 finer in size.

(Eighteenth Modification)

Figure 28:
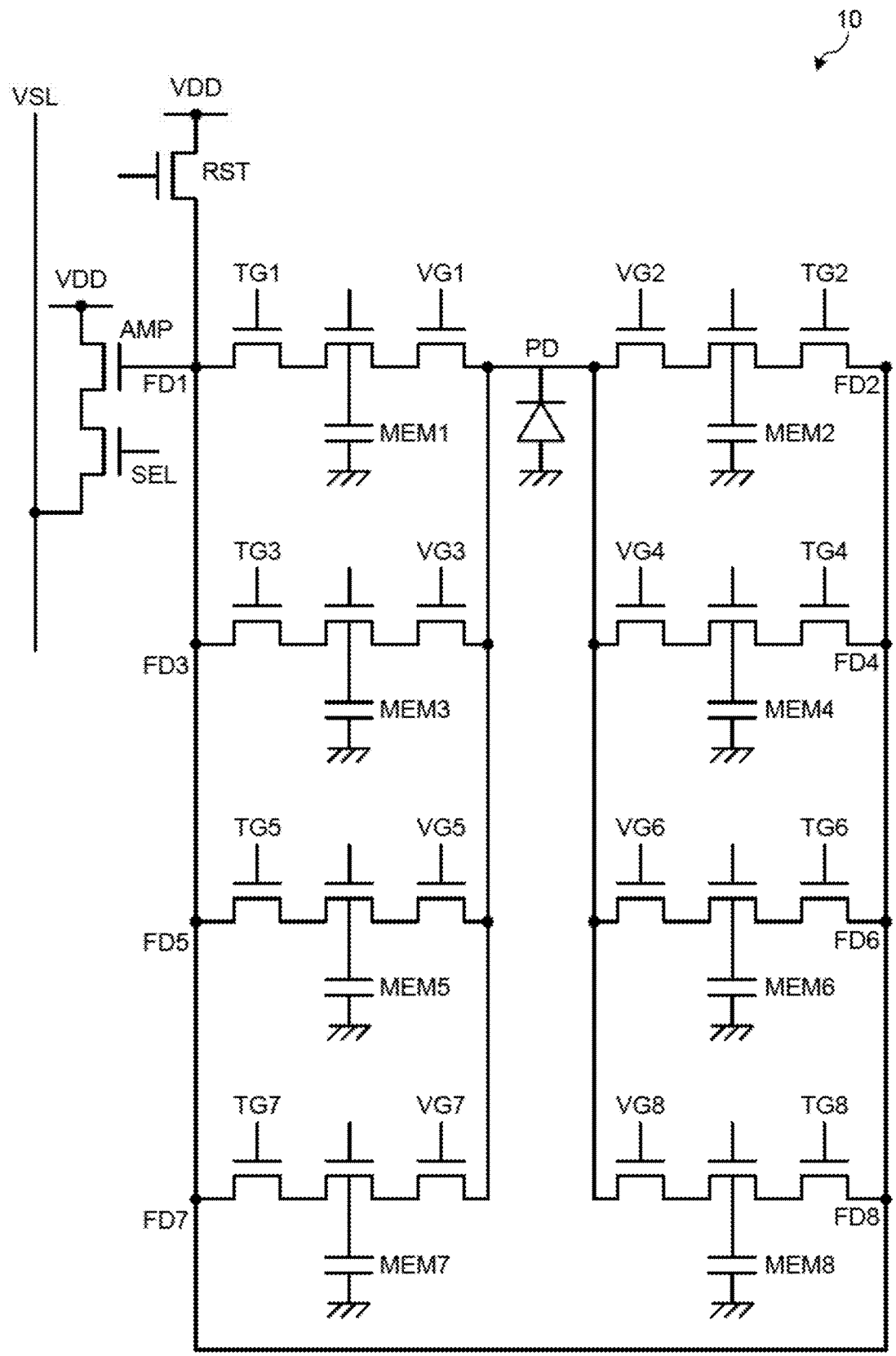
FIG. 28 is an equivalent circuit diagram illustrating the light receiving element 10 according to an eighteenth modification of the first embodiment of the present disclosure.
Figure 29:
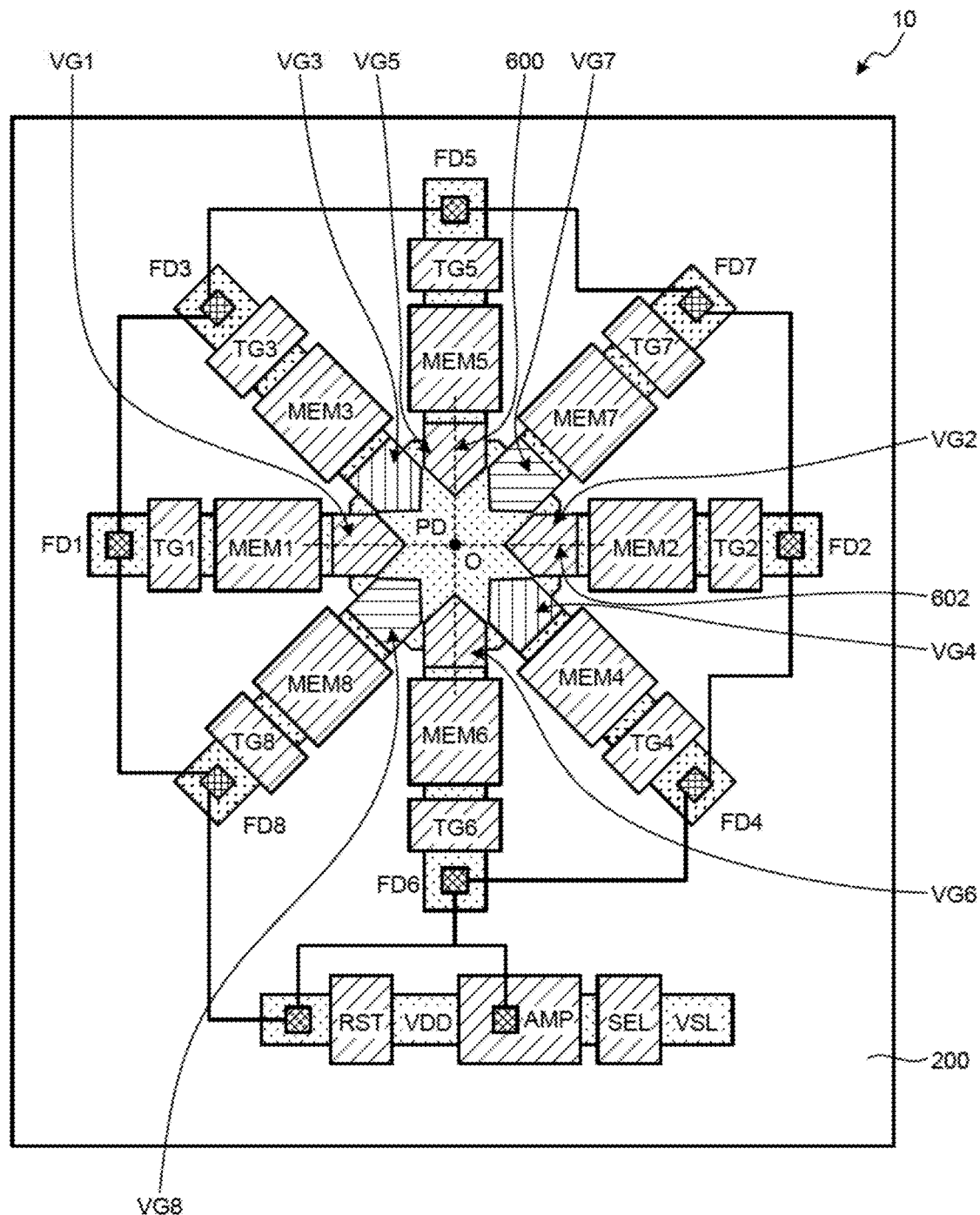
FIG. 29 is an explanatory diagram illustrating an example of a plan view configuration of the light receiving element 10 according to the eighteenth modification of the first embodiment of the present disclosure.

Furthermore, in the present embodiment, the light receiving element 10 may include eight distribution transistors VG1 to VG8. An eighteenth modification having such a configuration will be described below with reference to FIGS. 28 and 29. FIG. 28 is an equivalent circuit diagram of the light receiving element 10 according to the eighteenth modification of the present embodiment, and FIG. 29 is an explanatory diagram illustrating an example of a plan view configuration of the light receiving element 10 according to the eighteenth modification of the present embodiment. According to the present modification, the provision of the eight distribution transistors VG1 to VG8 makes it possible to expand the distance measuring range.

As illustrated in FIG. 28, the light receiving element 10 of the eighteenth modification includes eight combinations of the distribution transistor VG, the electric charge storage unit MEM, the transfer transistor TG, and the floating diffusion region FD. Furthermore, in the light receiving element 10 of the eighteenth modification, one reset transistor RST, one amplifying transistor AMP, and one selection transistor SEL are provided.

The light receiving element 10 of the present eighteenth modification having such a configuration can adopt the plan view configuration as illustrated in FIG. 29. In the present eighteenth modification as well, the gate electrodes 150 of the distribution transistors VG1 to VG8 are arranged so as to be axially symmetric (substantially axially symmetric) with respect to the center line 600 passing through the center point O of the photodiode PD and extending through the light receiving element 10 in the up-down direction (column direction). Furthermore, the gate electrodes 150 of the distribution transistors VG1 to VG8 are arranged so as to be axially symmetric (substantially axially symmetric) with respect to the center line 602 passing through the center point O of the photodiode PD and extending through the light receiving element 10 in the left-right direction (row direction).

The light receiving element 10 according to the present eighteenth modification is preferably operated as follows. Note that, in the following description, the pixel array unit 12 of the light receiving unit 30 of the distance measurement module 1 is divided into four regions, and each region is referred to as a first quadrant, a second quadrant, a third quadrant, and a fourth quadrant, according to position.

Specifically, as described above, the pixel array unit 12 of the light receiving unit 30 of the distance measurement module 1 includes the plurality of light receiving elements 10 that is two-dimensionally arranged in a matrix form in the row and column directions. When light enters a center region of the pixel array unit 12 having such a configuration, the incident angle of the light is substantially 0 degrees, and the electric charges generated in the photodiode PD by the light can be readily distributed to the electric charge storage units MEM1 and MEM2 by the distribution transistors VG1 and VG2, into a substantially similar state. However, when light enters a region other than the center region of the pixel array unit 12 having such a configuration, the light is obliquely incident. Therefore, it is difficult to distribute electric charges generated in the photodiode PD by the light to the electric charge storage units MEM1 and MEM2 by the distribution transistors VG1 and VG2, into the substantially similar state. Thus, it becomes difficult for the distance measurement module 1 to ensure high distance measurement accuracy.

Thus, for example, in the present eighteenth modification, the distribution transistors VG1, VG8, and VG6 are used in the first quadrant of the pixel array unit 12. Therefore, the electric charges generated in the photodiodes PD are allowed to be distributed into substantially the similar state, mitigating the deterioration of the distance measurement accuracy due to the oblique light obliquely incident as described above. Furthermore, in the present eighteenth modification, as in the above description, the distribution transistors VG6, VG4, and VG2 are used in the second quadrant of the pixel array unit 12. Therefore, the electric charges generated in the photodiodes PD are allowed to be distributed into substantially the similar state, mitigating the deterioration of the distance measurement accuracy due to the oblique light obliquely incident as described above.

Note that, in the present eighteenth modification, when the oblique light obliquely incident has a slight influence, the distribution transistors VG1 and VG2 may be used to distribute the electric charges generated in the photodiode PD, and the distribution transistor VG5 may be used to discharge the electric charges. In the present eighteenth modification, a large number of distribution transistors VG are used. Therefore, it is preferable to use the distribution transistor VG positioned at a suitable position, for each region of the pixel array unit 12.

(Nineteenth to Twenty-Second Modifications)

Figure 30:
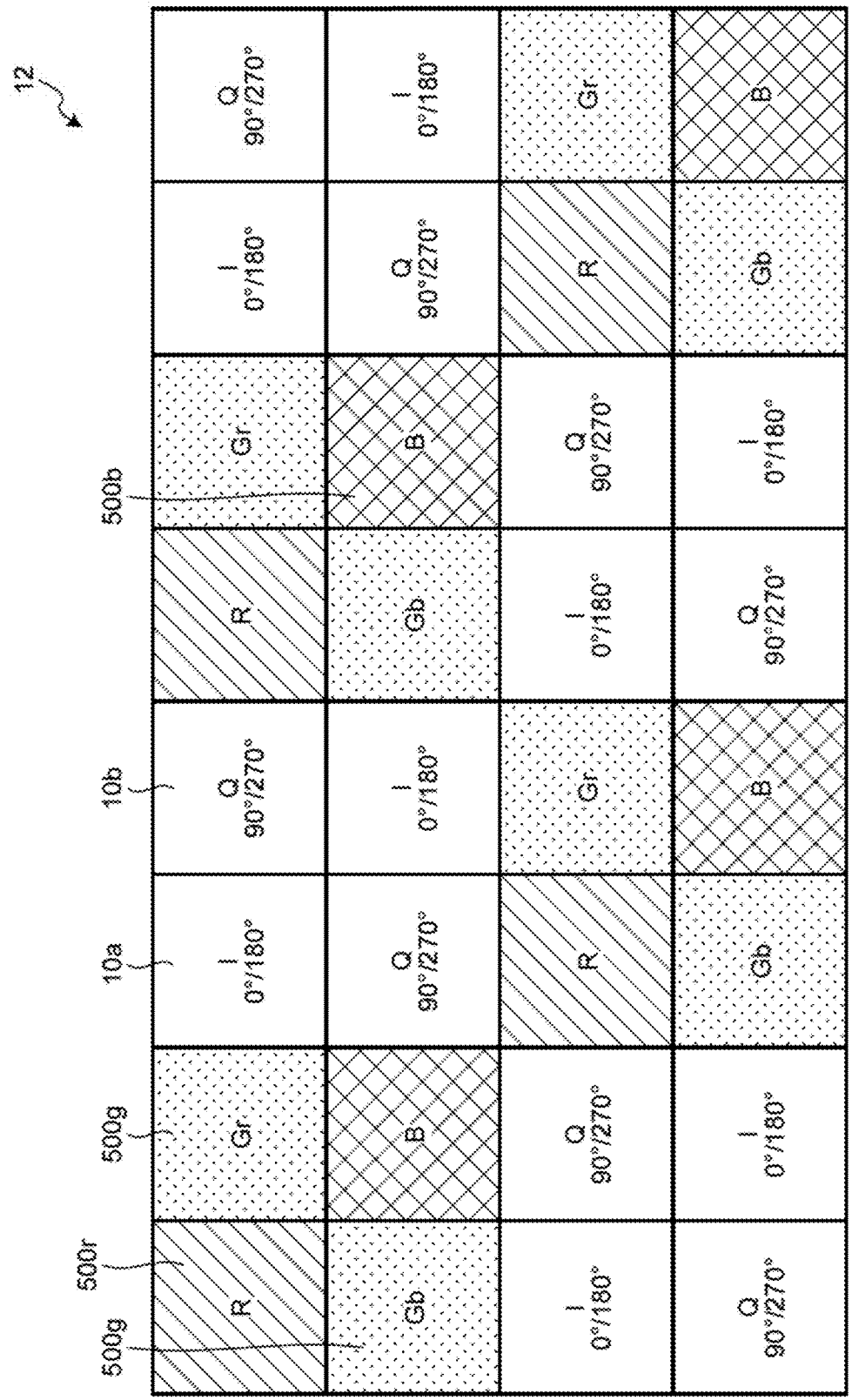
FIG. 30 is an explanatory diagram illustrating an example of a plan view configuration of a pixel array unit 12 according to a nineteenth modification of the first embodiment of the present disclosure.
Figure 31:
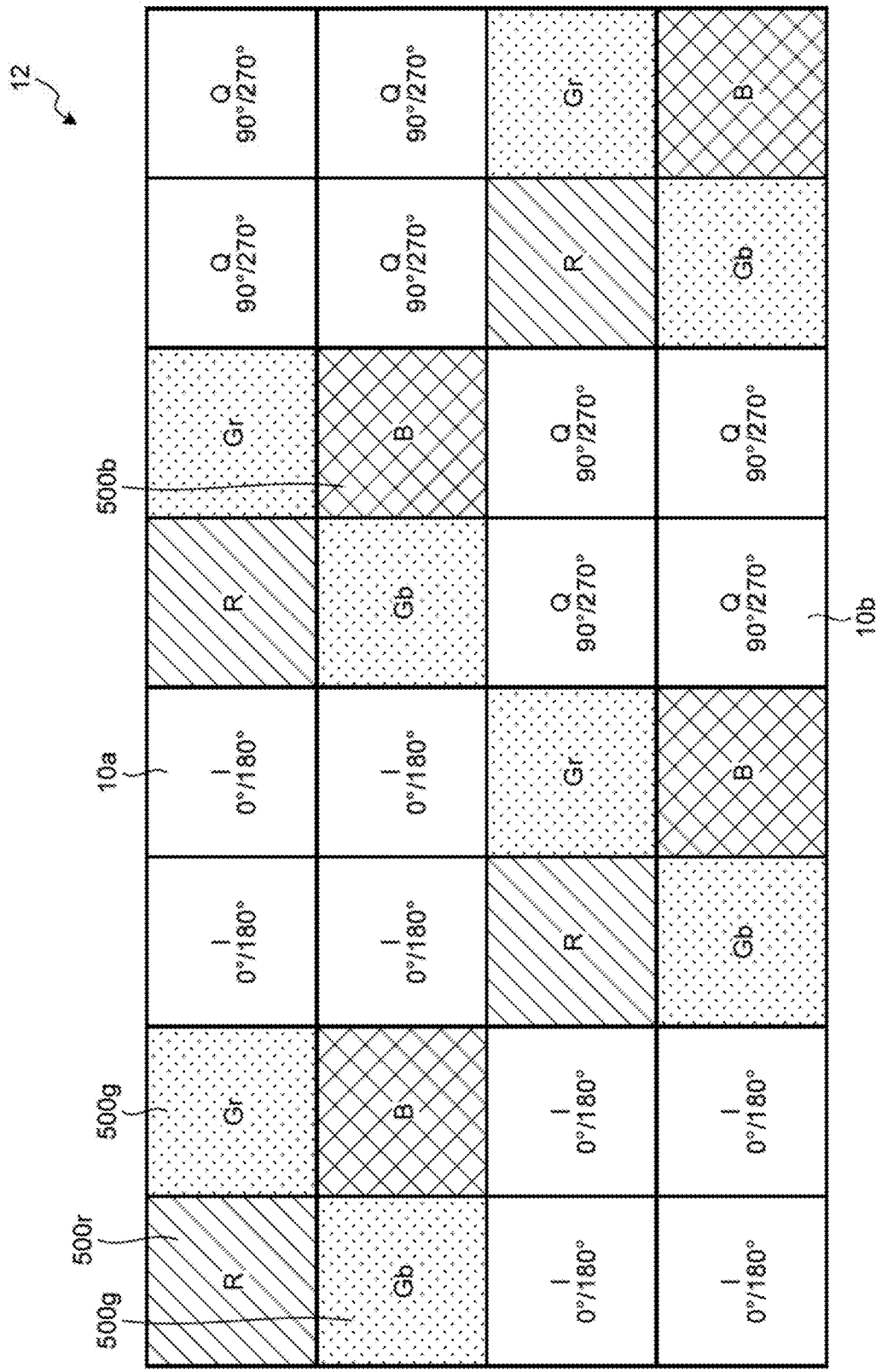
FIG. 31 is an explanatory diagram illustrating an example of a plan view configuration of the pixel array unit 12 according to a twentieth modification of the first embodiment of the present disclosure.

Furthermore, in the present embodiment, the pixel array unit 12 of the light receiving unit 30 of the distance measurement module 1 may include not only the plurality of light receiving elements 10 but also a plurality of imaging elements. In this way, the distance measurement module 1 is configured not only to measure the distance but also to acquire an image (color information) of the target 800. Nineteenth to twenty-second modifications having such a configuration will be described below with reference to FIGS. 30 to 33. FIG. 30 is an explanatory diagram illustrating an example of a plan view configuration of the pixel array unit 12 according to the nineteenth modification of the present embodiment, and FIG. 31 is an explanatory diagram illustrating an example of a plan view configuration of the pixel array unit 12 according to the twentieth modification of the present embodiment. Furthermore, FIG. 32 is an explanatory diagram illustrating an example of a plan view configuration of the pixel array unit 12 according to the twenty-first modification of the present embodiment, and FIG. 33 is an explanatory diagram illustrating an example of a plan view configuration of the pixel array unit 12 according to the twenty-second modification of the present embodiment.

First, in the pixel array unit 12 of the nineteenth modification, as illustrated in FIG. 30, not only the plurality of light receiving elements 10 but also a plurality of imaging elements 500 is provided on the semiconductor substrate 200. Each of the imaging elements 500 mainly includes a photodiode (second photoelectric conversion unit) (not illustrated) that converts light into electric charges, a floating diffusion region (second floating diffusion region) (not illustrated) to which the electric charges are transferred from the photodiode, and a gate (third transfer gate) (not illustrated) of a transfer transistor that transfers the electric charges from the photodiode to the floating diffusion region. Furthermore, as illustrated in FIG. 30, the plurality of imaging elements 500 includes an imaging element (second imaging element) 500b that detects blue light, an imaging element (third imaging element) 500g that detects green light, and an imaging element (first imaging element) 500r that detects red light, and these imaging elements 500b, 500g, and 500r are arranged in, for example, a Bayer array. In FIG. 30, a light receiving element 10a that operates with a phase delay of 0° and 180° with respect to the illumination light is indicated as I (0°/180°), and a light receiving element 10b that operates with a phase delay of 90° and 270° with respect to the illumination light is indicated as Q (90°/270°). According to the present nineteenth modification, arrangement of the imaging elements 500 that acquire RGB signals of color information, adjacent to the light receiving elements 10 that performs distance measurement, on the same plane makes it possible to perform imaging as well, in addition to distance measurement.

Furthermore, in the twentieth modification, as illustrated in FIG. 31, for the imaging elements 500b, 500g, and 500r arranged in 2×2, four light receiving elements 10a (I (0°/180°)) are arranged in 2×2, and four light receiving elements 10b (Q (90°/270°)) are arranged in 2×2. According to the present twentieth modification, such an arrangement makes layout simple, and the pixel array unit 12 can be readily manufactured.

Figure 32:
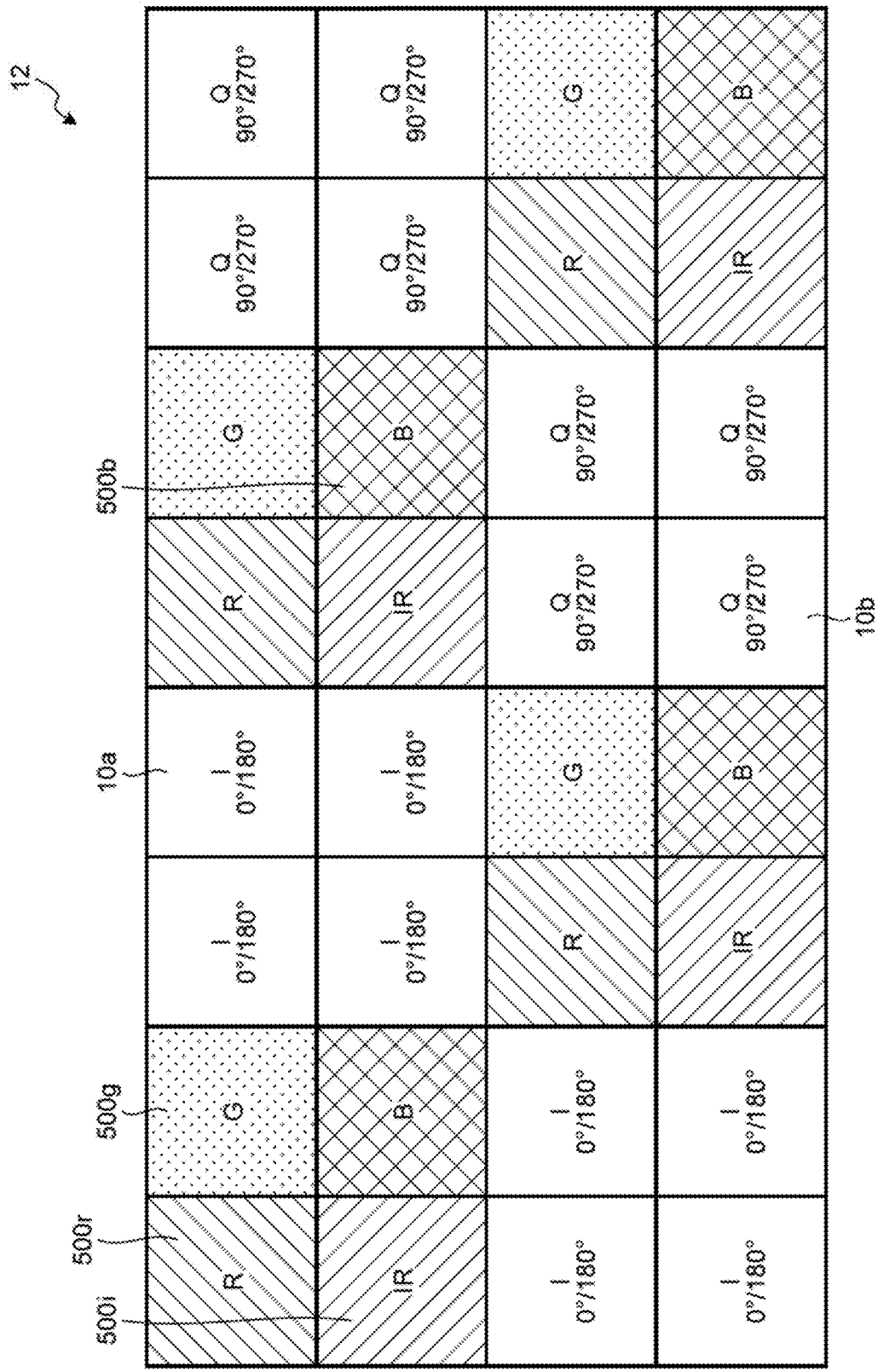
FIG. 32 is an explanatory diagram illustrating an example of a plan view configuration of the pixel array unit 12 according to a twenty-first modification of the first embodiment of the present disclosure.
Figure 33:
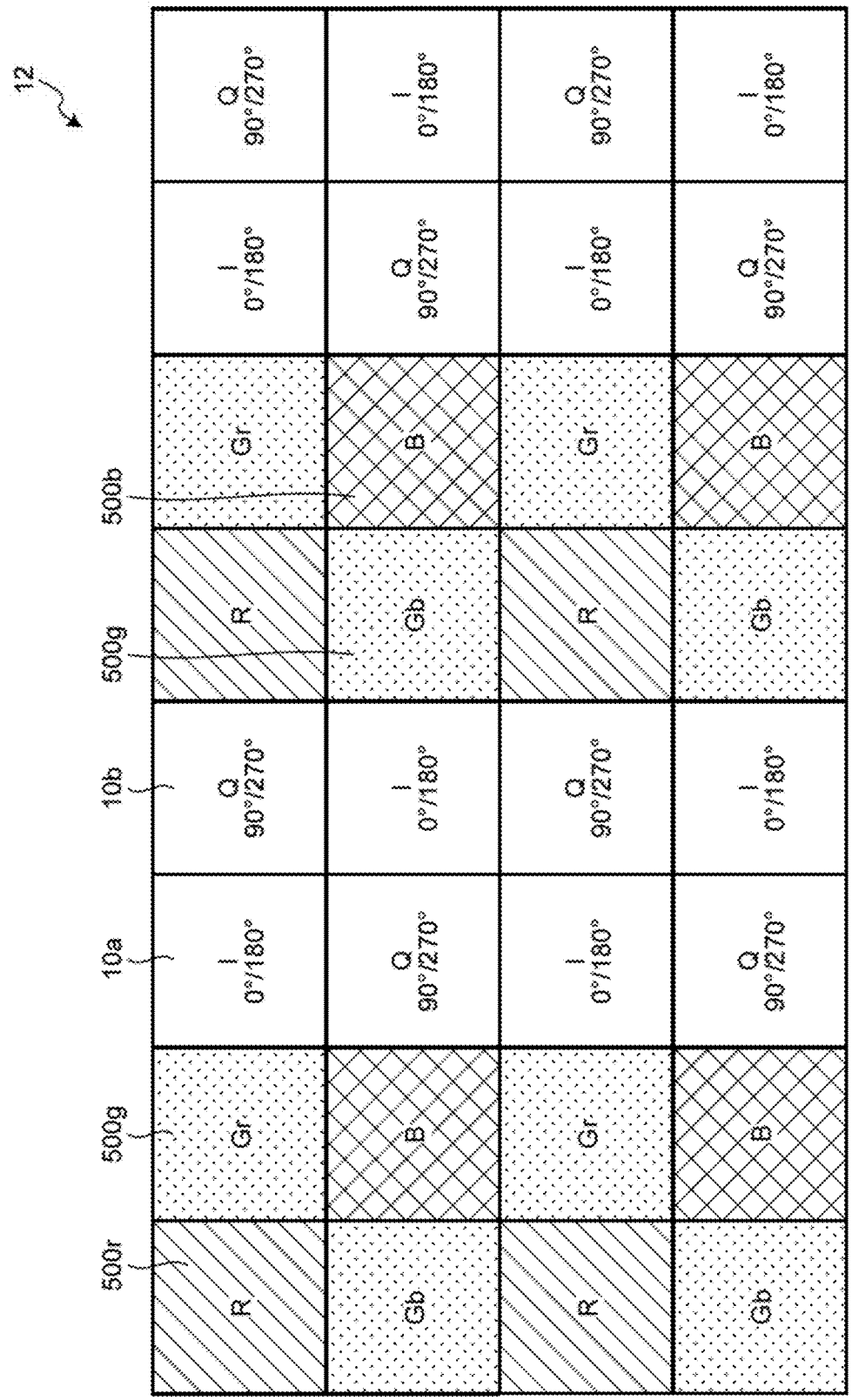
FIG. 33 is an explanatory diagram illustrating an example of a plan view configuration of the pixel array unit 12 according to a twenty-second modification of the first embodiment of the present disclosure.

Furthermore, in the twenty-first modification, the plurality of imaging elements 500 further includes an imaging element (fourth imaging element) 500i that detects near infrared rays (IR), as illustrated in FIG. 32. Note that, in the present modification, the imaging elements 500b, 500g, and 500r are not arranged in such a Bayer array as described above, but one of the imaging elements 500g in the Bayer array is replaced with the imaging element 500i. According to the present twenty-first modification, this configuration makes it possible to acquire a near-infrared signal in addition to the RGB signals of the color information, and thus, an image of the target 800 can be acquired, for example, even in a dark environment. Note that, in the present modification, the wavelength sensitivities of the imaging element 500i and the light receiving elements 10a and 10b may be the same or different.

Furthermore, in the twenty-second modification, as illustrated in FIG. 33, the plurality of light receiving elements 10a and 10b and the plurality of imaging elements 500b, 500g, and 500r are arranged in columns. In the present twenty-second modification, such an arrangement reduces spatial resolution but makes the layout simple. Therefore, wiring design is facilitated, and the pixel array unit 12 can be readily manufactured.

(Twenty-Third to Twenty-Eighth Modifications)

Figure 34:
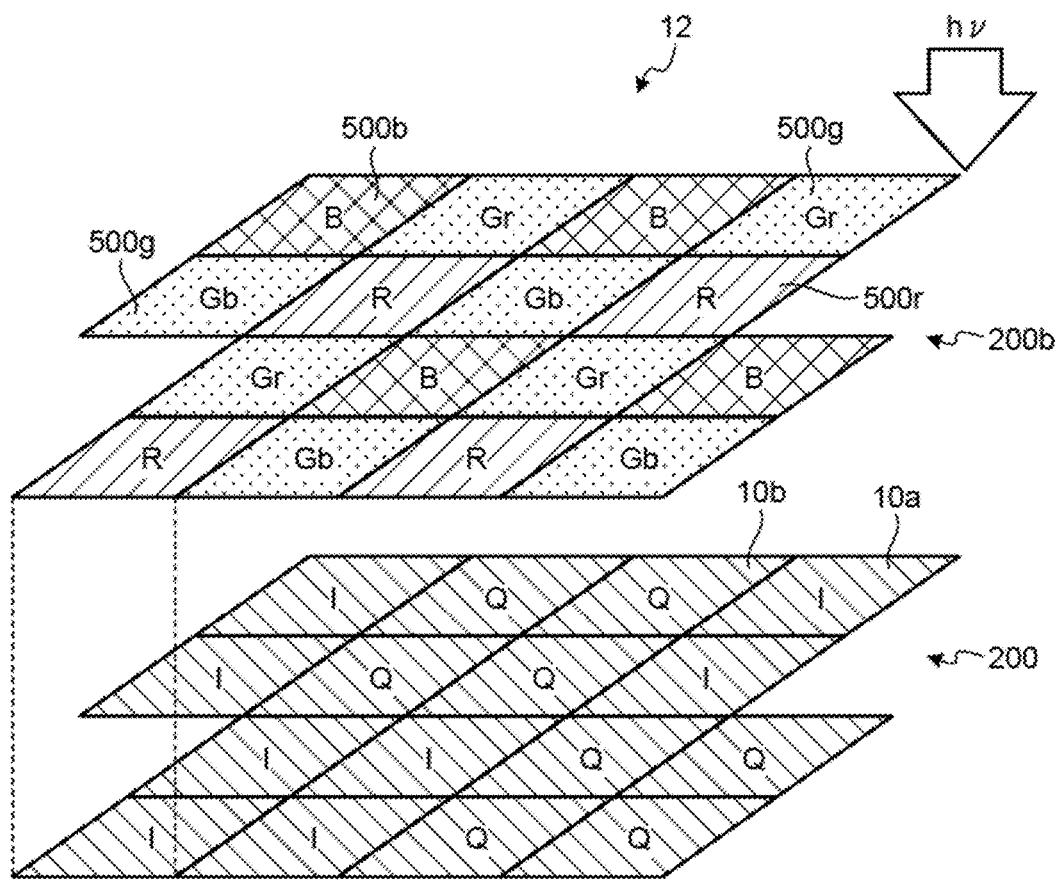
FIG. 34 is an explanatory diagram illustrating an example of a plan view configuration of the pixel array unit 12 according to a twenty-third modification of the first embodiment of the present disclosure.
Figure 35:
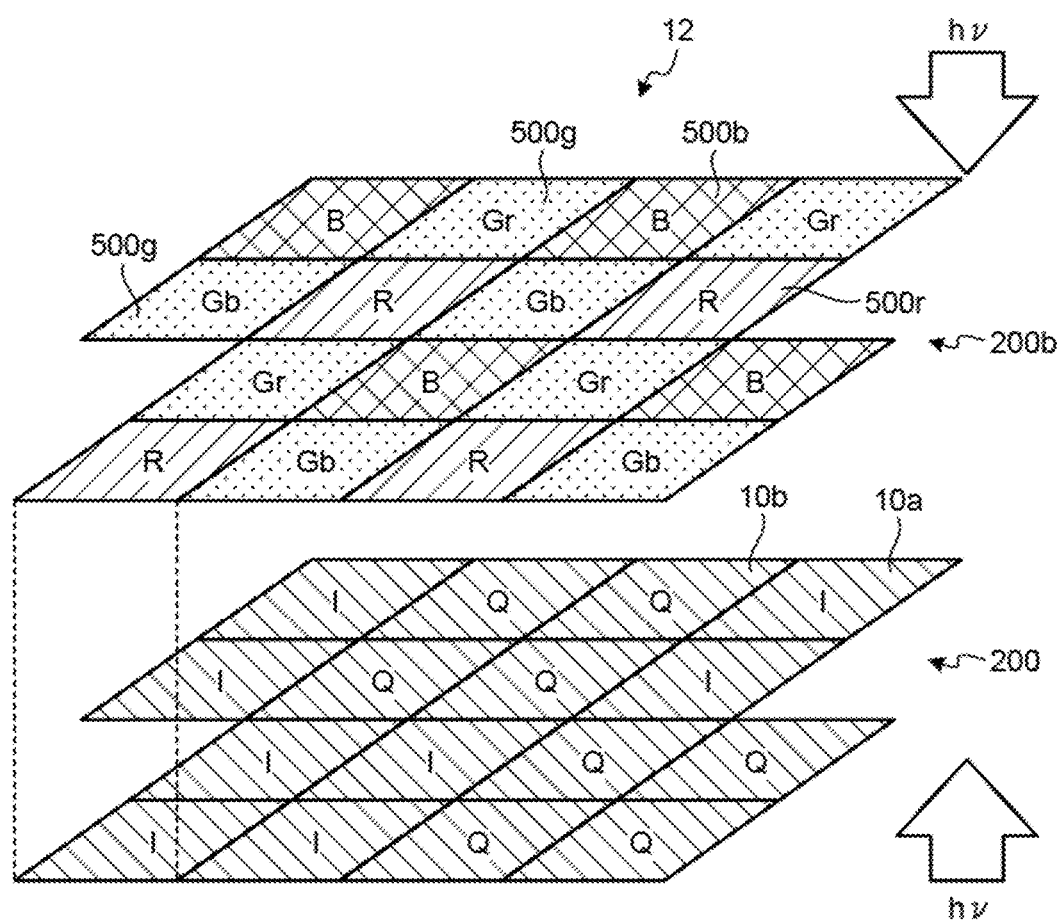
FIG. 35 is an explanatory diagram illustrating an example of a plan view configuration of the pixel array unit 12 according to a twenty-fourth modification of the first embodiment of the present disclosure.
Figure 36:
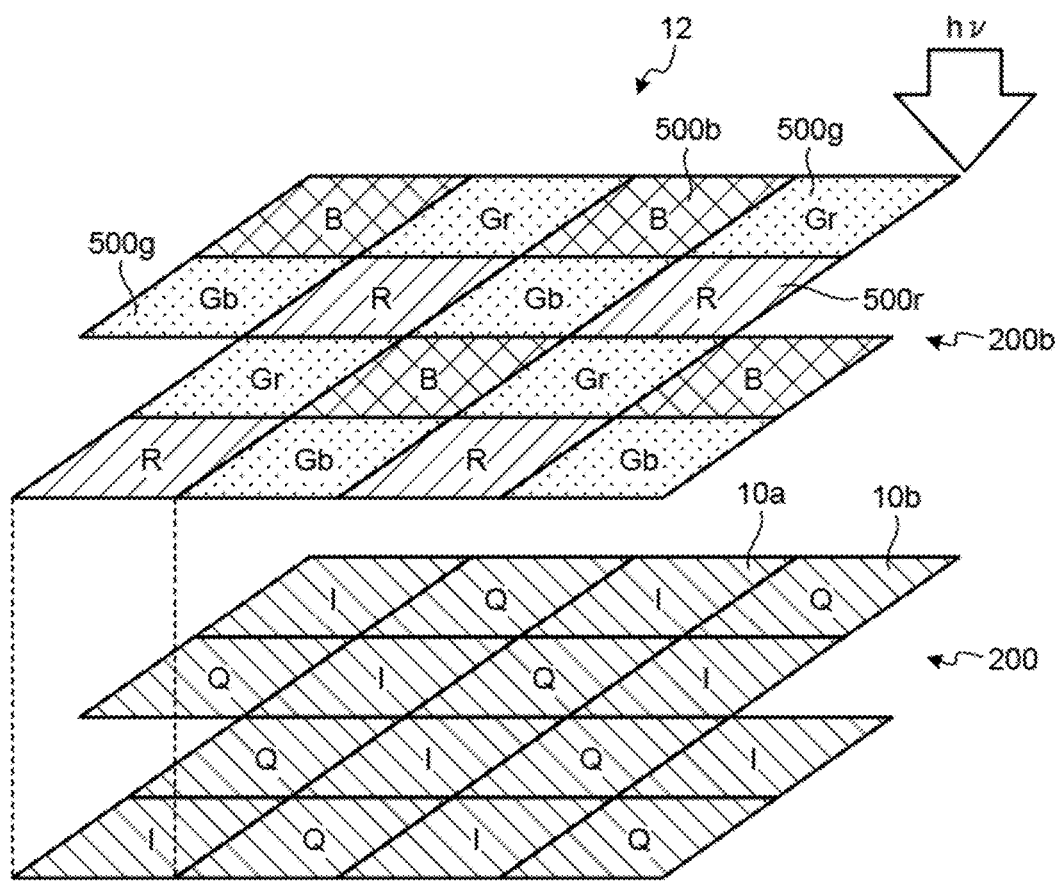
FIG. 36 is an explanatory diagram illustrating an example of a plan view configuration of the pixel array unit 12 according to a twenty-fifth modification of the first embodiment of the present disclosure.
Figure 37:
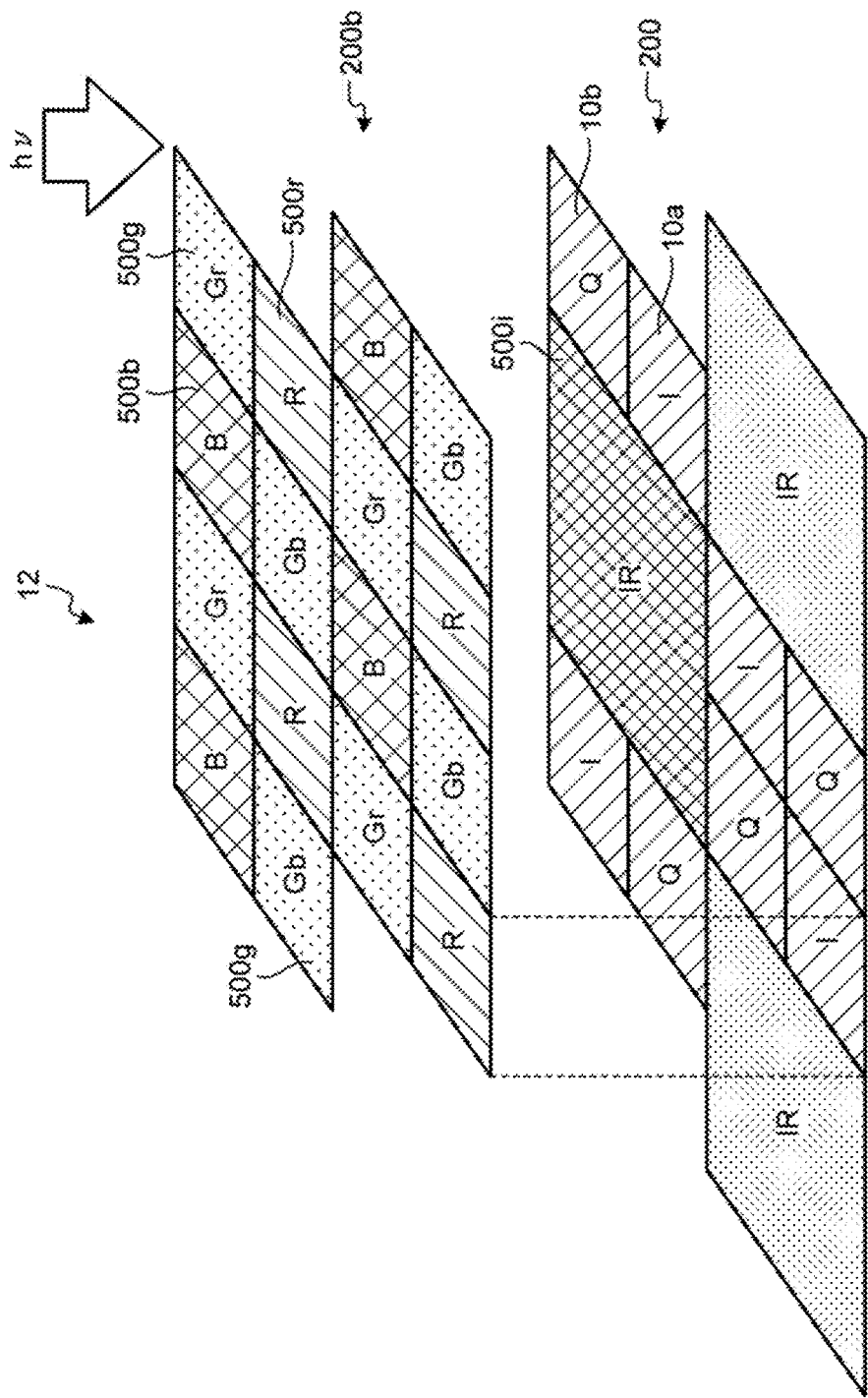
FIG. 37 is an explanatory diagram illustrating an example of a plan view configuration of the pixel array unit 12 according to a twenty-sixth modification of the first embodiment of the present disclosure.
Figure 38:
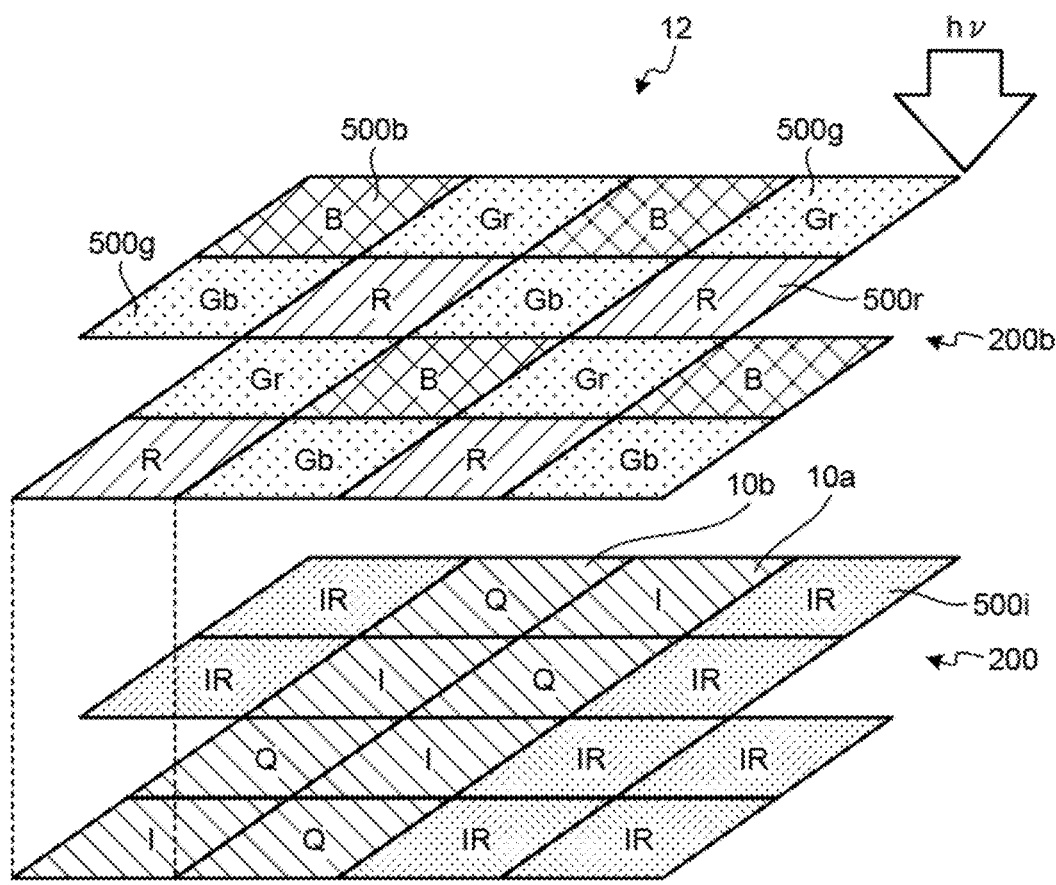
FIG. 38 is an explanatory diagram illustrating an example of a plan view configuration of the pixel array unit 12 according to a twenty-seventh modification of the first embodiment of the present disclosure.
Figure 39:
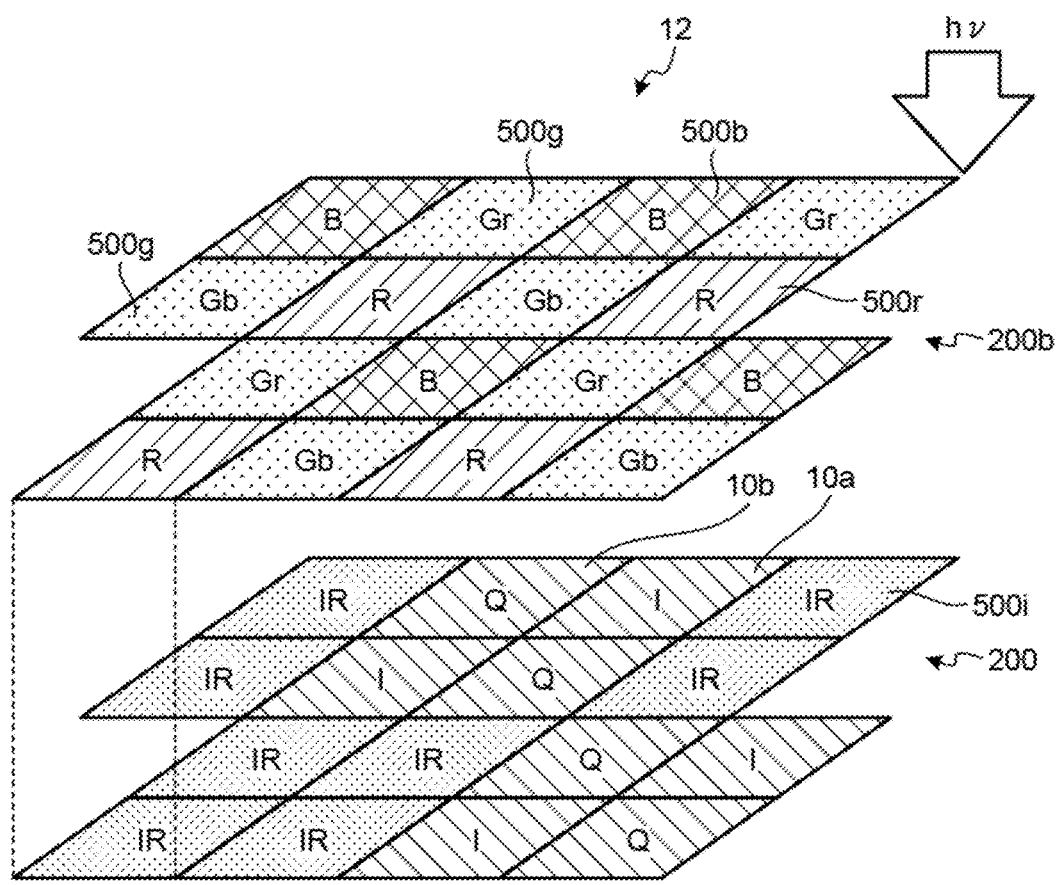
FIG. 39 is an explanatory diagram illustrating an example of a plan view configuration of the pixel array unit 12 according to a twenty-eighth modification of the first embodiment of the present disclosure.

Furthermore, in the present embodiment, the imaging element 500 may be provided on a semiconductor substrate different from a semiconductor substrate on which the light receiving elements 10 are arranged, that is, the pixel array unit 12 may have a stacked structure. Such a stacked structure makes it possible to make the pixel array unit 12 compact in size. Twenty-third to twenty-eighth modifications having such a configuration will be described below with reference to FIGS. 34 to 39. FIG. 34 is an explanatory diagram illustrating an example of a plan view configuration of the pixel array unit 12 according to the twenty-third modification of the present embodiment, and FIG. 35 is an explanatory diagram illustrating an example of a plan view configuration of the pixel array unit 12 according to the twenty-fourth modification of the present embodiment. Furthermore, FIG. 36 is an explanatory diagram illustrating an example of a plan view configuration of the pixel array unit 12 according to the twenty-fifth modification of the present embodiment, and FIG. 37 is an explanatory diagram illustrating an example of a plan view configuration of the pixel array unit 12 according to the twenty-sixth modification of the present embodiment. Furthermore, FIG. 38 is an explanatory diagram illustrating an example of a plan view configuration of the pixel array unit 12 according to the twenty-seventh modification of the present embodiment, and FIG. 39 is an explanatory diagram illustrating an example of a plan view configuration of the pixel array unit 12 according to the twenty-eighth modification of the present embodiment.

First, in the twenty-third modification, as illustrated in FIG. 34, the pixel array unit 12 is provided with a plurality of light receiving elements 10a and 10b on the semiconductor substrate 200. Furthermore, a plurality of imaging elements 500b, 500g, and 500r is provided on the semiconductor substrate 200b stacked on the semiconductor substrate 200. According to the present twenty-third modification, stacking of the two semiconductor substrates 200 and 200b in this manner can make the pixel array unit 12 more compact in size. Note that an arrow in FIG. 34 indicates a direction in which light (hv) is incident, and in the present modification, the light is incident from one direction, and thus, it is possible to simplify the configuration of the condenser lenses or the like that collect the light to the pixel array unit 12. Furthermore, in the present twenty-third modification, as illustrated in FIG. 34, the light receiving elements 10a and 10b are arranged in the Bayer array every 2×2, for simplified layout, and thus, the pixel array unit 12 can be readily manufactured.

Next, in the pixel array unit 12 of the twenty-fourth modification, light is incident from both sides of the stacked semiconductor substrates 200 and 200b, as indicated by arrows in FIG. 35. In the present twenty-fourth modification, the incident direction of light to the imaging elements 500b, 500g, and 500r is different from the incident direction of light to the light receiving elements 10a and 10b. Therefore, the imaging elements 500b, 500g, and 500r and the light receiving elements 10a and 10b can acquire a signal with high sensitivity.

Next, in the pixel array unit 12 of the twenty-fifth modification, as illustrated in FIG. 36, the plurality of light receiving elements 10a and the plurality of light receiving elements 10b are arranged on the semiconductor substrate 200 in an oblique direction, and further, an oblique row of the plurality of light receiving elements 10a and an oblique row of the plurality of light receiving elements 10b are alternately arranged. According to the present twenty-fifth modification, such an arrangement makes it possible to improve the resolution of distance measurement in the light receiving elements 10a and 10b.

Next, in the pixel array unit 12 of the twenty-sixth and twenty-seventh modifications, as illustrated in FIGS. 37 and 38, a plurality of imaging elements 500i is provided on the semiconductor substrate 200 in addition to the plurality of light receiving elements 10a and 10b. Specifically, in the twenty-sixth modification, as illustrated in FIG. 37, the spectral wavelength of each imaging element 500i is longer than that of visible light. Therefore, the imaging element 500i is formed into a size (area) larger than those of the other imaging elements 500b, 500g, and 500r and the light receiving elements 10a and 10b, improving the sensitivity. Furthermore, in the twenty-seventh modification, as illustrated in FIG. 38, the respective imaging elements 500i, the light receiving elements 10a, and the light receiving elements 10b are arranged in one direction, for simplified layout, and thus, the pixel array unit 12 can be readily manufactured. As described above, according to the present twenty-sixth and twenty-seventh modifications, it is possible to acquire the near-infrared signal in addition to the RGB signal of the color information while improving the resolution, and thus, the image of the target 800 can be acquired, for example, even in a dark environment.

Next, in the pixel array unit 12 of the twenty-eighth modification, as illustrated in FIG. 39, the light receiving elements 10a and 10b and the imaging element 500i are arranged every 2×2, and therefore, the resolution can be improved.

(Twenty-Ninth to Thirty-Fifth Modifications)

Figure 40:
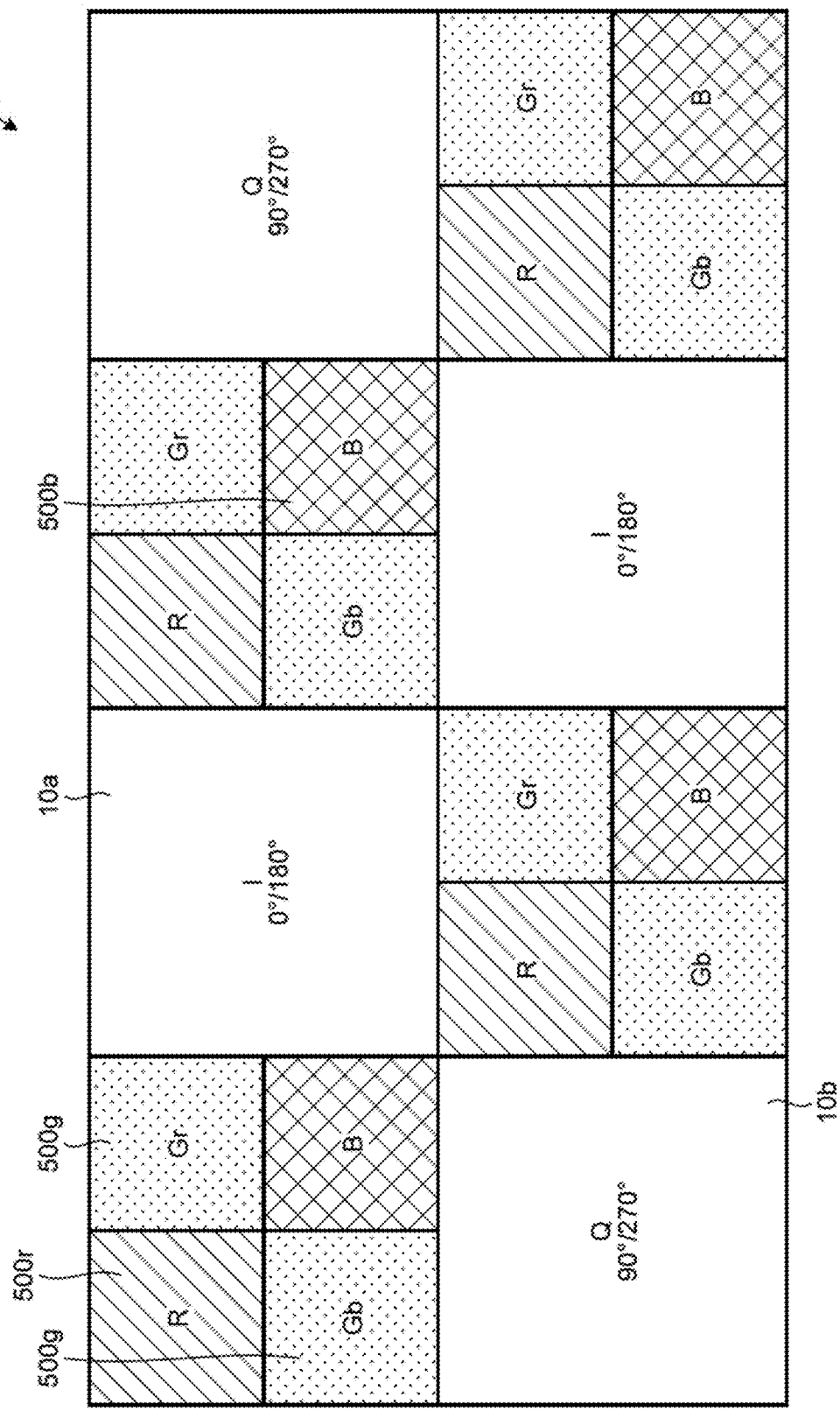
FIG. 40 is an explanatory diagram illustrating an example of a plan view configuration of the pixel array unit 12 according to a twenty-ninth modification of the first embodiment of the present disclosure.
Figure 41:
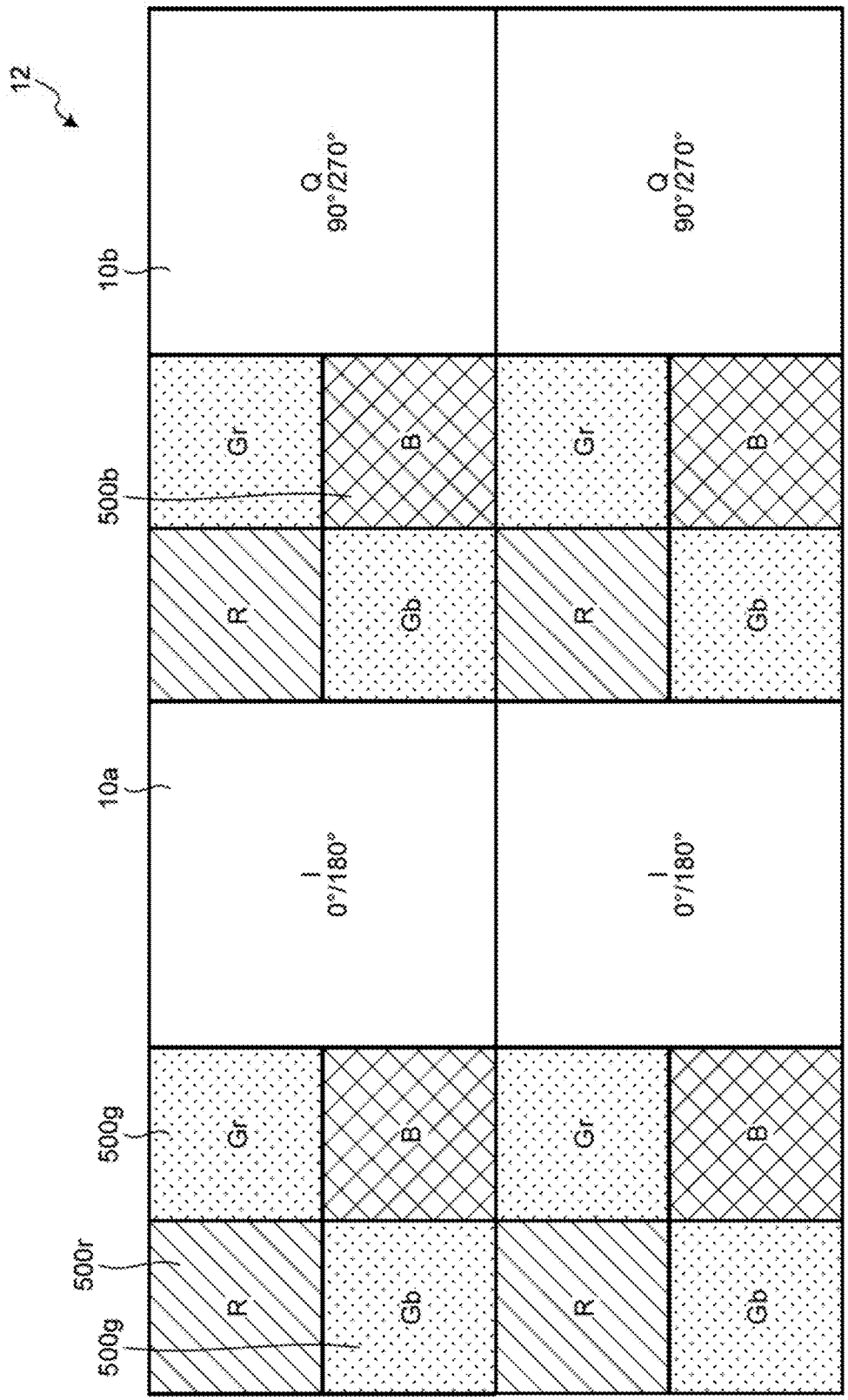
FIG. 41 is an explanatory diagram illustrating an example of a plan view configuration of the pixel array unit 12 according to a thirtieth modification of the first embodiment of the present disclosure.
Figure 42:
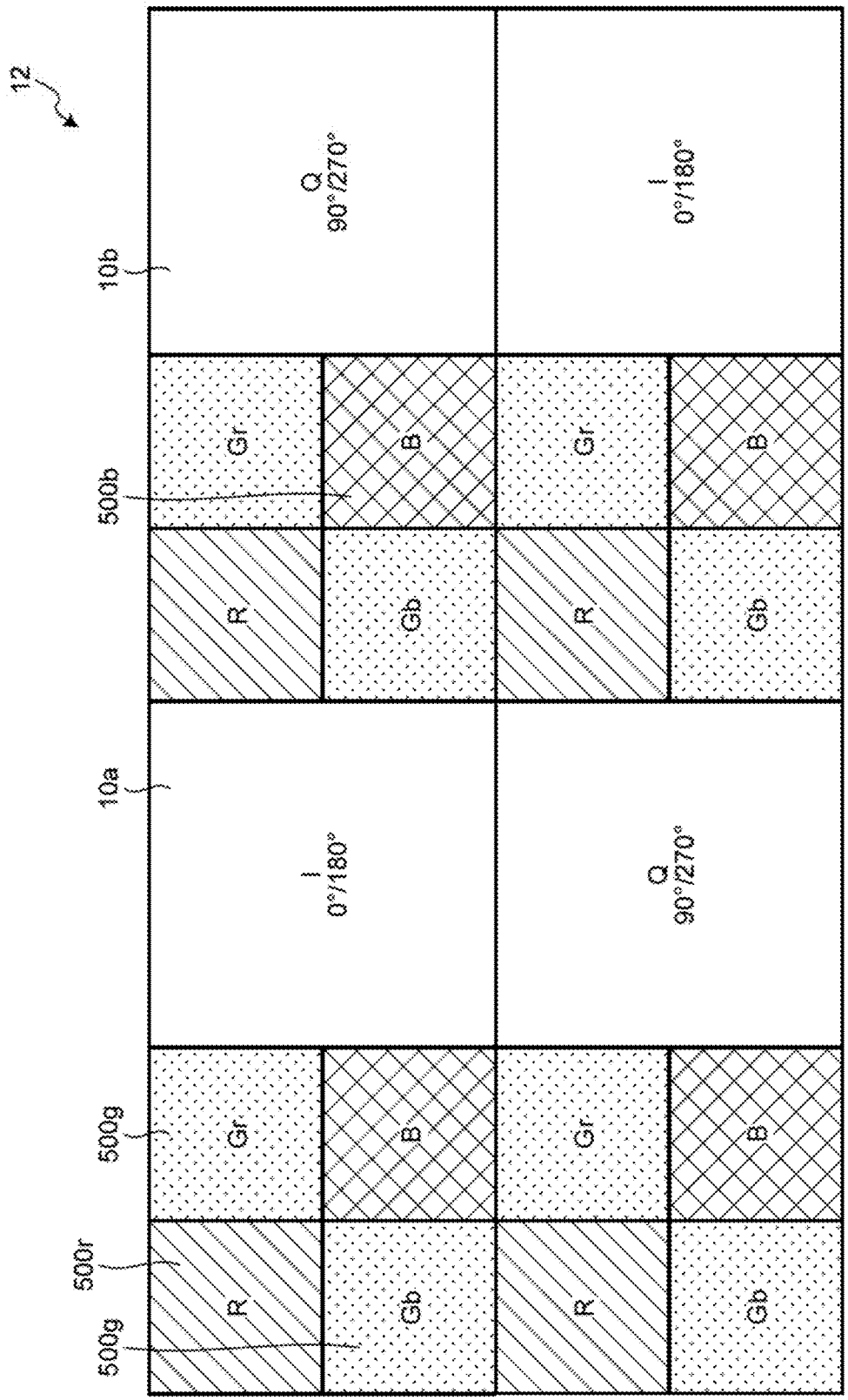
FIG. 42 is an explanatory diagram illustrating an example of a plan view configuration of the pixel array unit 12 according to a thirty-first modification of the first embodiment of the present disclosure.
Figure 43:
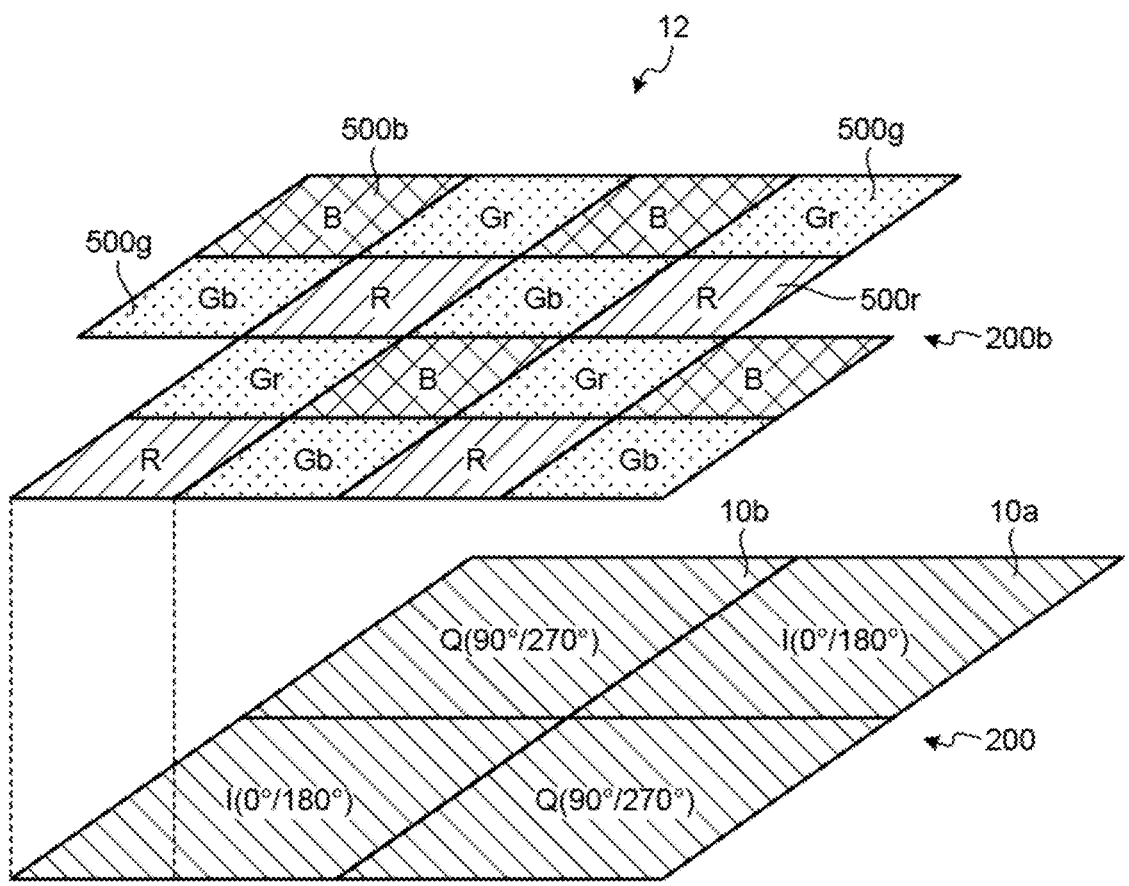
FIG. 43 is an explanatory diagram illustrating an example of a plan view configuration of the pixel array unit 12 according to a thirty-second modification of the first embodiment of the present disclosure.
Figure 44:
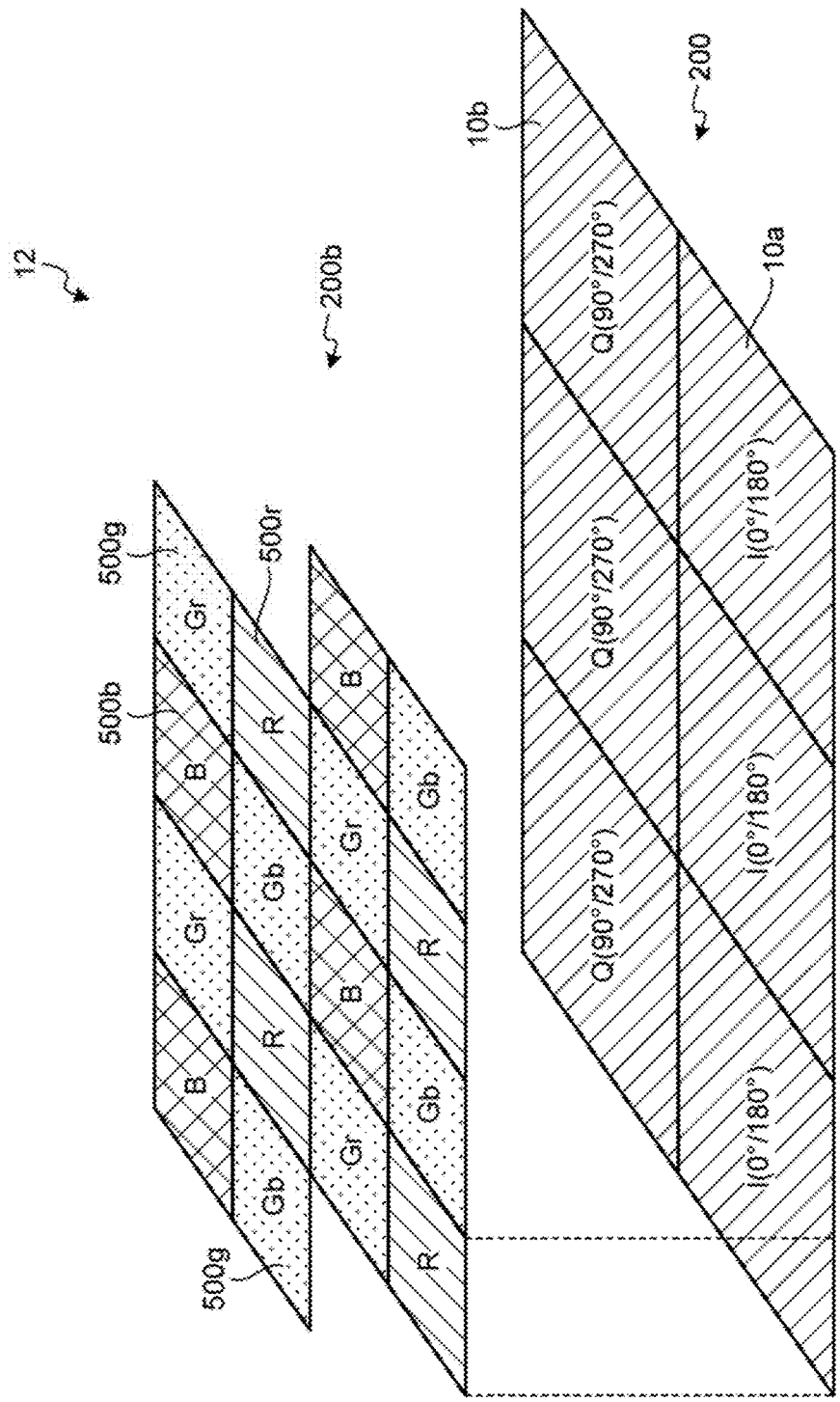
FIG. 44 is an explanatory diagram illustrating an example of a plan view configuration of the pixel array unit 12 according to a thirty-third modification of the first embodiment of the present disclosure.
Figure 45:
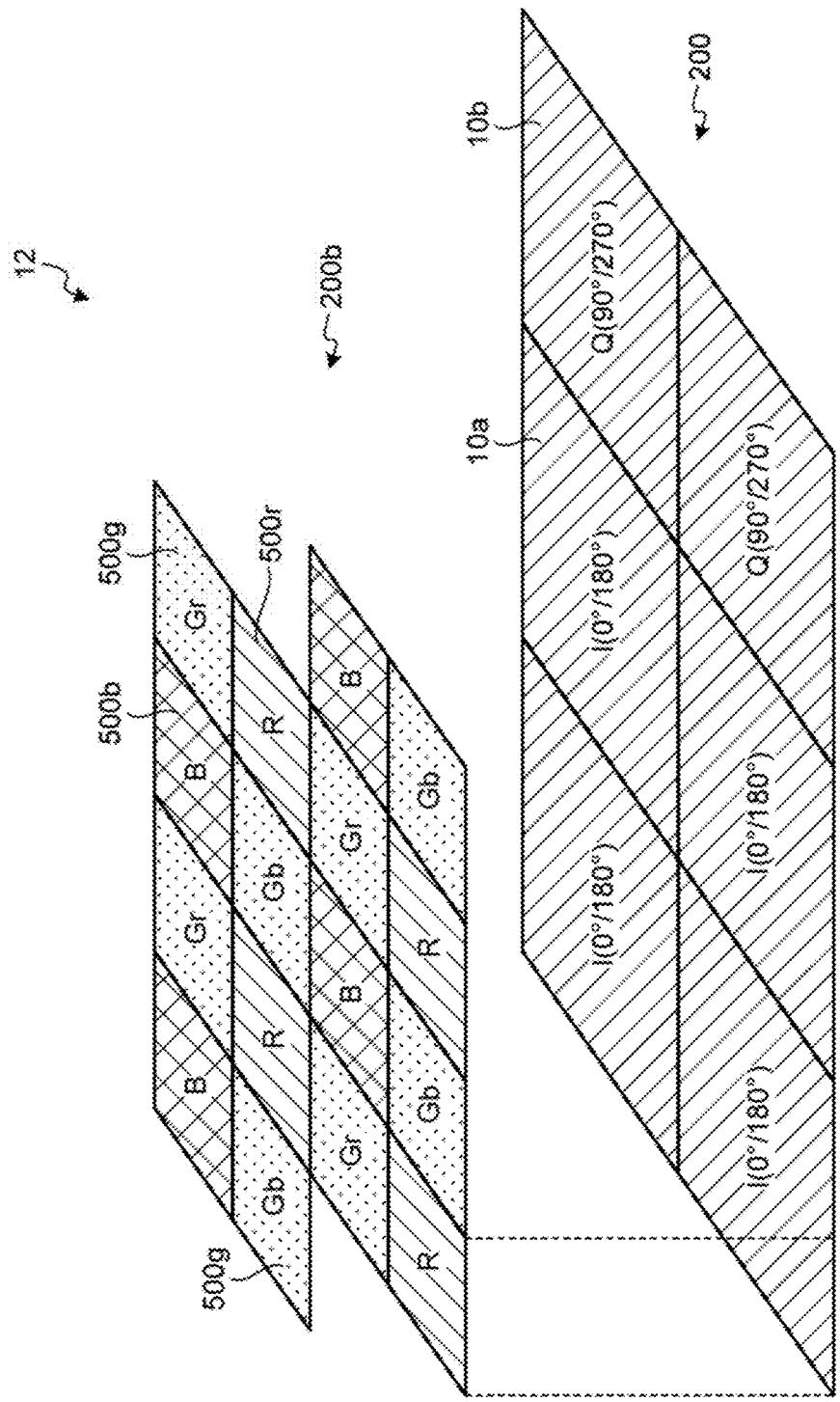
FIG. 45 is an explanatory diagram illustrating an example of a plan view configuration of the pixel array unit 12 according to a thirty-fourth modification of the first embodiment of the present disclosure.
Figure 46:
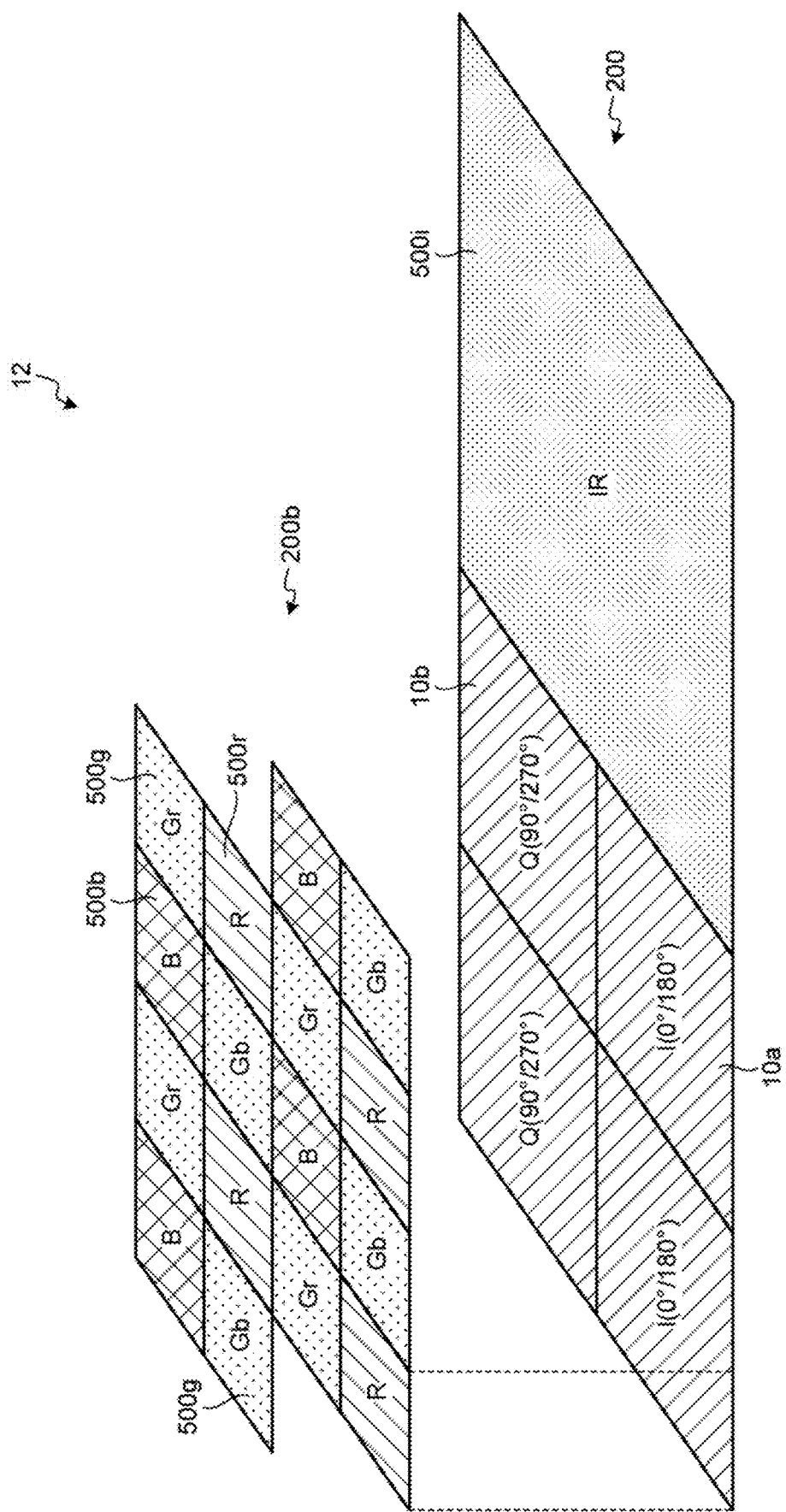
FIG. 46 is an explanatory diagram illustrating an example of a plan view configuration of the pixel array unit 12 according to a thirty-fifth modification of the first embodiment of the present disclosure.

Furthermore, in the present embodiment, the light receiving elements 10a and 10b may be formed to have a size larger than those of the imaging elements 500b, 500g, and 500r. Such a configuration makes it possible to improve the distance measurement accuracy. Twenty-ninth to thirty-fifth modifications having such a configuration will be described below with reference to FIGS. 40 to 46. FIG. 40 is an explanatory diagram illustrating an example of a plan view configuration of the pixel array unit 12 according to the twenty-ninth modification of the present embodiment, and FIG. 41 is an explanatory diagram illustrating an example of a plan view configuration of the pixel array unit 12 according to the thirtieth modification of the present embodiment. FIG. 42 is an explanatory diagram illustrating an example of a plan view configuration of the pixel array unit 12 according to the thirty-first modification of the present embodiment, and FIG. 43 is an explanatory diagram illustrating an example of a plan view configuration of the pixel array unit 12 according to the thirty-second modification of the present embodiment. Furthermore, FIG. 44 is an explanatory diagram illustrating an example of a plan view configuration of the pixel array unit 12 according to the thirty-third modification of the present embodiment, and FIG. 45 is an explanatory diagram illustrating an example of a plan view configuration of the pixel array unit 12 according to the thirty-fourth modification of the present embodiment. Furthermore, FIG. 46 is an explanatory diagram illustrating an example of a plan view configuration of the pixel array unit 12 according to the thirty-fifth modification of the present embodiment.

First, in the pixel array unit 12 of the twenty-ninth modification, as illustrated in FIG. 40, the light receiving elements 10a and 10b have a size (area) larger than those of the imaging elements 500b, 500g, and 500r. In general, high resolution is required for the imaging elements 500b, 500g, and 500r, but the resolution as high as that for the imaging elements 500b, 500g, and 500r is not required for the light receiving elements 10a and 10b. Therefore, in the present twenty-ninth modification, provision of the light receiving elements 10a and 10b having such a large size makes it possible to improve the sensitivity and further improve the distance measurement accuracy, although the resolution is poor.

Furthermore, in the pixel array unit 12 of the thirtieth and thirty-first modifications, as illustrated in FIGS. 41 and 42, the light receiving elements 10a and the light receiving elements 10b are arranged in one direction, for simplified layout, and thus, the pixel array unit 12 can be readily manufactured.

Furthermore, in a stacked configuration as well, the light receiving elements 10a and 10b can have a size (area) larger than those of the imaging elements 500b, 500g, and 500r. Specifically, in the stacked configurations of the pixel array unit 12 according to the thirty-second to the thirty-fourth modifications as well, as illustrated in FIGS. 43 to 45, the light receiving elements 10a and 10b have a size (area) larger than those of the imaging elements 500b, 500g, and 500r.

Furthermore, in the pixel array unit 12 of the thirty-fifth modification, as illustrated in FIG. 46, the imaging element 500i has a size (area) larger than those of the imaging elements 500b, 500g, and 500r. According to the present modification, provision of the imaging element 500i having such a large size makes it possible to increase the sensitivity.

(Thirty-Sixth to Fortieth Modifications)

Figure 47:
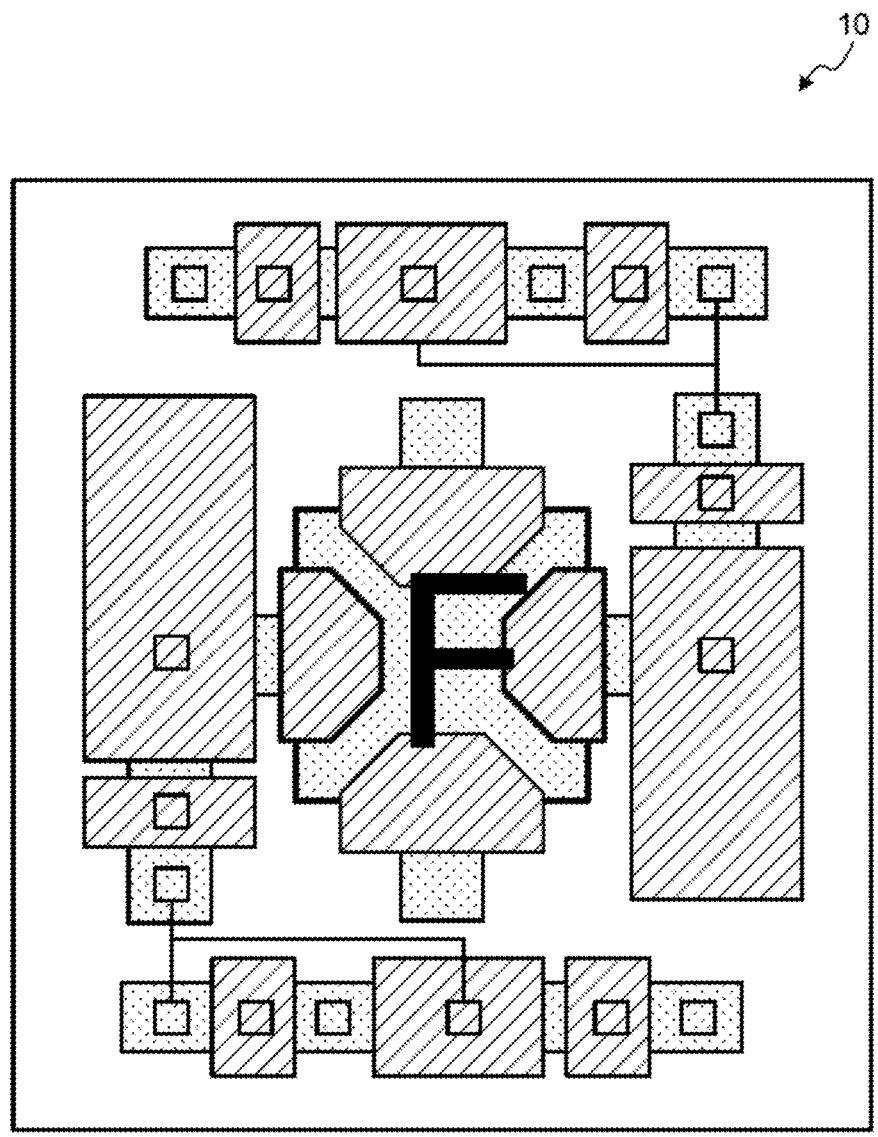
FIG. 47 is an explanatory diagram illustrating an example of a plan view configuration of the light receiving element 10 according to thirty-sixth to fortieth modifications of the first embodiment of the present disclosure.
Figure 48:
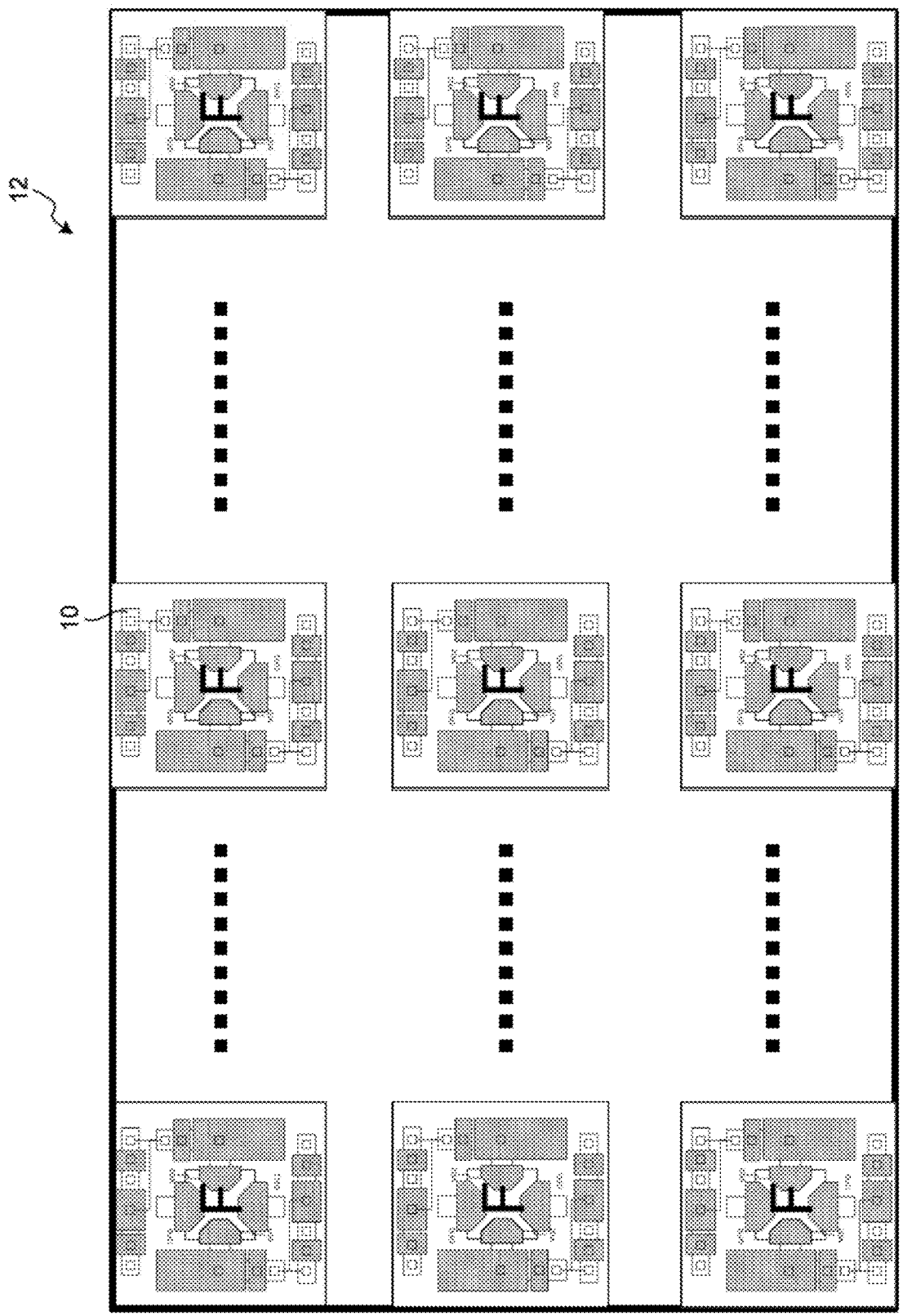
FIG. 48 is an explanatory diagram illustrating an example of a plan view configuration of the pixel array unit 12 according to the thirty-sixth modification of the first embodiment of the present disclosure.
Figure 49:
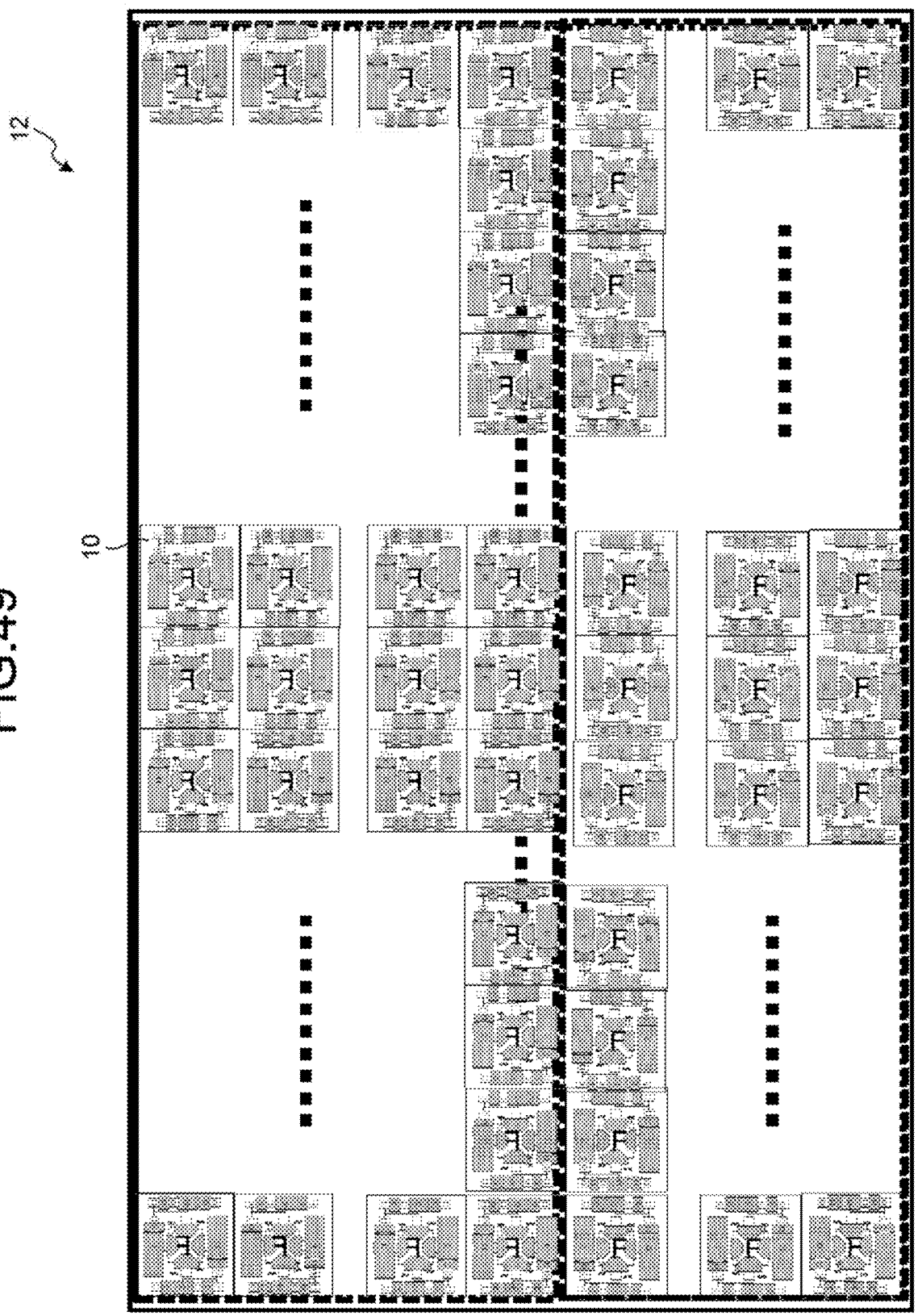
FIG. 49 is an explanatory diagram illustrating an example of a plan view configuration of the pixel array unit 12 according to the thirty-seventh modification of the first embodiment of the present disclosure.
Figure 50:
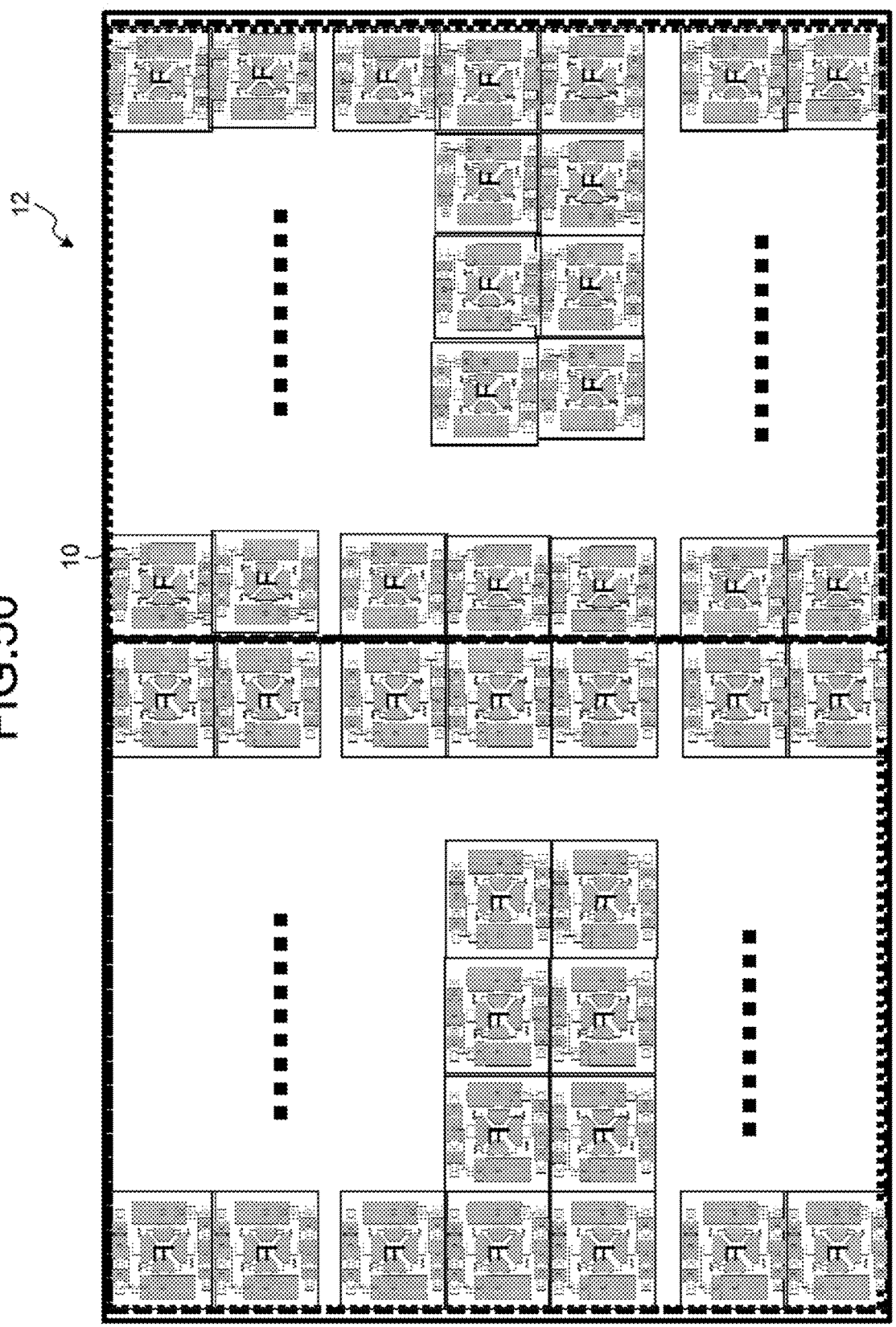
FIG. 50 is an explanatory diagram illustrating an example of a plan view configuration of the pixel array unit 12 according to the thirty-eighth modification of the first embodiment of the present disclosure.
Figure 51:
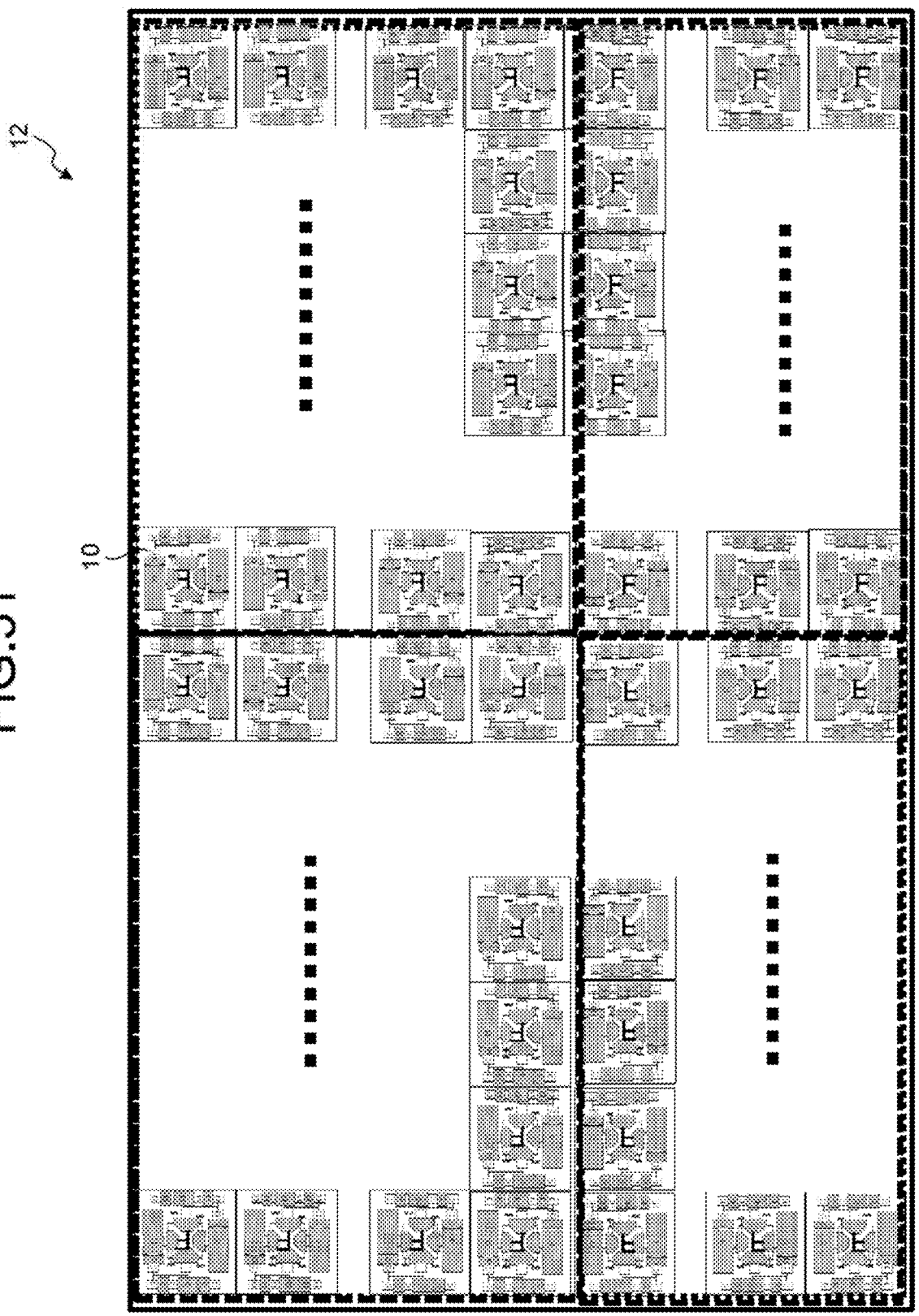
FIG. 51 is an explanatory diagram illustrating an example of a plan view configuration of the pixel array unit 12 according to the thirty-ninth modification of the first embodiment of the present disclosure.
Figure 52:
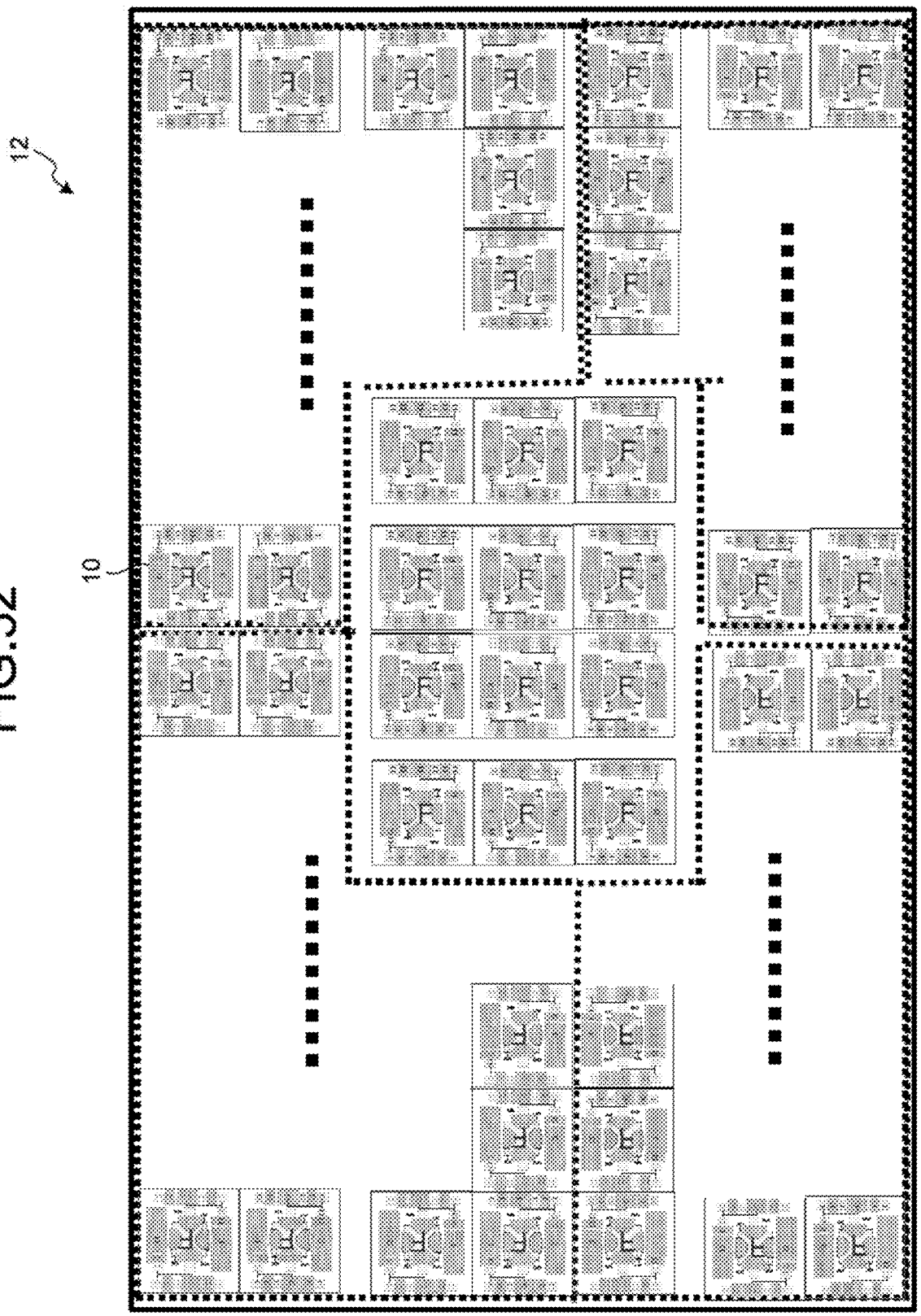
FIG. 52 is an explanatory diagram illustrating an example of a plan view configuration of the pixel array unit 12 according to the fortieth modification of the first embodiment of the present disclosure.

Furthermore, in the present embodiment, the pixel array unit 12 may be configured so that the direction of the plurality of light receiving elements 10 is optimized at each position. Thirty-sixth to fortieth modifications having such a configuration will be described below with reference to FIGS. 47 to 52. FIG. 47 is an explanatory diagram illustrating an example of a plan view configuration of the light receiving element 10 according to the thirty-sixth to fortieth modifications of the present embodiment. FIG. 48 is an explanatory diagram illustrating an example of a plan view configuration of the pixel array unit 12 according to the thirty-sixth modification of the present embodiment, and FIG. 49 is an explanatory diagram illustrating an example of a plan view configuration of the pixel array unit 12 according to the thirty-seventh modification of the present embodiment. FIG. 50 is an explanatory diagram illustrating an example of a plan view configuration of the pixel array unit 12 according to the thirty-eighth modification of the present embodiment, and FIG. 51 is an explanatory diagram illustrating an example of a plan view configuration of the pixel array unit 12 according to the thirty-ninth modification of the present embodiment. FIG. 52 is an explanatory diagram illustrating an example of a plan view configuration of the pixel array unit 12 according to the fortieth modification of the present embodiment.

In the thirty-sixth to fortieth modifications described below, it is assumed that the plan view configuration of each light receiving element 10 has, for example, a configuration as illustrated in FIG. 47. Specifically, the plan view configuration of FIG. 47 is similar to the example of the plan view configuration of the light receiving element 10 according to the first embodiment of the present disclosure illustrated in FIG. 5. In FIG. 47, a letter "F" is displayed on the light receiving element 10, for ease of understanding the direction of the light receiving element 10.

First, in the pixel array unit 12 of the thirty-sixth modification, as illustrated in FIG. 48, all of the plurality of light receiving elements 10 are arranged so as to face in the same direction. According to the present thirty-sixth modification, all light receiving elements 10 are arranged to face in the same direction as described above, and thus, it is possible to reduce a variation in performance of the light receiving elements 10 in manufacturing.

Next, in the thirty-seventh modification, as illustrated in FIG. 49, the pixel array unit 12 is divided into two regions, such as an upper half portion and a lower half portion in FIG. 49, and further, in the upper half region and the lower half region, the plurality of light receiving elements 10 faces in determined directions in the respective regions. In other words, the plurality of light receiving elements 10 faces in different directions between the upper half region and the lower half region of the pixel array unit 12. According to the present thirty-seventh modification, changing the directions of the light receiving elements 10 between the upper half portion and the lower half portion of the pixel array unit 12 in this manner makes it possible to mitigate deterioration in distance measurement accuracy due to the oblique light obliquely incident on the pixel array unit 12.

Next, in the thirty-eighth modification, as illustrated in FIG. 50, the pixel array unit 12 is divided into two regions, such as a right half portion and a left half portion in FIG. 50, and further, in the right half region and the left half region, the plurality of light receiving elements 10 faces in different directions. According to the present thirty-eighth modification, changing the directions of the light receiving elements 10 between the right half portion and the left half portion of the pixel array unit 12 in this manner makes it possible to mitigate deterioration in distance measurement accuracy due to the oblique light obliquely incident on the pixel array unit 12.

Next, in the thirty-ninth modification, as illustrated in FIG. 51, the pixel array unit 12 is divided into four regions such as a first quadrant, a second quadrant, a third quadrant, and a fourth quadrant, and further, the plurality of light receiving elements 10 faces in different directions between the respective quadrants. According to the present thirty-ninth modification, changing the directions of the light receiving elements 10 between the respective quadrants in this manner, that is, optimization of the directions of the light receiving elements 10 according to the positions of the light receiving elements 10 makes it possible to mitigate deterioration in distance measurement accuracy due to the oblique light obliquely incident on the pixel array unit 12.

Next, in the pixel array unit 12 of the fortieth modification, as illustrated in FIG. 52, the central region in FIG. 52 and the periphery area thereof are divided into five regions such as a first quadrant, a second quadrant, a third quadrant, and a fourth quadrant, and further, the plurality of light receiving elements 10 faces in different directions between the five regions. According to the present fortieth modification, optimization of the directions of the light receiving elements 10 according to the positions of the light receiving elements 10 in this manner makes it possible to mitigate deterioration in distance measurement accuracy due to the oblique light obliquely incident on the pixel array unit 12.

(Forty-First Modification)

Figure 53:
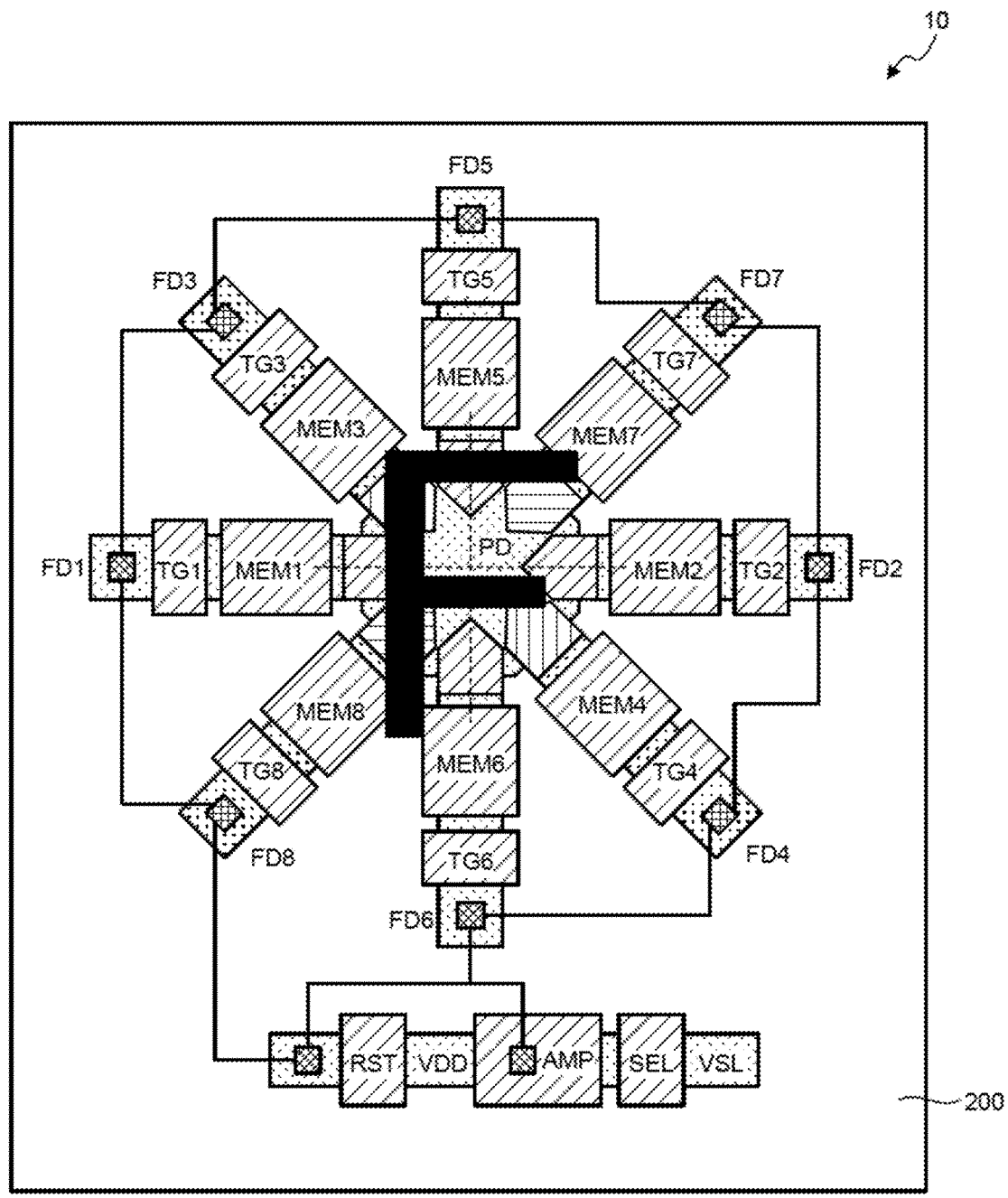
FIG. 53 is an explanatory diagram illustrating an example of a plan view configuration of the light receiving element 10 according to a forty-first modification of the first embodiment of the present disclosure.

Furthermore, in the present embodiment, even in a case where the plurality of distribution transistors VG is provided, the directions of the plurality of light receiving elements 10 may be optimized for each position in the pixel array unit 12. A forty-first modification having such a configuration will be described below with reference to FIGS. 53 and 54. FIG. 53 is an explanatory diagram illustrating an example of a plan view configuration of the light receiving element 10 according to the forty-first modification of the present embodiment, and FIG. 54 is an explanatory diagram illustrating an example of a plan view configuration of the pixel array unit 12 according to the forty-first modification of the present embodiment.

In the forty-first modification described below, it is assumed that the plan view configuration of each light receiving element 10 has, for example, a configuration as illustrated in FIG. 53. Specifically, the plan view configuration of FIG. 53 is similar to the example of the plan view configuration of the light receiving element 10 according to the eighteenth modification of the first embodiment of the present disclosure illustrated in FIG. 29. In FIG. 53, the letter F is displayed on the light receiving element 10, for ease of understanding the direction of the light receiving element 10.

Figure 54:
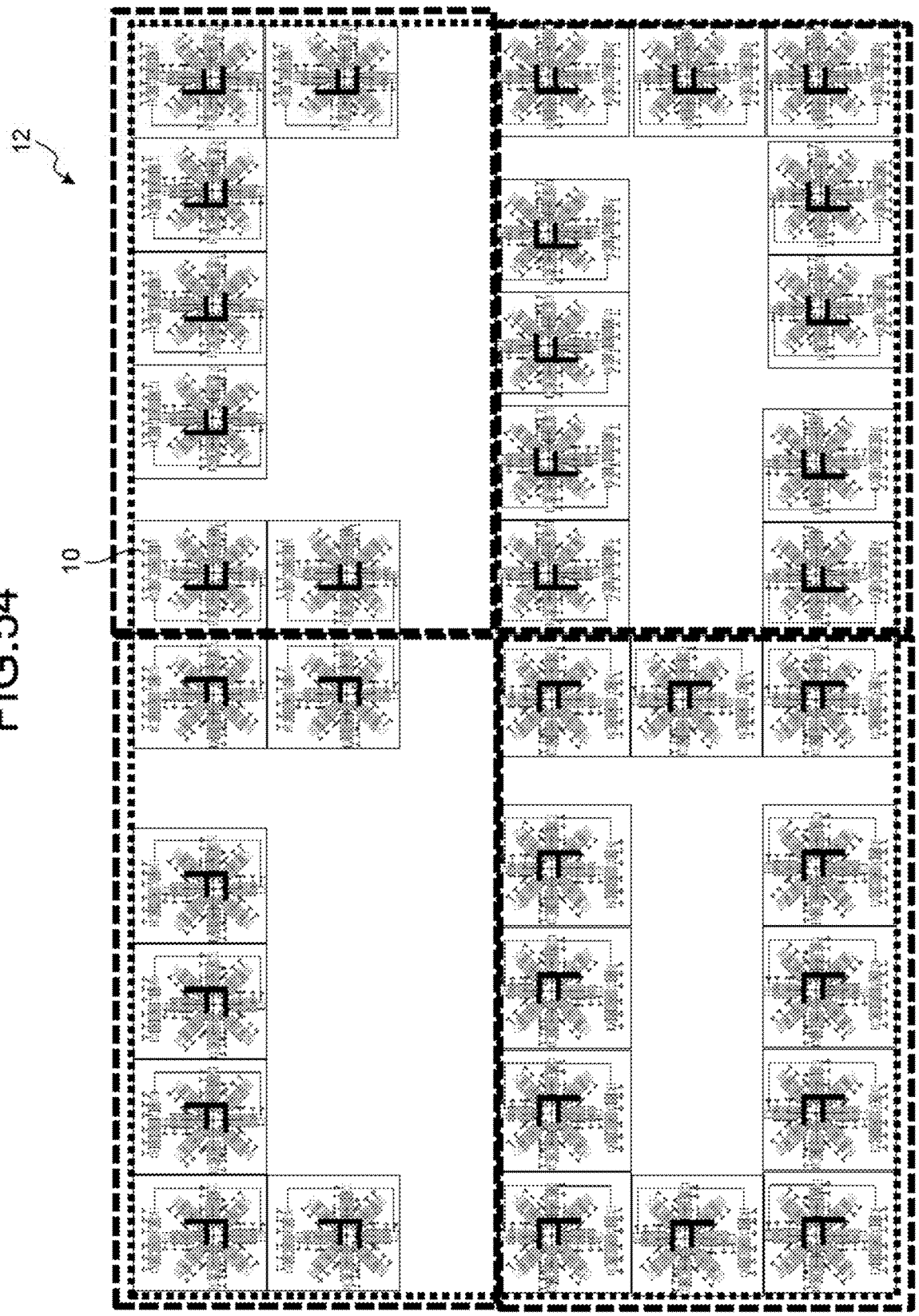
FIG. 54 is an explanatory diagram illustrating an example of a plan view configuration of the pixel array unit 12 according to the forty-first modification of the first embodiment of the present disclosure.

Next, in the forty-first modification, as illustrated in FIG. 54, the pixel array unit 12 is divided into four regions such as a first quadrant, a second quadrant, a third quadrant, and a fourth quadrant, and further, the plurality of light receiving elements 10 faces in different directions between the respective quadrants. In the present forty-first modification, for example, in each light receiving element 10 that is positioned at a corner of the pixel array unit 12, it is preferable to use only the distribution transistor VG positioned closer to the corner. According to the present forty-first modification, changing the directions of the light receiving elements 10 and changing the distribution transistor VG to be used, for each quadrant in this manner makes it possible to mitigate deterioration in distance measurement accuracy due to the oblique light obliquely incident on the pixel array unit 12.

7. Second Embodiment

Furthermore, in the first embodiment and the modifications thereof described above, the insulating films (not illustrated) of the electric charge storage units MEM1 and MEM2, the gate insulating films (not illustrated) of the amplifying transistors AMP1 and AMP2, and the like may be reduced in thickness. Such a configuration makes it possible to increase the capacitance of the electric charge storage units MEM1 and MEM2 without increasing the size thereof. Furthermore, reduction in influence of crystal defects caused by reduced crystal defects in the gate insulating film or increased mutual conductance gm of a transistor, or reduction in interface state caused by reduced heat treatment time or reduced heat treatment temperature make it possible to reduce random noise of the amplifying transistors AMP1 and AMP2.

Figure 55:
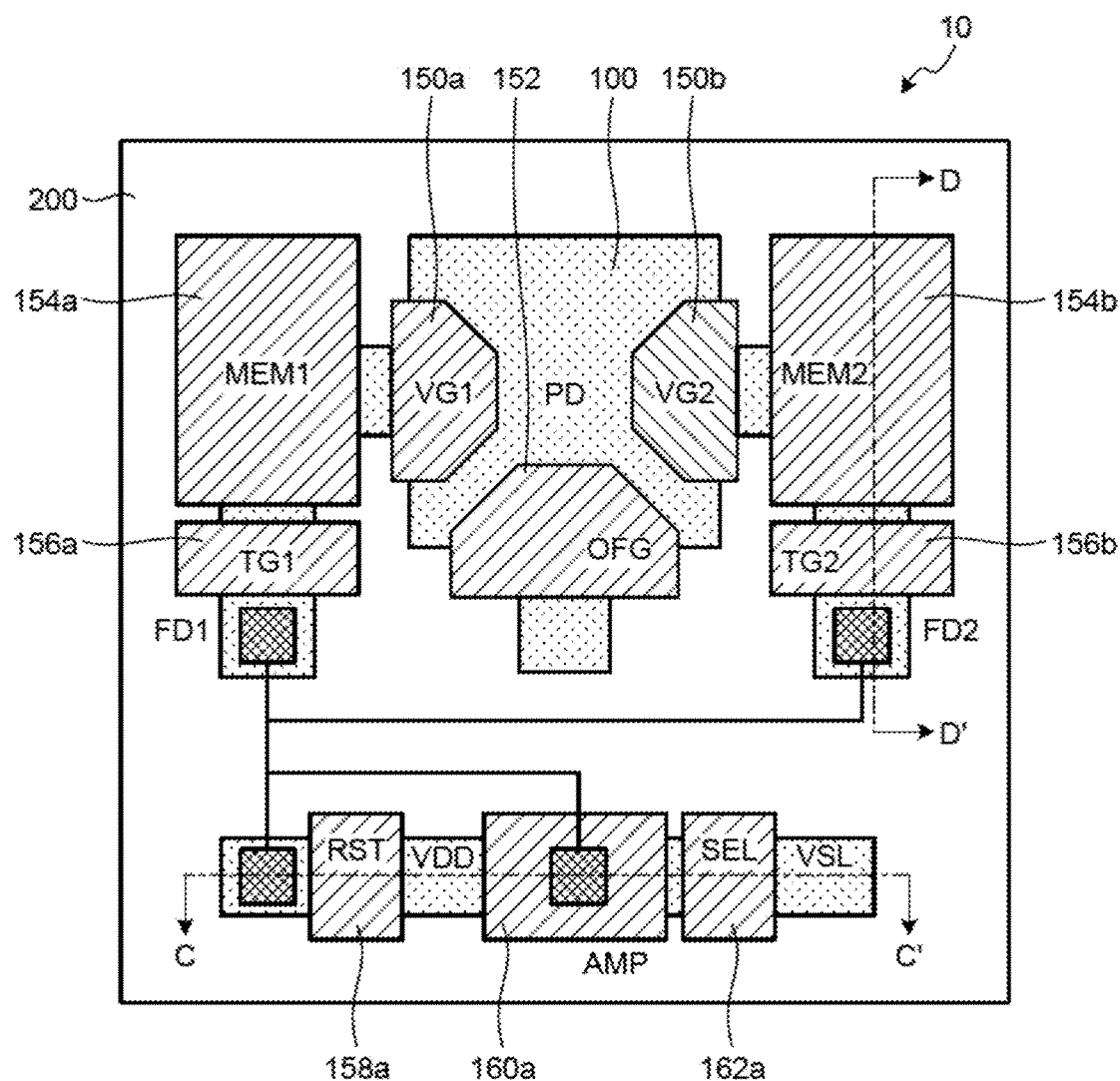
FIG. 55 is an explanatory diagram illustrating an example of a plan view configuration of the light receiving element 10 according to a second embodiment of the present disclosure.
Figure 56A:
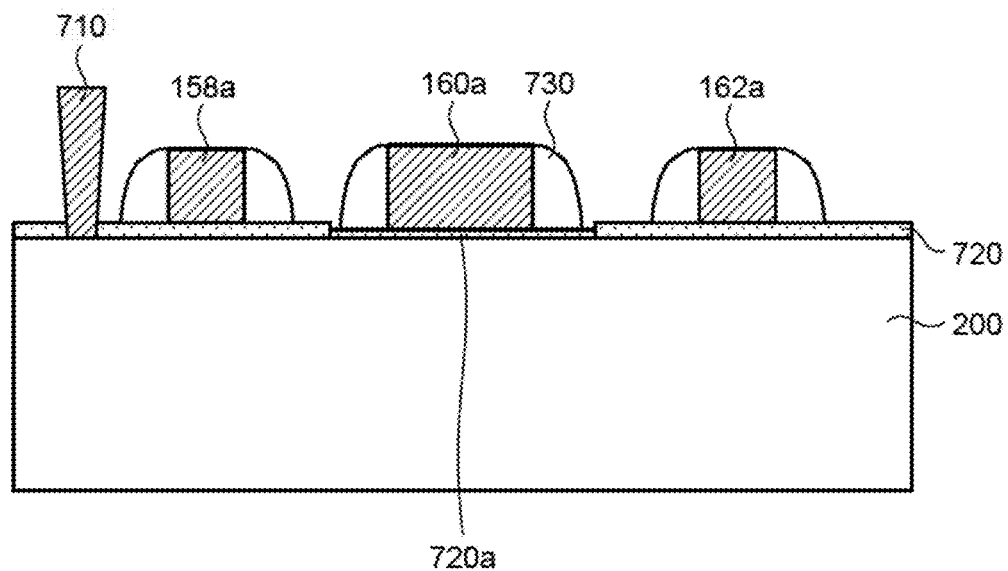
FIG. 56A is a cross-sectional view of the light receiving element 10 taken along line C-C' in FIG. 55.
Figure 56B:
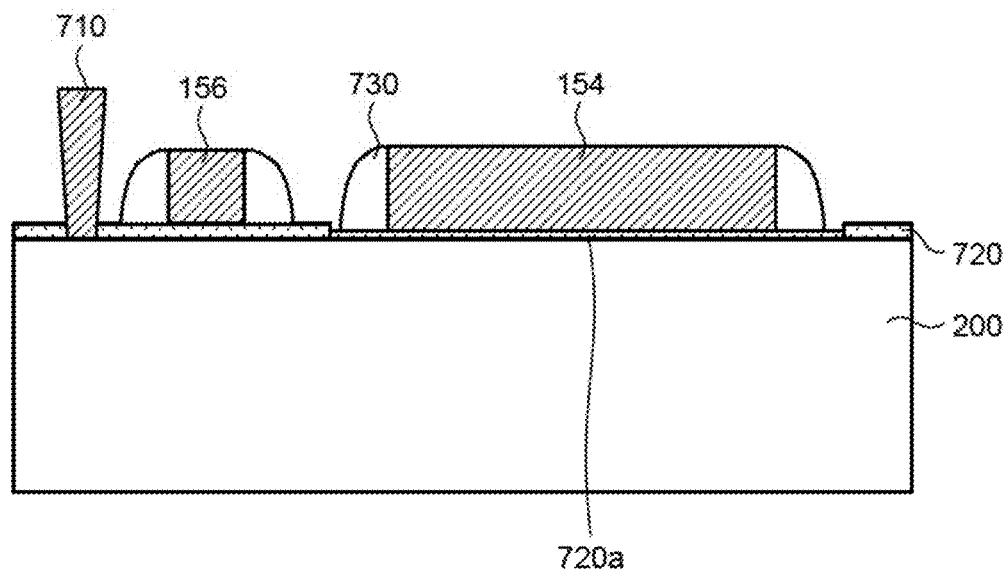
FIG. 56B is a cross-sectional view of the light receiving element 10 taken along line D-D' in FIG. 55.

Here, in a third embodiment of the present disclosure, the electric charge storage units MEM1 and MEM2 and the amplifying transistors AMP1 and AMP2, having insulating films with reduced thickness will be described with reference to FIGS. 55, 56A, and 56B. Note that FIG. 55 is an explanatory diagram illustrating an example of a plan view configuration of the light receiving element 10 according to the present embodiment, where the light receiving element 10 is viewed from above the surface of the semiconductor substrate 200. The light receiving element 10 of FIG. 55 is similar to the light receiving element 10 of the eighth modification of the first embodiment illustrated in FIG. 17. FIG. 56A is a cross-sectional view of the light receiving element 10 taken along line C-C' in FIG. 55, and FIG. 56B is a cross-sectional view of the light receiving element 10 taken along line D-D' in FIG. 55. Specifically, in each of FIGS. 56A and 56B, the upper side in the drawing is the front surface side of the semiconductor substrate 200, and the lower side in the drawing is the back surface side of the semiconductor substrate 200. In FIG. 56A, a contact on the gate electrode 160 is not illustrated.

Specifically, in the present embodiment, for example, as illustrated in FIG. 56A, an insulating film 720a positioned below the gate electrode 160 of the amplifying transistor AMP1 covered with a sidewall 730 is made of, for example, an oxide film (third oxide film), and has a film thickness that is smaller than that of an insulating film 720 that is made of the oxide film (third oxide film) and positioned below the gate electrode 158 of the reset transistor RST1 and the gate electrode 162 of the selection transistor SEL1.

Furthermore, in the present embodiment, the electric charge storage unit MEM1 includes the electrode 154a, the insulating film 720a, and the N-type semiconductor region. Specifically, for example, as illustrated in FIG. 56B, an insulating film 720a positioned below the electrode 154 of the electric charge storage unit MEM1 covered with the sidewall 730 is made of, for example, an oxide film (first oxide film), and has a film thickness that is smaller than that of the insulating film 720 made of an oxide film (second oxide film) and positioned below the gate electrode 156 of the transfer transistor TG1.

Note that in the present embodiment, the insulating film 720a positioned below the gate electrode 160 of the amplifying transistor AMP1 and the insulating film 720a positioned below the electrode 154 of the electric charge storage unit MEM1 may be an oxide film made of the same material, or may have substantially the same film thickness.

More specifically, in the present embodiment, the insulating film 720a positioned below the gate electrode 160 of the amplifying transistor AMP1 and the insulating film 720a positioned below the electrode 154 of the electric charge storage unit MEM1 are made of an oxide film of silicon oxide ($SiO_2$), silicon nitride (SiN), or the like. In addition, in the present embodiment, the film thickness of each of the insulating film 720a positioned below the gate electrode 160 of the amplifying transistor AMP1 and the insulating film 720a positioned below the electrode 154 of the electric charge storage unit MEM1 is preferably approximately a half of the film thickness of the insulating films 720 positioned below the gate electrodes 156, 158, and 162 of other elements (transfer transistors TG, reset transistor RST, and selection transistor SEL), and more preferably, for example, 1.0 nm or more and 5.0 nm or less, in view of the effect of reducing random noise due to the reduction in thickness and the increase in power consumption due to the increase in leakage current.

Furthermore, in the present embodiment, the insulating film 720a positioned below the gate electrode 160 of the amplifying transistor AMP1 and the insulating film 720a positioned below the electrode 154 of the electric charge storage unit MEM1 are preferably wider than the gate electrode 160 and the electrodes 154 to an extent that adjacent elements are not interfered, when viewed from above the semiconductor substrate 200.

Note that, the present embodiment is not limited to the reduction of only the film thickness of the insulating film 720a of the electric charge storage units MEM1 and MEM2 and the gate insulating film 720a of the amplifying transistors AMP1 and AMP2. In the present embodiment, only the thickness of the insulating film 720a of the electric charge storage units MEM1 and MEM2 may be reduced, and the thickness of the insulating film 720 that makes contact with the gate electrodes 150, 152, 154, 156, 158, 160, and 162 and the electrode 154 of the elements (electric charge storage units MEM, transfer transistors TG, distribution transistors VG, discharge transistor OFG, amplifying transistor AMP, reset transistor RST, and selection transistor SEL) on the light receiving element 10 may be reduced.

As described above, according to the present embodiment, the reduction of the thickness of the insulating film 720a of the electric charge storage units MEM, the thickness of the gate insulating film 720a of the amplifying transistor AMP, or the like makes it possible to increase the capacitances of the electric charge storage units MEM without increasing the size thereof, reducing random noise of the transistor. Accordingly, the configuration of the present embodiment is applied to the configurations of the first embodiment that has a symmetrical layout. Therefore, it is possible to accurately form the insulating film 720a to be reduced. Thus, in addition to the effect of improving the distance measurement accuracy of the distance measurement module 1 caused by electric charges uniformly collected into the electric charge storage units MEM1 and MEM2, the capacitances of the electric charge storage units MEM1 and MEM2 are increased and the random noise of the transistors is reduced. Therefore, it is possible to further improve the distance measurement accuracy of the distance measurement module 1. Note that the present embodiment can be implemented in combination with the first embodiment described above and the modifications thereof.

8. Third Embodiment

Incidentally, in the second embodiment described above, the thickness of the insulating film 720a of each electric charge storage unit MEM, the thickness of the gate insulating film 720a of the amplifying transistor AMP, and the like are reduced to increase the capacitance of each electric charge storage unit MEM and reduce the random noise of the amplifying transistor AMP. However, in a case where the thickness of each gate insulating film 720a further reduced, although the above effects can be obtained, the leakage current increases, having a limitation in the reduction of the film thickness. Therefore, the present inventors have conceived that a high dielectric film having a high relative permittivity capable of increasing the capacitance of the electric charge storage unit MEM as compared with the oxide film described above, even having the same film thickness is used instead of the insulating film 720a. Even if the film thickness is reduced, use of the high dielectric film as the insulating film 720a makes it possible to achieve both of an increase in capacitance of the electric charge storage unit MEM and a reduction in random noise of the amplifying transistor AMP while avoiding an increase in leakage current.

Figure 57:
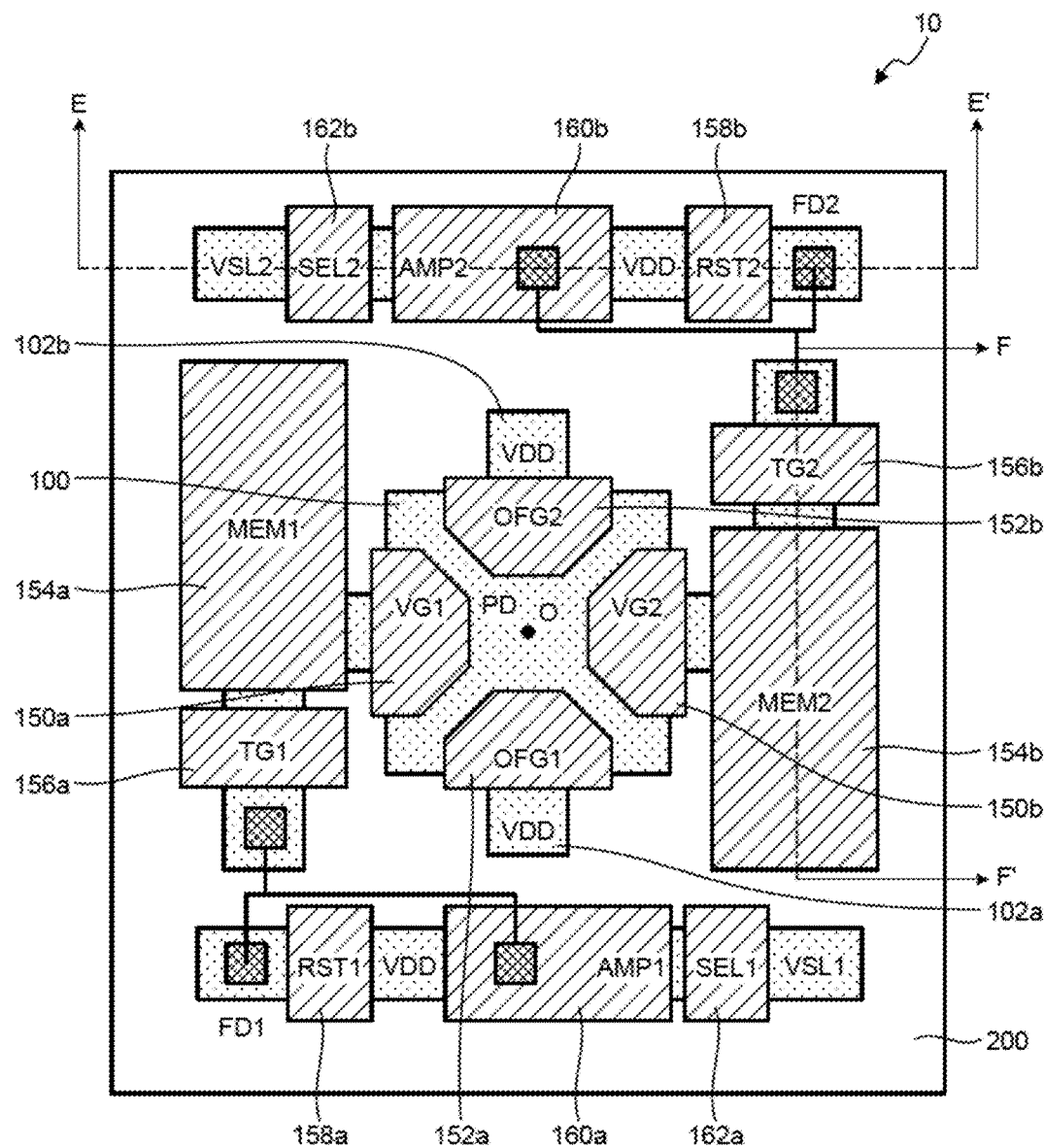
FIG. 57 is an explanatory diagram illustrating an example of a plan view configuration of the light receiving element 10 according to a third embodiment of the present disclosure.
Figure 58A:
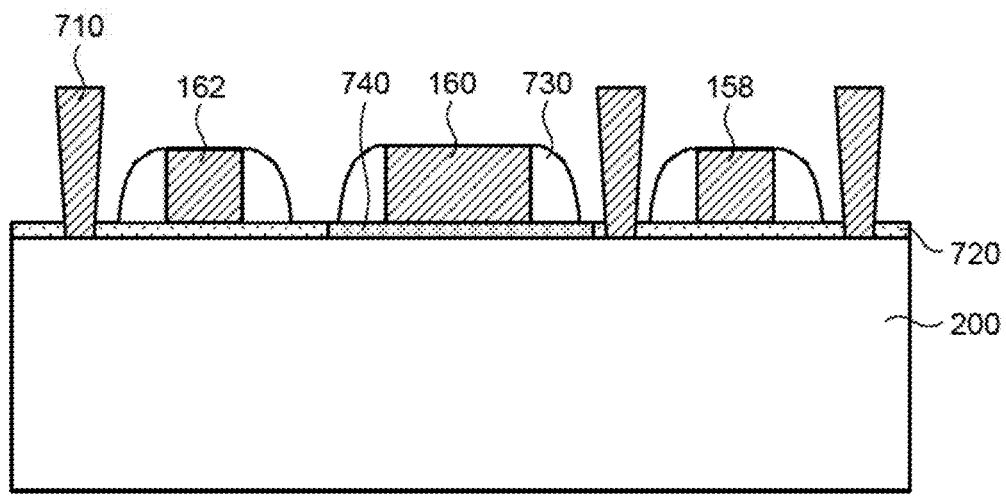
FIG. 58A is a cross-sectional view of the light receiving element 10 taken along line E-E' in FIG. 57.
Figure 58B:
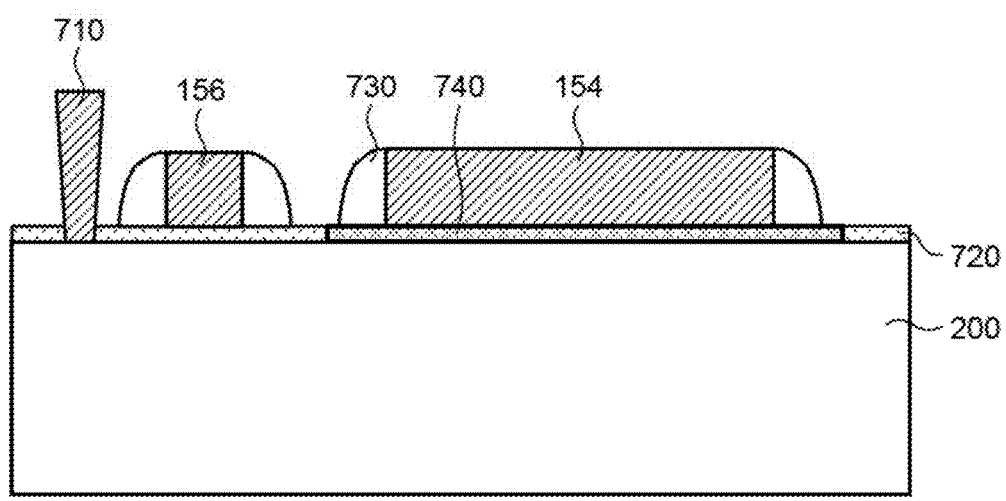
FIG. 58B is a cross-sectional view of the light receiving element 10 taken along line F-F' in FIG. 57.

Here, the electric charge storage units MEM1 and MEM2 and the amplifying transistors AMP1 and AMP2, having the insulating films including the high dielectric films according to the third embodiment of the present disclosure will be described with reference to FIGS. 57, 58A, and 58B. Note that FIG. 57 is an explanatory diagram illustrating an example of a plan view configuration of the light receiving element 10 according to the present embodiment, where the light receiving element 10 is viewed from above the surface of the semiconductor substrate 200. The light receiving element 10 of FIG. 57 is similar to the light receiving element 10 of the first embodiment. Furthermore, FIG. 58A is a cross-sectional view of the light receiving element 10 taken along line E-E' in FIG. 57, and FIG. 58B is a cross-sectional view of the light receiving element 10 taken along line F-F' in FIG. 57. Specifically, in each of FIGS. 58A and 58B, the upper side in the drawing is the front surface side of the semiconductor substrate 200, and the lower side in the drawing is the back surface side of the semiconductor substrate 200.

Specifically, in the present embodiment, for example, as illustrated in FIG. 58A, an insulating film (third insulating film) 740 positioned below the gate electrode 160 of the amplifying transistor AMP1 covered with the sidewall 730 includes the high dielectric film. Then, the insulating film 740 has a relative permittivity that is higher than that of the insulating film (third insulating film) 720 positioned below the gate electrode 158 of the reset transistor RST1 and the gate electrode 162 of the selection transistor SEL1.

Furthermore, in the present embodiment, for example, as illustrated in FIG. 58B, an insulating film (first insulating film) 740 positioned below the electrode 154 of the electric charge storage unit MEM1 covered with the sidewall 730 includes the high dielectric film. The insulating film 740 has a relative permittivity of that is higher than that of the insulating film (second insulating film) 720 positioned below the gate electrode 156 of the transfer transistor TG1.

Note that in the present embodiment, the insulating film 740 positioned below the gate electrode 160 of the amplifying transistor AMP1 and the insulating film 740 positioned below the electrode 154 of the electric charge storage unit MEM1 may be formed of the same material.

More specifically, in the present embodiment, the high dielectric film includes a material having a relative permittivity that is higher than the relative permittivity (3.9) of a silicon oxide ($SiO_2$) and is preferably a material having a relative permittivity of 4 or more. In the present embodiment, for example, the high dielectric film is a metal oxide film, and can be formed of a material such as $Al_2O_3$, HfSiON, $Y_2O_3$, $Ta_2O_5$, $La_2O_3$, $TiO_2$, $HfO_2$, $ZrO_2$, or $HfZrO_2$.

When the high dielectric film is used as the insulating film 740, a metal material such as TiN, TaN, or NiSi may be used as a material forming the gate electrodes 150, 152, 154, 156, 158, 160, and 162, in order to adjust Vth (threshold voltage).

Furthermore, in the present embodiment, the insulating film 740 positioned below the gate electrode 160 of the amplifying transistor AMP1 and the insulating film 740 positioned below the electrode 154 of the electric charge storage unit MEM1 are preferably wider than the gate electrode 160 and the electrodes 154 to an extent that adjacent elements are not interfered, when viewed from above the semiconductor substrate 200.

Note that, the present embodiment is not limited to forming only the insulating films 740 of the electric charge storage units MEM1 and MEM2 and the gate insulating films 740 of the amplifying transistors AMP1 and AMP2 by using the high dielectric film. In the present embodiment, only the insulating film 740 of the electric charge storage units MEM1 and MEM2 may be formed of the high dielectric film, and the insulating film 720 that makes contact with the gate electrodes 150, 152, 154, 156, 158, 160, and 162 and the electrode 154 of the elements (electric charge storage units MEM, transfer transistors TG, distribution transistors VG, discharge transistor OFG, amplifying transistor AMP, reset transistor RST, and selection transistor SEL) on the light receiving element 10 may be formed of the high dielectric film.

As described above, according to the present embodiment, forming the insulating film 740 of the electric charge storage units MEM, the gate insulating film 740 of the amplifying transistors AMP, or the like by using the high dielectric film makes it possible to achieve both of the increase of the capacitance of the electric charge storage units MEM and the reduction of the random noise of the amplifying transistors AMP without reducing the film thickness thereof, as compared with using $SiO_2$. Accordingly, the configuration of the present embodiment is applied to the configurations of the first embodiment that has a symmetrical layout. Therefore, it is possible to accurately form the insulating film 720 including the high dielectric film. Thus, in addition to the effect of improving the distance measurement accuracy of the distance measurement module 1 caused by electric charges uniformly collected into the electric charge storage units MEM1 and MEM2, the capacitances of the electric charge storage units MEM1 and MEM2 are increased and the random noise of the transistors is reduced. Therefore, it is possible to further improve the distance measurement accuracy of the distance measurement module 1. Note that the present embodiment can be implemented in combination with the first embodiment described above and the modifications thereof.

9. Conclusion

As described above, in the embodiments of the present disclosure and the modifications thereof, the plan view configurations of the light receiving element 10 show that the gate electrodes of the distribution transistors VG1 and VG2 are provided at positions axially symmetric to each other with respect to the center line extending so as to pass through the center of the photodiode PD. In the embodiment of the present disclosure, adopting the plan view configurations as described above, even if variation in manufacturing occurs, the gate electrodes provided at the same (substantially the same) distance to the photodiode PD make the performance of distributing the electric charges becomes substantially equal between the distribution transistor VG1 and the distribution transistor VG2. Therefore, even if the variation in manufacturing occurs, the distribution transistors VG1 and VG2 are readily formed uniformly in all light receiving elements 10, and it is possible to avoid a situation in which each light receiving element 10 has a difference in performance between the distribution transistor VG1 and the distribution transistor VG2. Accordingly, in the embodiment of the present disclosure, the electric charges collected in the electric charge storage units MEM1 and MEM2 become uniform in the light receiving elements 10. Therefore the distance measurement module 1 can ensure high distance measurement accuracy.

While the present disclosure has described embodiments and modifications thereof, application examples, the present disclosure is not limited to the embodiments described above, and various modifications and alterations or combinations are possible. Note that the effects described herein are merely examples. The effects of the present disclosure are not limited to the effects described herein. The present disclosure may have effects other than those described herein.

It should be noted that in the embodiments of the present disclosure and the modifications thereof described above, the conductivity types of the semiconductor regions described above may be reversed, and for example, the present embodiments and the modifications are applicable to an element using holes as the electric charges instead of electrons.

Furthermore, in the embodiments of the present disclosure and the modifications thereof described above, the semiconductor substrate is not necessarily a silicon substrate, and may be another substrate (e.g., a silicon on insulator (SOI) substrate, a SiGe substrate, or the like). In addition, the semiconductor substrate may have a semiconductor structure or the like formed on such various substrates.

Furthermore, in the embodiments of the present disclosure and the modifications thereof described above, the light receiving element 10 may be formed on one chip together with the light emitting unit, the processing circuit, and the like, or the light receiving element 10 may be provided in one package, but not particularly limited thereto.

In the embodiments of the present disclosure and modifications thereof, examples of a method of forming each layer, film, element, and the like described above includes a physical vapor deposition (PVD) method, and a chemical vapor deposition (CVD) method. Examples of the PVD method include a vacuum vapor deposition method using resistance heating or high-frequency heating, an electron beam (EB) vapor deposition method, various sputtering methods (magnetron sputtering method, radio frequency (RF)-direct current (DC) coupled mode bias sputtering method, electron cyclotron resonance (ECR) sputtering method, facing target sputtering method, high-frequency sputtering method, and the like), an ion plating method, a laser ablation method, a molecular beam epitaxy (MBE) method, a laser transfer method, and the like. Examples of the CVD method include a plasma CVD method, a thermal CVD method, a metal organic (MO) CVD method, and a photo CVD method. Furthermore, examples of other methods include an electrolytic plating method, an electroless plating method, and a spin coating method; a dipping method; a casting method; a micro-contact printing; a drop casting method; various printing methods, such as a screen printing method, an inkjet printing method, an offset printing method, a gravure printing method, and a flexographic printing method; a stamping method; a spray method; and various coating methods, such as an air doctor coating method, a blade coater method, a rod coater method, a knife coater method, a squeeze coating method, a reverse roll coater method, a transfer roll coater method, a gravure coating method, a kiss coating method, a cast coating method, a spray coating method, a slit orifice coater method, and a calender coating method. Furthermore, examples of a patterning method for each layer include chemical etching, such as shadow masking, laser transfer, and photolithography, and physical etching using ultraviolet rays, laser, or the like. In addition, examples of the planarization technique include a chemical mechanical polishing (CMP) method, a laser planarization method, and a reflow method. In other words, the elements according to the embodiments of the present disclosure and the modifications thereof can be readily and inexpensively manufactured by using an existing semiconductor device manufacturing process.

10. Configuration Example of Electronic Device

Note that the light receiving element 10 is applicable not only to the distance measurement module 1 as described above but also, for example, to various electronic devices such as a camera having a distance measurement function and a smartphone having a distance measurement function.

Figure 59:
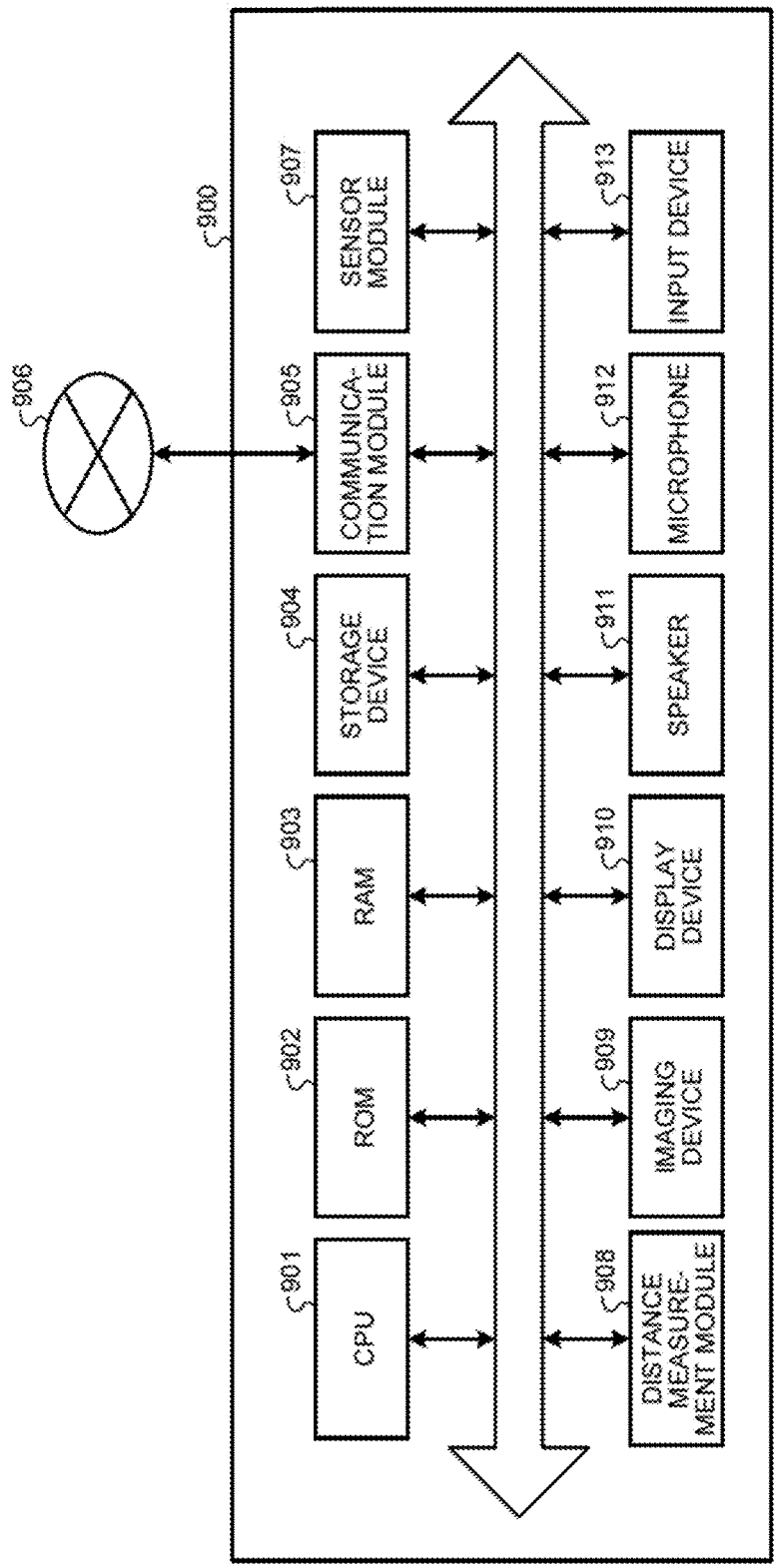
FIG. 59 is a block diagram illustrating a configuration example of a smartphone 900, as an electronic device, to which the distance measurement module 1 according to an embodiment of the present disclosure is applied.

Therefore, a configuration example of a smartphone 900 as an electronic device to which the present technology is applied will be described with reference to FIG. 59. FIG. 59 is a block diagram illustrating the configuration example of the smartphone 900, as the electronic device, to which the distance measurement module 1 according to an embodiment of the present disclosure is applied.

As illustrated in FIG. 59, the smartphone 900 includes a central processing unit (CPU) 901, a read only memory (ROM) 902, and a random access memory (RAM) 903. In addition, the smartphone 900 includes a storage device 904, a communication module 905, and a sensor module 907. Furthermore, the smartphone 900 includes a distance measurement module 908 to which the distance measurement module 1 described above is applicable, and further, includes an imaging device 909, a display device 910, a speaker 911, a microphone 912, an input device 913, and a bus 914. Furthermore, the smartphone 900 may include a processing circuit such as a digital signal processor (DSP) instead of or in addition to the CPU 901.

The CPU 901 functions as an arithmetic processing unit and a control device, and controls all or part of the operation in the smartphone 900, according to various programs recorded in the ROM 902, the RAM 903, the storage device 904, or the like. The ROM 902 stores programs, calculation parameters, or the like used by the CPU 901. The RAM 903 primarily stores the programs used in execution of the CPU 901 or parameters or the like that change appropriately in the execution of the programs. The CPU 901, the ROM 902, and the RAM 903 are connected to each other by the bus 914. Furthermore, the storage device 904 is a data storage device configured as an example of a storage unit of the smartphone 900. The storage device 904 includes, for example, a magnetic storage device such as a hard disk drive (HDD), a semiconductor storage device, an optical storage device, or the like. The storage device 904 stores the programs executed by the CPU 901, various data, various data acquired from outside, or the like.

The communication module 905 is a communication interface that includes, for example, a communication device or the like for connection to a communication network 906. The communication module 905 may be, for example, a wired or wireless local area network (LAN), Bluetooth (registered trademark), a communication card for a wireless USB (WUSB), or the like. Furthermore, the communication module 905 may be a router for optical communication, a router for an asymmetric digital subscriber line (ADSL), a modem for various communications, or the like. The communication module 905, for example, transmits/receives signals and the like to and from the Internet or another communication device by using a predetermined protocol such as TCP/IP. Furthermore, the communication network 906 connected to the communication module 905 is a network connected in a wired or wireless manner, and is, for example, the Internet, a home LAN, infrared communication, satellite communication, or the like.

The sensor module 907 includes, for example, various sensors such as a motion sensor (e.g., an acceleration sensor, a gyroscope sensor, a geomagnetic sensor, etc.), a biological information sensor (e.g., a pulse sensor, a blood pressure sensor, a fingerprint sensor, etc.), or a position sensor (e.g., a global navigation satellite system (GNSS) receiver, etc.).

The distance measurement module 908 is provided on the surface of the smartphone 900, and is configured to acquire, for example, an uneven shape or movement of the user's fingertip, palm, face, or the like facing the surface as a distance measurement result. Such a distance measurement result can be used for authentication of the user and recognition of a gesture of the user. Furthermore, the distance measurement module 908 is also configured to acquire, for example, a distance from the smartphone 900 to the target 800 or three-dimensional shape data about the surface of the target 800.

The imaging device 909 is provided on the surface of the smartphone 900, and is configured to image the target 800 or the like positioned around the smartphone 900. Specifically, the imaging device 909 can include an imaging element (not illustrated) such as a complementary MOS (CMOS) image sensor, and a signal processing circuit (not illustrated) that performs imaging signal processing on a signal obtained by photoelectric conversion performed by the imaging element. Furthermore, the imaging device 909 can further include an optical system mechanism (not illustrated) that includes an imaging lens, a diaphragm mechanism, a zoom lens, a focusing lens, and the like, and a drive system mechanism (not illustrated) that controls the operation of the optical system mechanism. Then, the imaging element collects incident light from the target 800, as an optical image, and the signal processing circuit photoelectrically converts the formed optical image in units of pixels, reads a signal of each pixel as an imaging signal, and performs image processing to acquire a captured image.

The display device 910 is provided on a surface of the smartphone 900, and can be a display device such as a liquid crystal display (LCD) or organic electro luminescence (EL) display. The display device 910 is configured to display an operation screen, the captured image acquired by the imaging device 909 described above, and the like.

The speaker 911 is configured to output, for example, call voice, voice accompanying image content displayed by the display device 910 described above, and the like to the user.

The microphone 912 is configured to collect, for example, a call voice of the user, a voice including a command for activating a function of the smartphone 900, and sound in a surrounding environment of the smartphone 900.

The input device 913 is a device such as a button, touch panel, or mouse that is operated by the user. The input device 913 includes an input control circuit that generates an input signal on the basis of information input by the user and outputs the input signal to the CPU 901. The user can operate the input device 913 to input various data to the smartphone 900 or give an instruction for processing operation.

The configuration example of the smartphone 900 has been described above. Each of the component elements described above may use a general-purpose member, or may include hardware specialized for the function of each component element. Such a configuration can be appropriately changed according to a technical level of current implementation.

11. Example of Application to Endoscopic Surgical System

The technology according to the present disclosure (the present technology) is applicable to various products. For example, the technology according to the present disclosure may be applied to an endoscopic surgical system.

Figure 60:
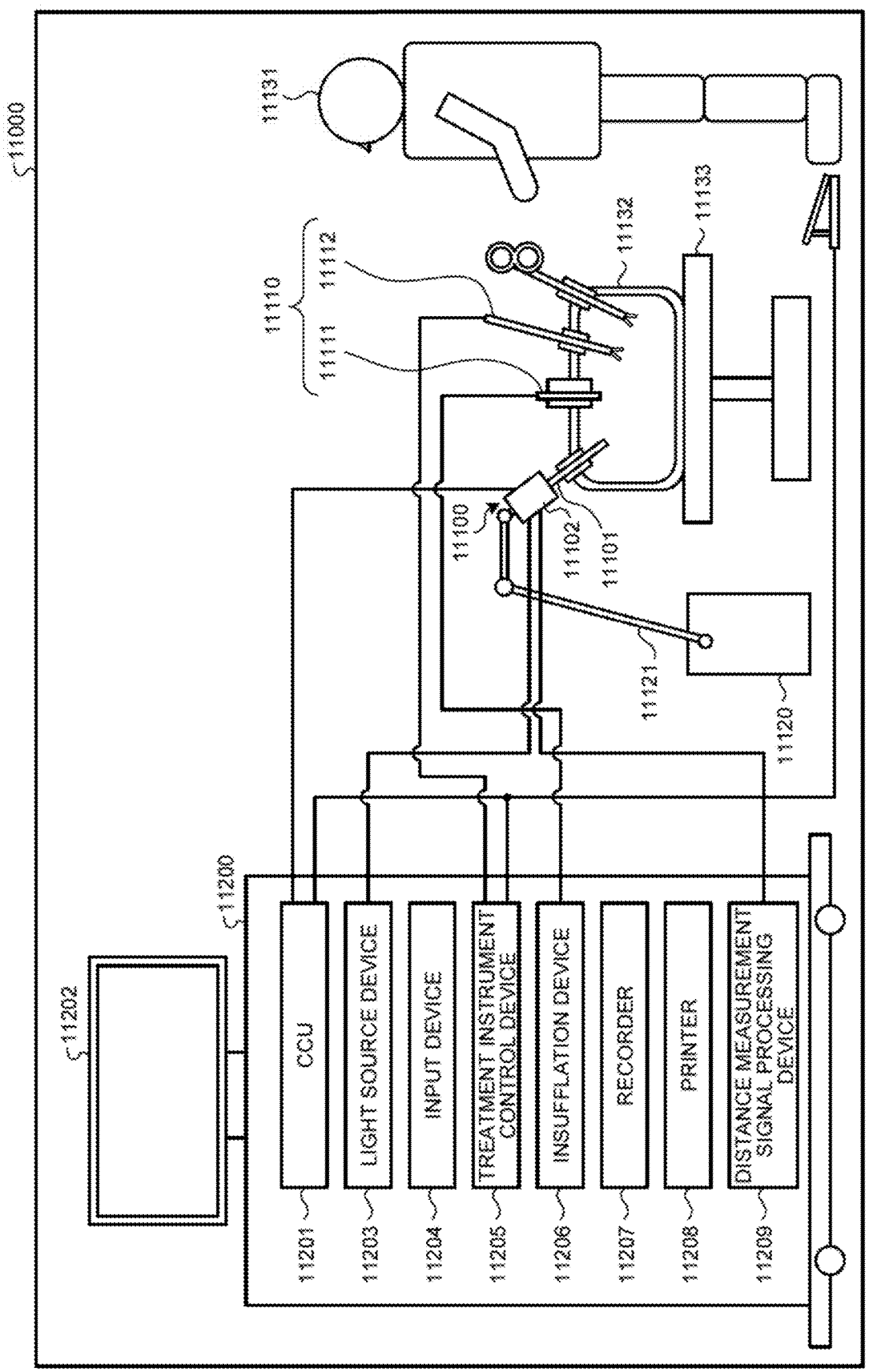
FIG. 60 is a diagram illustrating an example of a schematic configuration of an endoscopic surgical system.

FIG. 60 is a diagram illustrating an example of a schematic configuration of the endoscopic surgical system to which the technology according to the present disclosure (the present technology) is applicable.

FIG. 60 illustrates a state in which an operator (surgeon) 11131 is performing surgery on a patient 11132 lying on a patient bed 11133 by using the endoscopic surgical system 11000. As illustrated in the drawing, the endoscopic surgical system 11000 includes an endoscope 11100, the other surgical instruments 11110 such as an insufflation tube 11111 and an energy treatment instrument 11112, a support arm device 11120 that supports the endoscope 11100, and a cart 11200 on which various devices for endoscopic surgery are mounted.

The endoscope 11100 includes a lens barrel 11101 that has a region having a predetermined length from the distal end and inserted into the body cavity of the patient 11132, and a camera head 11102 that is connected to the proximal end of the lens barrel 11101. In the example, the endoscope 11100 configured as a so-called rigid endoscope having the lens barrel 11101 that is rigid is illustrated, but the endoscope 11100 may be configured as a so-called flexible endoscope having a flexible lens barrel.

An opening portion into which an objective lens is fitted is provided at the distal end of the lens barrel 11101. A light source device 11203 is connected to the endoscope 11100, light generated by the light source device 11203 is guided to the distal end of the lens barrel 11101 by a light guide extending into the lens barrel 11101, and the light is emitted toward an observation target in the body cavity of the patient 11132 via the objective lens. Note that the endoscope 11100 may be a forward-viewing endoscope, an oblique-viewing endoscope, or a side-viewing endoscope. Furthermore, the light emitting unit 20 and the light receiving unit 30 of the distance measurement module 1 according to an embodiment of the present disclosure may be built in the distal end of the lens barrel 11101. Mounting of part of such a distance measurement module 1 makes it possible to further improve the accuracy of the surgery by referring to distance information from the distance measurement module 1 in addition to the surgery visually performed by the doctor.

Figure 61:
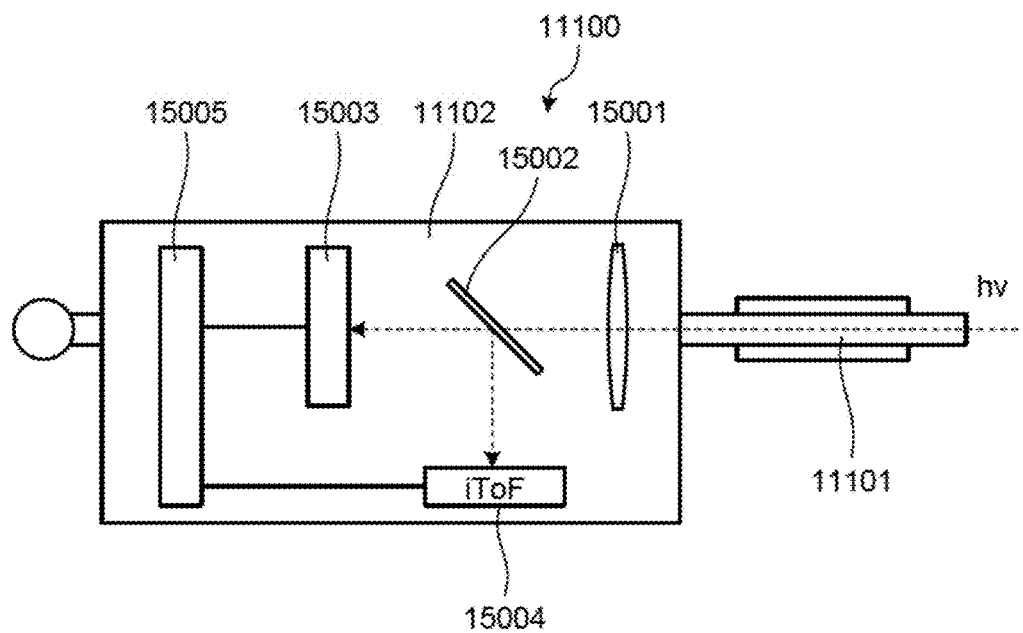
FIG. 61 is a diagram illustrating an example of a configuration of an endoscope.

For example, as in the configuration of FIG. 61 illustrating an example of a configuration of the endoscope 11100, an iToF sensor 15004 that is the light emitting unit 20 and the light receiving unit 30 of the distance measurement module 1 according to an embodiment of the present disclosure is provided in the camera head 11102. Specifically, the reflected light (observation light) from the observation target passes through the lens barrel 11101, is collected by a lens 15001 in the camera head 11102, is reflected by a half mirror 15002, and is received by the iToF sensor 15004. Furthermore, the observation light is photoelectrically converted by the iToF sensor 15004, an electric signal corresponding to the observation light is generated and stored in a memory 15005, and then, the electric signal is transmitted to a distance measurement signal processing device 11209 which is described later.

Furthermore, as illustrated in FIG. 61, an imaging element 15003 is provided inside the camera head 11102, and the reflected light (observation light) from the observation target passes through the lens barrel 11101, is collected by the lens 15001, is reflected by the half mirror 15002, and is received by the imaging element 15003. The observation light is photoelectrically converted by the imaging element 15003, and an electric signal corresponding to the observation light, that is, an image signal corresponding to an observation image is generated. The image signal is once stored in the memory 15005 and then transmitted as RAW data to a camera control unit (CCU) 11201.

The CCU 11201 includes a central processing unit (CPU), a graphics processing unit (GPU), and the like, and integrally controls the operation of the endoscope 11100 and a display device 11202. Furthermore, the CCU 11201 receives the image signal from the camera head 11102, and performs, on the image signal, various image processing, such as development processing (demosaic processing), for displaying an image based on the image signal.

The display device 11202 displays the image based on the image signal subjected to the image processing by the CCU 11201, in response to the control from the CCU 11201.

The light source device 11203 includes, for example, a light source such as a light emitting diode (LED), and supplies illumination light for imaging a surgical site or the like, to the endoscope 11100.

An input device 11204 is an input interface for the endoscopic surgical system 11000. The user is allowed to input various information or instructions to the endoscopic surgical system 11000 via the input device 11204. For example, the user inputs an instruction or the like for changing conditions of imaging (type of illumination light, magnification, focal length, etc.) by the endoscope 11100.

A treatment instrument control device 11205 controls drive of the energy treatment instrument 11112 for cauterization or incision of tissue, blood vessel sealing, or the like. An insufflation device 11206 feeds gas into the body cavity of the patient 11132 via the insufflation tube 11111 to inflate the body cavity, for the purpose of ensuring the field of view of the endoscope 11100 and ensuring a working space for the operator. A recorder 11207 is a device configured to record various information relating to surgery. A printer 11208 is a device configured to print the various information regarding surgery in various formats such as text, image, or graph. The distance measurement signal processing device 11209 is a device that is provided with the control unit 40 and the processing unit 60 of the distance measurement module 1 according to an embodiment of the present disclosure and is configured to acquire the distance information.

Note that the light source device 11203 supplying to the endoscope 11100 the illumination light for imaging the surgical site can include, for example, LED, a laser light source, or a white light source including a combination thereof. The white light source including a combination of RGB laser light sources makes it possible to highly precisely control the output intensity and output timing of each color (each wavelength), and thereby the white balance of a captured image can be adjusted in the light source device 11203. Furthermore, in this configuration, irradiating the observation target with laser light beams from the RGB laser light sources in a time division manner and controlling the drive of the imaging element of the camera head 11102 in synchronization with the irradiation timing also make it possible to capture images corresponding to RGB in the time division manner. According to this method, a color image can be obtained without providing a color filter for the imaging element.

Furthermore, the driving of the light source device 11203 may be controlled so as to change the intensity of light to be output every predetermined time. The drive of the imaging element of the camera head 11102 is controlled in synchronization with the timing of the change in the intensity of light, images are thereby acquired in a time division manner and combined. Therefore, an image with high dynamic range can be generated without so-called underexposed and overexposed images.

Furthermore, the light source device 11203 may be configured to supply light in a predetermined wavelength band for observation with special light. In the observation with special light, for example, so-called narrow band imaging is performed in which wavelength dependence of light absorption in body tissue is used in irradiation of light in a band narrower than that of the illumination light (i.e., white light) used in normal observation, and thereby an image of a predetermined tissue such as a blood vessel in a mucosal surface is captured with high contrast. Alternatively, in the observation with special light, fluorescence observation for obtaining an image of fluorescence generated by irradiation with excitation light may be performed. In the fluorescence observation, it is possible, for example, to irradiate a body tissue with excitation light to observe fluorescence from the body tissue (auto-fluorescence imaging), or to locally inject a reagent such as indocyanine green (ICG) into the body tissue and irradiate the body tissue with excitation light corresponding to the fluorescence wavelength of the reagent to obtain a fluorescent image. The light source device 11203 is configured to supply light in a narrow band and/or excitation light for such observation with special light.

Figure 62:
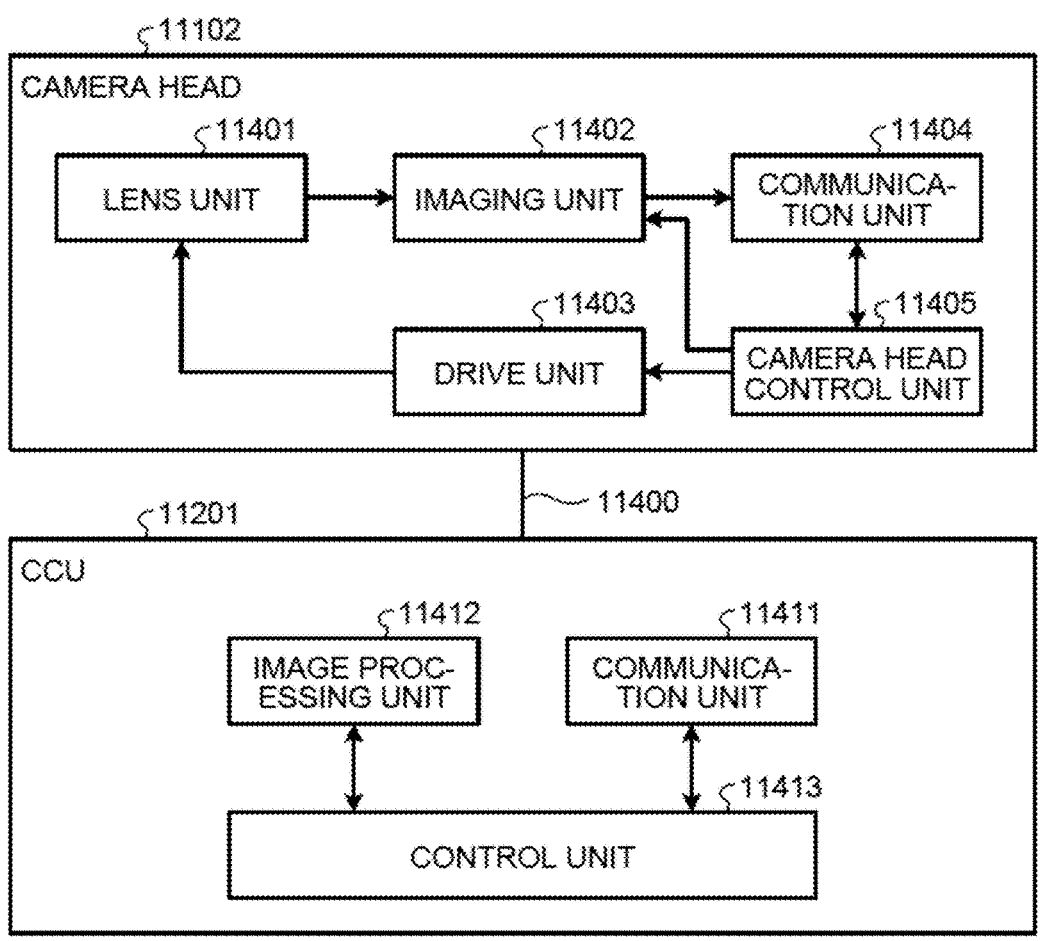
FIG. 62 is a block diagram illustrating an example of a functional configuration of a camera head and a CCU.

FIG. 62 is a block diagram illustrating an example of a functional configuration of the camera head 11102 and the CCU 11201 that are illustrated in FIG. 60.

The camera head 11102 includes a lens unit 11401, an imaging unit 11402, a drive unit 11403, a communication unit 11404, and a camera head control unit 11405. The CCU 11201 has a communication unit 11411, an image processing unit 11412, and a control unit 11413. The camera head 11102 and the CCU 11201 are communicably connected to each other by a transmission cable 11400.

The lens unit 11401 is an optical system provided at a connection portion with the lens barrel 11101. The observation light captured from the distal end of the lens barrel 11101 is guided to the camera head 11102 and incident on the lens unit 11401. The lens unit 11401 is configured by combining a plurality of lenses including a zoom lens and a focusing lens.

One imaging element (so-called single imaging element) or a plurality of imaging elements (so-called multiple imaging elements) may be employed to constitute the imaging unit 11402. In a case where the imaging unit 11402 includes the multiple imaging elements, for example, the image signals may be generated corresponding to RGB by the respective imaging elements so that a color image may be obtained by combining the image signals. Alternatively, the imaging unit 11402 may include a pair of imaging elements to acquire the image signals for the right eye and the left eye corresponding to three-dimensional (3D) display. The 3D display makes it possible for the operator 11131 to more accurately grasp the depth of biological tissue in the surgical site. Note that, in a case where the imaging unit 11402 includes the multiple imaging elements, a plurality of lens units 11401 can be provided for the imaging elements as well.

Furthermore, the imaging unit 11402 may not be necessarily provided in the camera head 11102. For example, the imaging unit 11402 may be provided immediately next to the objective lens, in the lens barrel 11101.

The drive unit 11403 includes an actuator to move the zoom lens and the focusing lens of the lens unit 11401 by a predetermined distance along an optical axis, by the control from the camera head control unit 11405. This configuration makes it possible to appropriately adjust the magnification and focal point of the captured image captured by the imaging unit 11402.

The communication unit 11404 includes a communication device for transmitting and receiving various information to and from the CCU 11201. The communication unit 11404 transmits the image signal obtained from the imaging unit 11402 as the RAW data to the CCU 11201 via the transmission cable 11400.

Furthermore, the communication unit 11404 receives a control signal for controlling the drive of the camera head 11102 from the CCU 11201, and supplies the control signal to the camera head control unit 11405. The control signal includes, for example, information about imaging conditions, such as information specifying a frame rate of the captured image, information specifying an exposure value in imaging, and/or information specifying the magnification and focal point of the captured image.

Note that the imaging conditions such as the frame rate, exposure value, magnification, and focal point may be appropriately specified by the user, or may be automatically set by the control unit 11413 of the CCU 11201 on the basis of the acquired image signal. In the latter case, the endoscope 11100 has a so-called auto exposure (AE) function, auto focus (AF) function, and auto white balance (AWB) function.

The camera head control unit 11405 controls the drive of the camera head 11102 on the basis of the control signal received from the CCU 11201 via the communication unit 11404.

The communication unit 11411 includes a communication device for transmitting and receiving various information to and from the camera head 11102. The communication unit 11411 receives the image signal transmitted from the camera head 11102 via the transmission cable 11400.

Furthermore, the communication unit 11411 transmits the control signal for controlling the drive of the camera head 11102, to the camera head 11102. The image signal and the control signal are configured to be transmitted by electric communication, optical communication, or the like.

The image processing unit 11412 performs various image processing on the image signal as the RAW data transmitted from the camera head 11102.

The control unit 11413 performs various control relating to imaging of the surgical site or the like by the endoscope 11100 and display of the captured image obtained by imaging the surgical site or the like. For example, the control unit 11413 generates the control signal for controlling the drive of the camera head 11102.

Furthermore, the control unit 11413 causes the display device 11202 to display the captured image showing the surgical site or the like, on the basis of the image signal subjected to the image processing by the image processing unit 11412. At this time, the control unit 11413 may recognize various objects in the captured image by using various image recognition technologies. For example, the control unit 11413 detects the edge shape, the color, or the like of each of the objects in the captured image. Thereby, a surgical instrument such as forceps, a specific biological portion, bleeding, mist generated in using the energy treatment instrument 11112, and the like are allowed to be recognized. When the control unit 11413 causes the display device 11202 to display the captured image, the control unit 11413 may cause the display device 11202 to display various surgery support information on the image of the surgical site by using a result of the recognition. Display of the surgery support information on the image for presentation to the operator 11131 makes it possible to reduce a burden on the operator 11131 or ensure surgery by the operator 11131.

The transmission cable 11400 connecting the camera head 11102 and the CCU 11201 is an electric signal cable supporting the electric signal communication, an optical fiber supporting optical communication, or a composite cable thereof.

Here, in the example, communication performed in a wired manner by using the transmission cable 11400 is illustrated, but communication between the camera head 11102 and the CCU 11201 may be performed in a wireless manner.

The example of the endoscopic surgical system to which the technology according to the present disclosure is applicable has been described. The technology according to the present disclosure is applicable to, for example, the imaging unit 11402 of the configurations described above. Specifically, the light receiving element 10 can be applied as a part of the configuration of the imaging unit 11402. The application of the technology according to the present disclosure, as a part of the configuration of the imaging unit 11402 makes it possible to measure a distance to the surgical site with high accuracy, and a clearer image of the surgical site can be obtained.

Note that, here, the example of the endoscopic surgical system has been described, but the technology according to the present disclosure may be further applied to, for example, a microscopic surgery system or the like.

12. Example of Application to Mobile Object

The technology according to the present disclosure (the present technology) is applicable to various products. For example, the technology according to the present disclosure may be implemented as a device mounted on any type of mobile object, such as an automobile, electric vehicle, hybrid electric vehicle, motorcycle, bicycle, personal mobility, airplane, drone, ship, robot, and the like.

Figure 63:
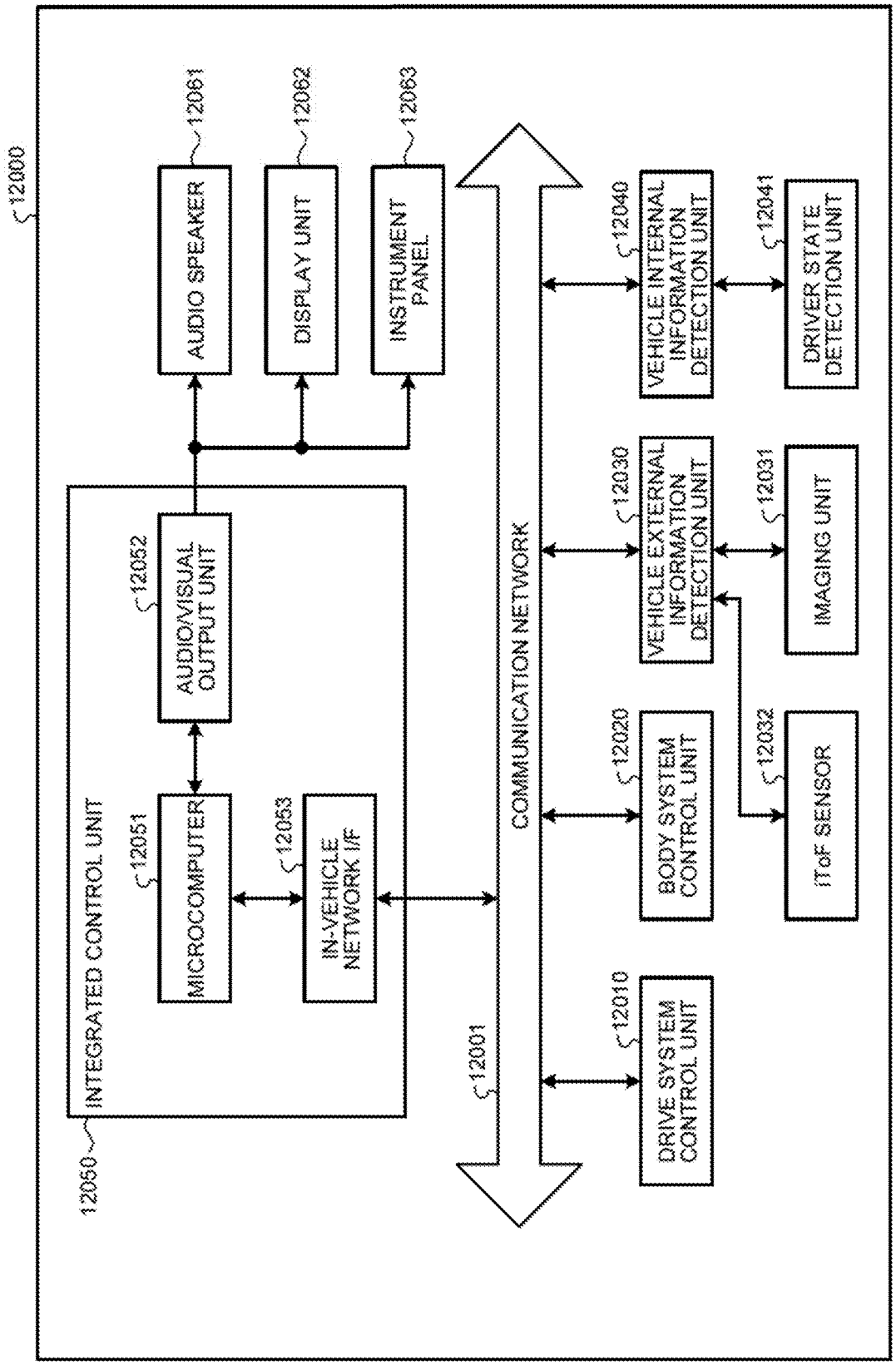
FIG. 63 is a block diagram illustrating an example of a schematic configuration of a vehicle control system.

FIG. 63 is a block diagram illustrating an example of a schematic configuration of a vehicle control system as an example of a mobile object control system to which the technology according to the present disclosure is applicable.

The vehicle control system 12000 includes a plurality of electronic control units that is connected via a communication network 12001. In the example illustrated in FIG. 63, the vehicle control system 12000 includes a drive system control unit 12010, a body system control unit 12020, a vehicle external information detection unit 12030, a vehicle internal information detection unit 12040, and an integrated control unit 12050. Furthermore, as a functional configuration of the integrated control unit 12050, a microcomputer 12051, an audio/visual output unit 12052, and an in-vehicle network interface (I/F) 12053 are illustrated.

The drive system control unit 12010 controls the operations of devices relating to a vehicle drive system according to various programs. For example, the drive system control unit 12010 functions as a control device for a driving force generation device for generating a driving force of the vehicle, such as an internal combustion engine or a driving motor, a driving force transmission mechanism for transmitting the driving force to wheels, a steering mechanism for adjusting a steering angle of the vehicle, a braking device for generating a braking force of the vehicle, and the like.

The body system control unit 12020 controls operations of various devices mounted on a vehicle body according to various programs. For example, the body system control unit 12020 functions as a control device for a keyless entry system, smart key system, power window device, or various lamps such as a headlamp, back lamp, brake lamp, blinker, or fog lamp. In this case, the body system control unit 12020 is configured to receive an input of radio waves transmitted from a portable device that is substituted for a key, or signals of various switches. The body system control unit 12020 receives the input of these radio waves or signals and controls the door lock device, power window device, lamp, and the like of the vehicle.

The vehicle external information detection unit 12030 detects information outside the vehicle on which the vehicle control system 12000 is mounted. For example, an imaging unit 12031 is connected to the vehicle external information detection unit 12030. The vehicle external information detection unit 12030 causes the imaging unit 12031 to capture an image outside the vehicle and receives the captured image. The vehicle external information detection unit 12030 may perform object detection processing or distance detection processing for a person, vehicle, obstacle, sign, characters on a road surface, or the like, on the basis of the received image. For example, an iToF sensor 12032 is connected to the vehicle external information detection unit 12030. The iToF sensor 12032 is configured to function as the distance measurement module 1 according to an embodiment of the present disclosure.

The imaging unit 12031 is an optical sensor configured to receive light and output an electric signal according to an amount of the light received. The imaging unit 12031 is operable to output the electric signal as an image or to output the electric signal as distance measurement information. Furthermore, the light received by the imaging unit 12031 may be visible light or invisible light such as infrared light.

The vehicle internal information detection unit 12040 detects information inside the vehicle. For example, a driver state detection unit 12041 that detects a state of the driver is connected to the vehicle internal information detection unit 12040. The driver state detection unit 12041 may include, for example, a camera to image the driver, and the vehicle internal information detection unit 12040 may calculate a degree of fatigue or degree of concentration of the driver or may determine whether the driver is dozing off, on the basis of detected information input from the driver state detection unit 12041.

The microcomputer 12051 is configured to calculate a control target value for the drive force generation device, steering mechanism, or braking device on the basis of the information inside and outside the vehicle acquired by the vehicle external information detection unit 12030 or the vehicle internal information detection unit 12040, and output a control command to the drive system control unit 12010. Specifically, for example, the microcomputer 12051 is configured to execute cooperative control to achieve the function of advanced driver assistance system (ADAS), including vehicle collision avoidance or impact mitigation, following based on a distance between vehicles, driving while maintaining vehicle speed, vehicle collision warning, vehicle lane departure warning, or the like.

Furthermore, the microcomputer 12051 controls the drive force generation device, the steering mechanism, the braking device, or the like, on the basis of information around the vehicle acquired by the vehicle external information detection unit 12030 or the vehicle internal information detection unit 12040, for the cooperative control to achieve autonomous driving or the like without depending on the driver's operation.

Furthermore, the microcomputer 12051 is configured to output a control command to the body system control unit 12030, on the basis of the information outside the vehicle acquired by the vehicle external information detection unit 12030. For example, the microcomputer 12051 is configured to execute the cooperative control for antidazzle such as by controlling the headlamps according to the position of a preceding vehicle or oncoming vehicle detected by the vehicle external information detection unit 12030 and switching the headlamps from a high beam to a low beam.

The audio/visual output unit 12052 transmits an output signal of at least one of sound or an image to an output device that is configured to visually or audibly notify an occupant of the vehicle or the outside of the vehicle of information. In the example of FIG. 63, an audio speaker 12061, a display unit 12062, and an instrument panel 12063 are illustrated as the output device. The display unit 12062 may include, for example, at least one of an on-board display and a head-up display.

Figure 64:
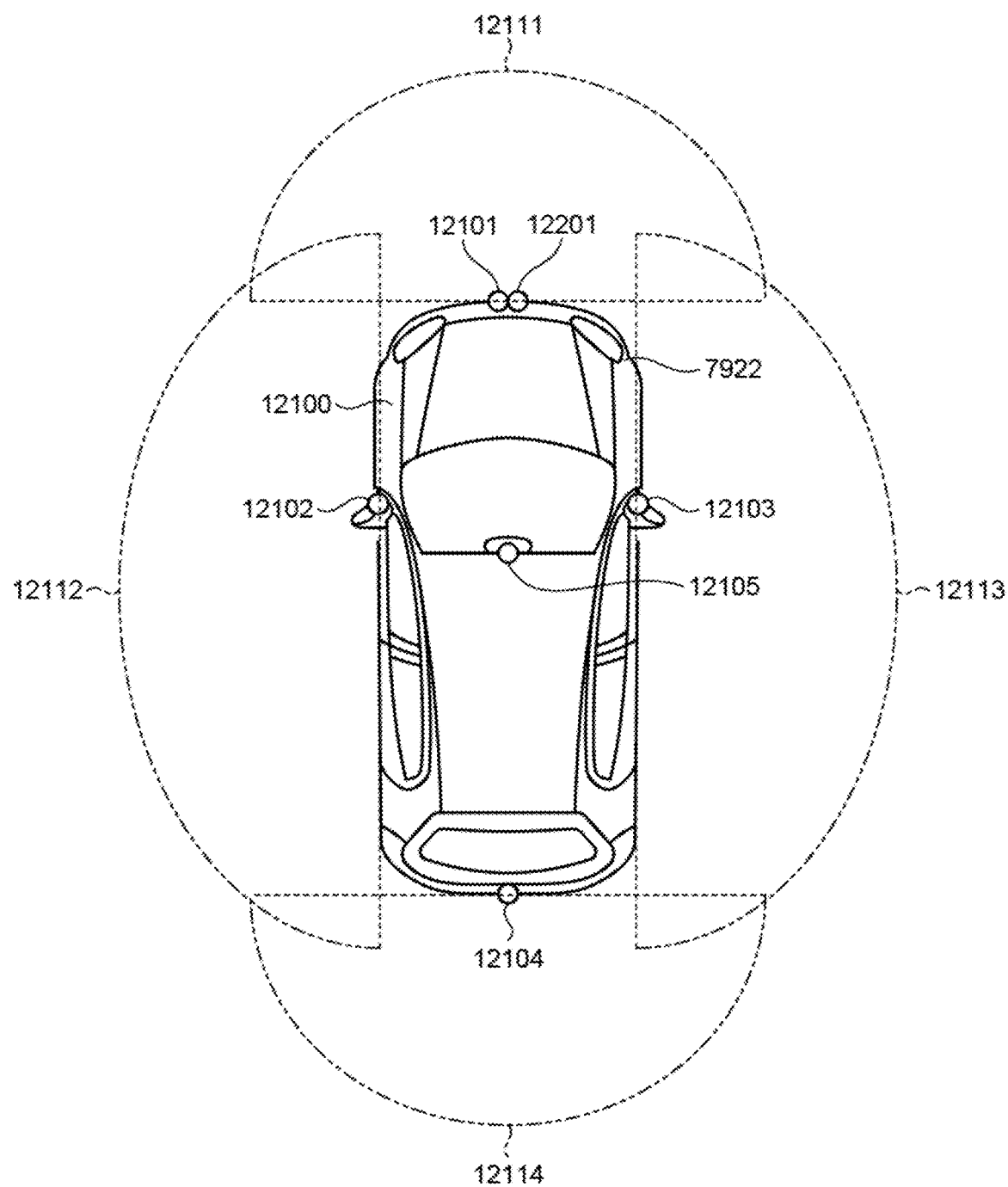
FIG. 64 is an explanatory diagram illustrating an example of installation positions of a vehicle external information detection unit and imaging units.

FIG. 64 is a diagram illustrating an example of installation positions of the imaging units 12031.

In FIG. 64, the imaging unit 12031 includes imaging units 12101, 12102, 12103, 12104, and 12105.

The imaging units 12101, 12102, 12103, 12104, and 12105 are provided at positions of a vehicle 12100, such as a front nose, side mirrors, a rear bumper, a back door, and an upper portion of a windshield on a vehicle interior side. The imaging unit 12101 that is provided at the front nose and the imaging unit 12105 provided at the upper portion of the windshield on the vehicle interior side each mainly acquire an image of an area in front of the vehicle 12100. The imaging units 12102 and 12103 that are provided at the side mirrors each mainly acquire an image of an area along a side of the vehicle 12100. The imaging unit 12104 that is provided at the rear bumper or the back door mainly acquires an image of an area behind the vehicle 12100. The imaging unit 12105 that is provided at the upper portion of the windshield on the vehicle interior side is mainly used to detect a preceding vehicle, pedestrian, obstacle, traffic light, traffic sign, lane, or the like. Furthermore, an iToF sensor module 12201 that internally includes the light emitting unit 20 and light receiving unit 30 of the distance measurement module 1 according to an embodiment of the present disclosure is provided, for example, at the front nose of the vehicle 12100.

Note that FIG. 64 illustrates an example of imaging ranges of the imaging units 12101 to 12104. An imaging range 12111 indicates the imaging range of the imaging unit 12101 provided at the front nose, imaging ranges 12112 and 12113 indicate the imaging ranges of the imaging units 12102 and 12103 provided at the respective side mirrors, and an imaging range 12114 indicates the imaging range of the imaging unit 12104 provided at the rear bumper or back door. For example, image data captured by the imaging units 12101 to 12104 are superposed on each other, and an overhead view image of the vehicle 12100 as viewed from above is obtained.

At least one of the imaging units 12101 to 12104 may have a function of acquiring the distance information. For example, at least one of the imaging units 12101 to 12104 may be a stereo camera including a plurality of imaging elements, or may be an imaging element having a pixel for phase difference detection.

For example, the microcomputer 12051 is configured to obtain a distance to each three-dimensional object in the imaging ranges 12111 to 12114 and a temporal change in the distance (relative speed to the vehicle 12100) on the basis of the distance information obtained from the imaging units 12101 to 12104, and extract, in particular, a nearest three-dimensional object on a travel path of the vehicle 12100 and traveling at a predetermined speed (e.g., 0 km/h or more) in substantially the same direction as the vehicle 12100, as the preceding vehicle. Furthermore, the microcomputer 12051 is configured to set a distance between the vehicles to be secured in advance with respect to the preceding vehicle, and perform automatic brake control (including following stop control), automatic acceleration control (including following start control), and the like. As described above, it is possible to execute cooperative control for the autonomous driving or the like without depending on the operation of the driver.

For example, on the basis of the distance information obtained from the imaging units 12101 to 12104, the microcomputer 12051 classifies three-dimensional object data about the three-dimensional objects into a two-wheeled motorcycle, ordinary motor vehicle, large-sized motor vehicle, pedestrian, power pole, and the other three-dimensional objects, extracts the classified three-dimensional object data, for use in automatic obstacle avoidance. For example, the microcomputer 12051 identifies the obstacles around the vehicle 12100 as an obstacle that is visible to a driver of the vehicle 12100 or an obstacle that is difficult for the driver to view. Then the microcomputer 12051 determines a collision risk that indicates the degree of risk of collision with each obstacle, and in a case where the risk of collision has a value equal to or more than a set value and there is a possibility of collision, the microcomputer 12051 outputs warning to the driver via the audio speaker 12061 or the display unit 12062, or performs forced deceleration or evasive steering via the drive system control unit 12010, performing driving assistance for collision avoidance.

At least one of the imaging units 12101 to 12104 may be an infrared camera detecting infrared light. For example, the microcomputer 12051 is configured to recognize the pedestrian by determining whether the pedestrian is shown in the captured images captured by the imaging units 12101 to 12104. Such recognition of the pedestrian is performed, for example, according to a procedure of extracting feature points in the captured images captured by the imaging units 12101 to 12104 as the infrared cameras, and a procedure of determining whether a sequence of the feature points indicating a contour of an object represents the pedestrian after pattern matching. When the microcomputer 12051 determines that the pedestrian is shown in the captured images captured by the imaging units 12101 to 12104 and recognizes the pedestrian, the audio/visual output unit 12052 causes the display unit 12062 to superpose and display a rectangular contour line on the recognized pedestrian to emphasize the recognized pedestrian. Furthermore, the audio/visual output unit 12052 may cause the display unit 12062 to display an icon or the like indicating the pedestrian, at a desired position.

An example of the vehicle control system to which the technology according to the present disclosure is applicable has been described above. The technology according to the present disclosure is applicable to the vehicle external information detection unit 12030 or the imaging unit 12031. Specifically, the light receiving element 10 or the distance measurement module 1 is applicable to a distance detection processing block of the vehicle external information detection unit 12030 or the imaging unit 12031. The application of the technology according to the present disclosure to the vehicle external information detection unit 12030 or the imaging unit 12031 makes it possible to highly accurately measure a distance to an object such as a person, car, obstacle, sign, or characters on a road surface, and the fatigue of the driver can be reduced or the safety of the driver or the vehicle can be enhanced using the obtained the distance information.

13. Supplementary Notes

Preferred embodiments of the present disclosure have been described above in detail with reference to the accompanying drawings, but the technical scope of the present disclosure is not limited to these examples. A person skilled in the art may obviously find various alternations and modifications within the technical concept described in claims, and it should be understood that the alternations and modifications will naturally come under the technical scope of the present disclosure.

Furthermore, the effects descried herein are merely explanatory or exemplary effects, and not limitative. In other words, the technology according to the present disclosure can achieve other effects that are apparent to those skilled in the art from the description herein, along with or instead of the above effects.

Note that the present technology can also employ the following configurations.

(1) A light receiving device comprising a light receiving unit that includes a plurality of light receiving elements arranged in a row direction and a column direction on a semiconductor substrate, wherein
    each of the light receiving elements includes:
      a first photoelectric conversion unit that converts light into electric charges;
      a first electric charge storage unit to which the electric charges are transferred from the first photoelectric conversion unit;
      a first distribution gate that distributes the electric charges from the first photoelectric conversion unit to the first electric charge storage unit;
      a second electric charge storage unit to which the electric charges are transferred from the first photoelectric conversion unit; and
      a second distribution gate that distributes the electric charges from the first photoelectric conversion unit to the second electric charge storage unit, and
    the first and second distribution gates are provided at positions axially symmetric to each other with respect to a first center axis extending so as to pass through the center of the first photoelectric conversion unit, in a direction intersecting the column direction at a predetermined angle, when viewed from above the semiconductor substrate.

(2) The light receiving device according to (1), wherein the predetermined angle is 45 degrees.

(3) A light receiving device comprising a light receiving unit that includes a plurality of light receiving elements arranged in a row direction and a column direction on a semiconductor substrate, wherein
    each of the light receiving elements includes:
      a first photoelectric conversion unit that converts light into electric charges;
      a first electric charge storage unit to which the electric charges are transferred from the first photoelectric conversion unit;
      a first distribution gate that distributes the electric charges from the first photoelectric conversion unit to the first electric charge storage unit;
      a second electric charge storage unit to which the electric charges are transferred from the first photoelectric conversion unit; and
      a second distribution gate that distributes the electric charges from the first photoelectric conversion unit to the second electric charge storage unit, and the first and second distribution gates are provided at positions axially symmetric to each other with respect to a first center axis extending so as to pass through the center of the first photoelectric conversion unit, in the column direction, when viewed from above the semiconductor substrate.

(4) The light receiving device according to any one of (1) to (3), wherein
each of the light receiving elements further includes first and second discharge gates that discharge the electric charges in the first photoelectric conversion unit, and
the first and second discharge gates are provided at positions axially symmetric to each other with respect to a second center axis orthogonal to the first center axis so as to pass through the center of the first photoelectric conversion unit, when viewed from above the semiconductor substrate.

(5) The light receiving device according to (4), wherein any of the first and second distribution gates or the first and second discharge gates include one or a plurality of buried gate portions in the semiconductor substrate.

(6) The light receiving device according to (4), wherein the first and second electric charge storage units are provided at positions point-symmetric to each other with respect to the center of the first photoelectric conversion unit, when viewed from above the semiconductor substrate.

(7) The light receiving device according to (3), wherein each of the light receiving elements further includes a third discharge gate that discharges the electric charges in the first photoelectric conversion unit, and
the center of the third discharge gate is positioned on the first center axis, when viewed from above the semiconductor substrate.

(8) The light receiving device according to (7), wherein when viewed from above the semiconductor substrate,
a first line segment connecting the center of the first distribution gate and the center of the first photoelectric conversion unit, and a second line segment connecting the center of the second distribution gate and the center of the first photoelectric conversion unit are orthogonal to the first center axis.

(9) The light receiving device according to (7), wherein when viewed from above the semiconductor substrate,
the first line segment connecting the center of the first distribution gate and the center of the first photoelectric conversion unit forms an acute angle with the first center axis, and
the second line segment connecting the center of the second distribution gate and the center of the first photoelectric conversion unit forms an acute angle with the first center axis.

(10) The light receiving device according to (9), wherein the first and second electric charge storage units are provided at positions axially symmetric to each other with respect to the first center axis, when viewed from above the semiconductor substrate.

(11) The light receiving device according to (3), wherein each of the light receiving elements further includes:
one or a plurality of first floating diffusion regions that is provided in the semiconductor substrate;
a first transfer gate that is provided on the semiconductor substrate to transfer the electric charges transferred to the first electric charge storage unit, to the one or plurality of first floating diffusion regions; and
a second transfer gate that is provided on the semiconductor substrate to transfer the electric charges transferred to the second electric charge storage unit, to the one or plurality of first floating diffusion regions.

(12) The light receiving device according to (11), wherein each of the light receiving elements further includes:
one or a plurality of amplifying transistors that amplifies the electric charges transferred to the first floating diffusion region and outputs the electric charges as a pixel signal;
one or a plurality of selection transistors that outputs the pixel signal according to a selection signal; and
one or a plurality of reset transistors that resets the electric charges accumulated in the first floating diffusion region.

(13) The light receiving device according to (12), wherein each of the first and second electric charge storage units includes a stack of an electrode, a first insulating film, and a semiconductor layer.

(14) The light receiving device according to (13), wherein the first insulating film is made of an oxide film having a film thickness of 5.0 nm or less.

(15) The light receiving device according to (13), wherein the first insulating film has a relative permittivity of 4 or more.

(16) The light receiving device according to (13), wherein the first insulating film is made of a first oxide film,
each of the first and second transfer gates has a second oxide film that is provided on the semiconductor substrate, and
the first oxide film has a film thickness smaller than the second oxide film.

(17) The light receiving device according to (16), wherein each of the amplifying transistor, the selection transistor, and the reset transistor has a third oxide film provided on the semiconductor substrate, and
the film thickness of the third oxide film of the amplifying transistor is smaller than those of the third oxide films of the selection transistor and the reset transistor.

(18) The light receiving device according to (13), wherein each of the first and second transfer gates has a second insulating film that is provided on the semiconductor substrate, and
the first insulating film has a relative permittivity higher than that of the second insulating film.

(19) The light receiving device according to (18), wherein each of the amplifying transistor, the selection transistor, and the reset transistor has a third insulating film provided on the semiconductor substrate, and
the relative permittivity of the third insulating film of the amplifying transistor is higher than those of the third insulating films of the selection transistor and the reset transistor.

(20) The light receiving device according to (12), wherein the one or plurality of amplifying transistors, the one or plurality of selection transistors, and the one or plurality of reset transistors are provided on the semiconductor substrate.

(21) The light receiving device according to (12), wherein the one or plurality of amplifying transistors, the one or plurality of selection transistors, and the one or plurality of reset transistors are provided on another semiconductor substrate.

(22) The light receiving device according to (3), wherein the plurality of light receiving elements is arranged to face in the same direction in the light receiving unit.

(23) The light receiving device according to (3), wherein the light receiving unit is divided into a plurality of regions, and in each of the regions, the plurality of light receiving elements is arranged to face in a direction determined for each region.
(24) The light receiving device according to (3), wherein the light receiving unit further includes a plurality of imaging elements, and
each of the imaging elements includes:
a second photoelectric conversion unit that converts light into electric charges;
a second floating diffusion region to which the electric charges are transferred from the second photoelectric conversion unit; and
a third transfer gate that transfers the electric charges from the second photoelectric conversion unit to the second floating diffusion region.
(25) The light receiving device according to (24), wherein the plurality of imaging elements includes a first imaging element that detects red light, a second imaging element that detects blue light, and a third imaging element that detects green light.
(26) The light receiving device according to (25), wherein the plurality of imaging elements further includes
a fourth imaging element that detects near-infrared light.
(27) The light receiving device according to any one of (24) to (26), wherein the plurality of imaging elements is provided on the semiconductor substrate.

REFERENCE SIGNS LIST

1 DISTANCE MEASUREMENT MODULE
10, 10a, 10b LIGHT RECEIVING ELEMENT
12 PIXEL ARRAY UNIT
20 LIGHT EMITTING UNIT
30 LIGHT RECEIVING UNIT
32 VERTICAL DRIVE CIRCUIT UNIT
34 COLUMN SIGNAL PROCESSING CIRCUIT UNIT
36 HORIZONTAL DRIVE CIRCUIT UNIT
38 OUTPUT CIRCUIT UNIT
40 CONTROL UNIT
42 PIXEL DRIVE LINE
44 CONTROL CIRCUIT UNIT
46 HORIZONTAL SIGNAL LINE
48 VERTICAL SIGNAL LINE
50 DISTRIBUTION TRANSISTOR DRIVING UNIT
52 SIGNAL PROCESSING UNIT
54 DATA STORAGE UNIT
60 PROCESSING UNIT
100, 102a, 102b N-TYPE SEMICONDUCTOR REGION
150a, 150b, 150c, 150d, 152, 152a, 152b, 156a, 156b, 158a, 158b, 160a, 160b, 162a, 162b GATE ELECTRODE
154a, 154b, 306, 406 ELECTRODE
200, 200b SEMICONDUCTOR SUBSTRATE
202 ANTIREFLECTION FILM
204 PLANARIZATION FILM
206 LIGHT SHIELDING FILM
208 ON-CHIP LENS
210a PIXEL ISOLATION PORTION
300 WIRING LAYER
302, 402, 720, 720a, 740 INSULATING FILM
304, 404 METAL FILM
400 SUBSTRATE
500, 500b, 500g, 500r, 500i IMAGING ELEMENT
600, 602, 604a, 604b, 612, 614 CENTER LINE
710 VIA
730 SIDEWALL
800 TARGET
802a, 802b AREA
900 SMARTPHONE
901 CPU
902 ROM
903 RAM
904 STORAGE DEVICE
905 COMMUNICATION MODULE
907 SENSOR MODULE
908 DISTANCE MEASUREMENT MODULE
909 IMAGING DEVICE
910 DISPLAY DEVICE
911 SPEAKER
912 MICROPHONE
913 INPUT DEVICE
AMP, AMP1, AMP2 AMPLIFYING TRANSISTOR
FD, FD1, FD2, FD3, FD4, FD5, FD6, FD7, FD8 FLOATING DIFFUSION REGION
MEM, MEM1, MEM2, MEM3, MEM4, MEM5, MEM6, MEM7, MEM8 ELECTRIC CHARGE STORAGE UNIT
O, O1a, O1b, O2 CENTER POINT
OFG, OFG1, OFG2 DISCHARGE TRANSISTOR
PD PHOTODIODE
RST, RST1, RST2 RESET TRANSISTOR
SEL, SEL1, SEL2 SELECTION TRANSISTOR
TG, TG1, TG2, TG3, TG4, TG5, TG6, TG7, TG8 TRANSFER TRANSISTOR
VDD POWER SUPPLY POTENTIAL
VG, VG1, VG2, VG3, VG4, VG5, VG6, VG7, VG8 DISTRIBUTION TRANSISTOR
VSL, VSL1, VSL2 SIGNAL LINE

What is claimed is:

1. A light receiving device comprising a light receiving unit that includes a plurality of light receiving elements arranged in a row direction and a column direction on a semiconductor substrate, wherein
each of the light receiving elements includes:
a first photoelectric conversion unit that converts light into electric charges;
a first electric charge storage unit to which the electric charges are transferred from the first photoelectric conversion unit;
a first distribution gate that distributes the electric charges from the first photoelectric conversion unit to the first electric charge storage unit;
a second electric charge storage unit to which the electric charges are transferred from the first photoelectric conversion unit; and
a second distribution gate that distributes the electric charges from the first photoelectric conversion unit to the second electric charge storage unit, and
the first and second distribution gates are provided at positions axially symmetric to each other with respect to a first center axis extending so as to pass through the center of the first photoelectric conversion unit, in a direction intersecting the column direction at a predetermined angle, when viewed from above the semiconductor substrate,
wherein each of the light receiving elements further includes first and second discharge gates that discharge the electric charges in the first photoelectric conversion unit, and
the first and second discharge gates are provided at positions axially symmetric to each other with respect to a second center axis orthogonal to the first center axis so as to pass through the center of the first photoelectric conversion unit, when viewed from above the semiconductor substrate.

2. The light receiving device according to claim 1, wherein the predetermined angle is 45 degrees.

3. A light receiving device comprising a light receiving unit that includes a plurality of light receiving elements arranged in a row direction and a column direction on a semiconductor substrate, wherein
each of the light receiving elements includes:
a first photoelectric conversion unit that converts light into electric charges;
a first electric charge storage unit to which the electric charges are transferred from the first photoelectric conversion unit;
a first distribution gate that distributes the electric charges from the first photoelectric conversion unit to the first electric charge storage unit;
a second electric charge storage unit to which the electric charges are transferred from the first photoelectric conversion unit; and
a second distribution gate that distributes the electric charges from the first photoelectric conversion unit to the second electric charge storage unit, and
the first and second distribution gates are provided at positions axially symmetric to each other with respect to a first center axis extending so as to pass through the center of the first photoelectric conversion unit, in the column direction, when viewed from above the semiconductor substrate,
wherein each of the light receiving elements further includes first and second discharge gates that discharge the electric charges in the first photoelectric conversion unit, and
the first and second discharge gates are provided at positions axially symmetric to each other with respect to a second center axis orthogonal to the first center axis so as to pass through the center of the first photoelectric conversion unit, when viewed from above the semiconductor substrate.

4. The light receiving device according to claim 3, wherein any of the first and second distribution gates or the first and second discharge gates include one or a plurality of buried gate portions in the semiconductor substrate.

5. The light receiving device according to claim 3, wherein the first and second electric charge storage units are provided at positions point-symmetric to each other with respect to the center of the first photoelectric conversion unit, when viewed from above the semiconductor substrate.

6. The light receiving device according to claim 3, wherein
each of the light receiving elements further includes a third discharge gate that discharges the electric charges in the first photoelectric conversion unit, and
the center of the third discharge gate is positioned on the first center axis, when viewed from above the semiconductor substrate.

7. The light receiving device according to claim 6, wherein
when viewed from above the semiconductor substrate,
a first line segment connecting the center of the first distribution gate and the center of the first photoelectric conversion unit, and a second line segment connecting the center of the second distribution gate and the center of the first photoelectric conversion unit are orthogonal to the first center axis.

8. The light receiving device according to claim 6, wherein
when viewed from above the semiconductor substrate,
a first line segment connecting the center of the first distribution gate and the center of the first photoelectric conversion unit forms an acute angle with the first center axis, and
a second line segment connecting the center of the second distribution gate and the center of the first photoelectric conversion unit forms an acute angle with the first center axis.

9. The light receiving device according to claim 8, wherein
the first and second electric charge storage units are provided at positions axially symmetric to each other with respect to the first center axis, when viewed from above the semiconductor substrate.

10. The light receiving device according to claim 3, wherein
each of the light receiving elements further includes:
one or a plurality of first floating diffusion regions that is provided in the semiconductor substrate;
a first transfer gate that is provided on the semiconductor substrate to transfer the electric charges transferred to the first electric charge storage unit, to the one or plurality of first floating diffusion regions; and
a second transfer gate that is provided on the semiconductor substrate to transfer the electric charges transferred to the second electric charge storage unit, to the one or plurality of first floating diffusion regions.

11. The light receiving device according to claim 10, wherein
each of the light receiving elements further includes:
one or a plurality of amplifying transistors that amplifies the electric charges transferred to the first floating diffusion region and outputs the electric charges as a pixel signal;
one or a plurality of selection transistors that outputs the pixel signal according to a selection signal; and
one or a plurality of reset transistors that resets the electric charges accumulated in the first floating diffusion region.

12. The light receiving device according to claim 11, wherein each of the first and second electric charge storage units includes a stack of an electrode, a first insulating film, and a semiconductor layer.

13. The light receiving device according to claim 12, wherein the first insulating film is made of an oxide film having a film thickness of 5.0 nm or less.

14. The light receiving device according to claim 12, wherein the first insulating film has a relative permittivity of 4 or more.

15. The light receiving device according to claim 12, wherein
the first insulating film is made of a first oxide film,
each of the first and second transfer gates has a second oxide film that is provided on the semiconductor substrate, and
the first oxide film has a film thickness smaller than the second oxide film.

16. The light receiving device according to claim 15, wherein
each of the amplifying transistor, the selection transistor, and the reset transistor has a third oxide film provided on the semiconductor substrate, and the film thickness of the third oxide film of the amplifying transistor is smaller than those of the third oxide films of the selection transistor and the reset transistor.

17. The light receiving device according to claim 12, wherein
each of the first and second transfer gates has a second insulating film that is provided on the semiconductor substrate, and
the first insulating film has a relative permittivity higher than that of the second insulating film.

18. The light receiving device according to claim 17, wherein
each of the amplifying transistor, the selection transistor, and the reset transistor has a third insulating film provided on the semiconductor substrate, and
the relative permittivity of the third insulating film of the amplifying transistor is higher than those of the third insulating films of the selection transistor and the reset transistor.

19. The light receiving device according to claim 11, wherein the one or plurality of amplifying transistors, the one or plurality of selection transistors, and the one or plurality of reset transistors are provided on the semiconductor substrate.

20. The light receiving device according to claim 11, wherein the one or plurality of amplifying transistors, the one or plurality of selection transistors, and the one or plurality of reset transistors are provided on another semiconductor substrate.

21. The light receiving device according to claim 3, wherein the plurality of light receiving elements is arranged to face in the same direction in the light receiving unit.

22. The light receiving device according to claim 3, wherein
the light receiving unit is divided into a plurality of regions, and
in each of the regions, the plurality of light receiving elements is arranged to face in a direction determined for each region.

23. The light receiving device according to claim 3, wherein
the light receiving unit further includes a plurality of imaging elements, and
each of the imaging elements includes:
a second photoelectric conversion unit that converts light into electric charges;
a second floating diffusion region to which the electric charges are transferred from the second photoelectric conversion unit; and
a third transfer gate that transfers the electric charges from the second photoelectric conversion unit to the second floating diffusion region.

24. The light receiving device according to claim 23, wherein the plurality of imaging elements includes a first imaging element that detects red light, a second imaging element that detects blue light, and a third imaging element that detects green light.

25. The light receiving device according to claim 24, wherein
the plurality of imaging elements further includes
a fourth imaging element that detects near-infrared light.

26. The light receiving device according to claim 23, wherein the plurality of imaging elements is provided on the semiconductor substrate.

* * * * *